United States Patent
Shiraishi et al.

(10) Patent No.: US 7,852,651 B2
(45) Date of Patent: Dec. 14, 2010

(54) SEMICONDUCTOR DEVICE

(75) Inventors: Masaki Shiraishi, Hitachinaka (JP);
Noboru Akiyama, Hitachinaka (JP);
Tomoaki Uno, Takasaki (JP);
Nobuyoshi Matsuura, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/430,972

(22) Filed: Apr. 28, 2009

(65) Prior Publication Data

US 2009/0207640 A1 Aug. 20, 2009

Related U.S. Application Data

(63) Continuation of application No. 11/863,556, filed on Sep. 28, 2007, now Pat. No. 7,535,741, which is a continuation of application No. 11/288,103, filed on Nov. 29, 2005, now Pat. No. 7,295,453.

(30) Foreign Application Priority Data

Nov. 30, 2004 (JP) ............................. 2004-345798

(51) Int. Cl.
*H02M 1/00* (2007.01)
*H01L 23/48* (2006.01)
*H05K 7/02* (2006.01)

(52) U.S. Cl. ...................................... 363/144; 257/690

(58) Field of Classification Search ................. 363/144, 363/147; 257/288, 296, 299, 327–334, 341, 257/365, 688–691, 698, 723–726; 361/760, 361/767, 772, 777, 778

See application file for complete search history.

(56) References Cited

U.S. PATENT DOCUMENTS

| 5,699,241 | A | 12/1997 | Fujikawa |
| 6,842,346 | B2 * | 1/2005 | Takagawa et al. ........... 361/777 |
| 6,940,724 | B2 | 9/2005 | Divakar et al. |
| 7,109,577 | B2 | 9/2006 | Shiraishi et al. |
| 7,238,992 | B2 | 7/2007 | Komori et al. |
| 7,295,453 | B2 | 11/2007 | Shiraishi et al. |
| 7,301,755 | B2 | 11/2007 | Rodriguez et al. |

(Continued)

FOREIGN PATENT DOCUMENTS

JP 2002-217416 8/2002

(Continued)

*Primary Examiner*—Matthew V Nguyen
(74) *Attorney, Agent, or Firm*—Antonelli, Terry, Stout & Kraus, LLP.

(57) ABSTRACT

The object of the present invention is to reduce parasitic inductance of a main circuit in a power supply circuit. The present invention provides a non-insulated DC-DC converter having a circuit in which a power MOS•FET for a high-side switch and a power MOS•FET for a low-side switch are connected in series. In the non-insulated DC-DC converter, the power MOS•FET for the high-side switch is formed by a p channel vertical MOS•FET, and the power MOS•FET for the low-side switch is formed by an n channel vertical MOS•FET. Thus, a semiconductor chip formed with the power MOS•FET for the high-side switch and a semiconductor chip formed with the power MOS•FET for the low-side switch are mounted over the same die pad and electrically connected to each other through the die pad.

17 Claims, 42 Drawing Sheets

U.S. PATENT DOCUMENTS

| | | |
|---|---|---|
| 7,361,983 B2 | 4/2008 | Hayashi et al. |
| 7,382,044 B1 | 6/2008 | Yilmaz et al. |
| 2002/0093094 A1* | 7/2002 | Takagawa et al. ........... 257/723 |
| 2005/0156204 A1* | 7/2005 | Uno et al. ................... 257/213 |

FOREIGN PATENT DOCUMENTS

| | | |
|---|---|---|
| JP | 2003-528449 | 9/2003 |
| WO | WO 01/72092 A1 | 9/2001 |

* cited by examiner

SEMICONDUCTOR DEVICE

CROSS-REFERENCE TO RELATED APPLICATIONS

This application is a continuation of U.S. application Ser. No. 11/863,556, filed Sep. 28, 2007, now U.S. Pat. No. 7,535,741 which, in turn, is a continuation of U.S. application Ser. No. 11/288,103, filed Nov. 29, 2005 (now U.S. Pat. No. 7,295,453), and which application claims priority from Japanese patent application No. 2004-345798, filed Nov. 30, 2004, the contents of which are hereby incorporated by reference into this application.

BACKGROUND OF THE INVENTION

The present invention relates to a semiconductor device technique, and particularly to a technique effective if applied to a semiconductor device having a power supply circuit.

A DC-DC converter widely used as one example of a power supply circuit has a configuration wherein a high-side power MOS•FET (Metal Oxide Semiconductor Field Effect Transistor) and a low-side power MOS•FET are connected in series. The high-side power MOS•FET has a switch function for control of the DC-DC converter, and the low-side power MOS•FET has a switch function for synchronous rectification. By alternately turning on/off these two power MOS•FETs while synchronization is being achieved therebetween, the conversion of a power supply voltage is carried out.

Such a DC-DC converter has been descried in, for example, Japanese Unexamined Patent Publication No. 2003-528449 (patent document 1), which discloses a configuration wherein a high-side power MOS•FET, a low-side power MOS•FET, a driver circuit that drives these power MOS•FETs, and an input capacitor are accommodated within the same package.

A package configuration wherein a high-side power MOS•FET constituting a DC-DC converter is constituted of a horizontal power MOS•FET, a low-side power MOS•FET constituting the DC-DC converter is configured of a vertical power MOS•FET, and these power MOS•FETs are mounted over a common frame, has been disclosed in, for example, Japanese Unexamined Patent Publication No. 2002-217416 (patent document 2).

SUMMARY OF THE INVENTION

Meanwhile, a non-insulated DC-DC converter employed in a power supply circuit for a desktop personal computer, a server and a game machine or the like tends to increase in current and frequency with a demand for an increase in current of a driven CPU (Central Processing Unit) or the like and miniaturization of passive parts like a choke coil and an input/output capacitor, etc.

However, a problem arises in that a loss increases due to main circuit inductance parasitic on a main circuit around the input capacitor of the non-insulated DC-DC converter under the large-current and high-frequency conditions. In particular, a problem arises in that when the main circuit inductance parasitic on the main circuit around the input capacitor increases with the increases in current and frequency, a leap voltage at the turning off of the high-side power MOS•FET of the DC-DC converter increases, thus resulting in an increase in switching loss and the incurrence of large loss.

The patent document 1 has disclosed such a configuration that a semiconductor chip formed with a high-side power MOS•FET, a semiconductor chip formed with a low-side power MOS•FET, a semiconductor chip formed with a driver circuit, and an input capacitor Cin are accommodated within the same package. In this case, the source of the high-side power MOS•FET is electrically connected to its corresponding wiring of a wiring board through a bonding wire. The wiring is electrically connected to the drain of the low-side power MOS•FET. The source of the low-side power MOS•FET is electrically connected to its corresponding output wiring of the wiring board through a bonding wire. In such a configuration, however, parasitic inductance cannot be reduced sufficiently because the source of the high-side power MOS•FET an the drain of the low-side power MOS•FET are connected by the bonding wire. In other words, since they are electrically connected to each other by the bonding wire, there is a limit to a reduction in parasitic inductance.

The patent document 2 has disclosed such a configuration that the high-side power MOS•FET is constituted of the horizontal power MOS•FET, the low-side power MOS•FET is constituted of the vertical power MOS•FET, and these power MOS•FETs are mounted over the common frame. Since the input capacitor is externally provided in this case, a wiring-to-wiring distance to each power MOS•FET increases. Since the main circuit inductance parasitic on the main circuit around the input capacitor cannot be reduced sufficiently with the increase in the wiring-to-wiring distance, voltage conversion efficiency of a semiconductor device is also reduced. While such a configuration that the input capacitor Cin is accommodated within the same package as each semiconductor chip, has been disclosed in the patent document 1, a given degree of distance occurs between the input capacitor and each power MOS•FET and hence the parasitic inductance cannot be reduced sufficiently and power supply efficiency of a semiconductor device is lowered.

An object of the present invention is to provide a technique capable of reducing parasitic inductance of a main circuit in a power supply circuit.

Another object of the present invention is to provide a technique capable of improving power supply efficiency of a semiconductor device.

The above and other objects and novel features of the present invention will become apparent from the description of the present specification and the accompanying drawings.

Representatives of the inventions disclosed in the present application will briefly be explained in summary as follows:

The present invention provides a semiconductor device wherein a field effect transistor of a first semiconductor chip is formed of a p channel vertical field effect transistor, and a field effect transistor of a second semiconductor chip is formed of an n channel vertical field effect transistor, whereby the first and second semiconductor chips are mounted over the same chip mounting section and electrically connected to each other.

The present invention provides a semiconductor device wherein a field effect transistor of a first semiconductor chip is formed of a p channel vertical field effect transistor, and a field effect transistor of a second semiconductor chip is formed of an n channel vertical field effect transistor, whereby the first and second semiconductor chips are mounted over the same chip mounting section and electrically connected to each other, wherein a capacitor is provided which is electrically connected between a first lead plate that electrically connects electrodes of the first semiconductor chip to an external terminal for the supply of input power, and a second lead plate that electrically connects electrodes of the second semiconductor chip to an external terminal for the supply of a reference potential, and wherein the capacitor has a pair of electrodes of which the one is bonded to the first lead plate and of which the other is bonded to the second lead plate.

Advantageous effects obtained by representatives of the inventions disclosed in the present application will briefly be explained as follows:

A field effect transistor of a first semiconductor chip is formed of a p channel vertical field effect transistor, and a field effect transistor of a second semiconductor chip is formed of an n channel vertical field effect transistor, whereby the first and second semiconductor chips are mounted over the same chip mounting section and electrically connected to each other. Thus, since inductance components in a wiring path between the first and second semiconductor chips can be reduced, parasitic inductance of a main circuit in a power supply circuit can be reduced.

A capacitor has a pair of electrodes whose one is bonded to the first lead plate and whose other is bonded to the second lead plate. Thus, since parasitic inductance of a main circuit in a power supply circuit can be reduced, power supply efficiency of a semiconductor device can be enhanced.

DETAILED DESCRIPTION OF THE PREFERRED EMBODIMENTS

Figure 1:
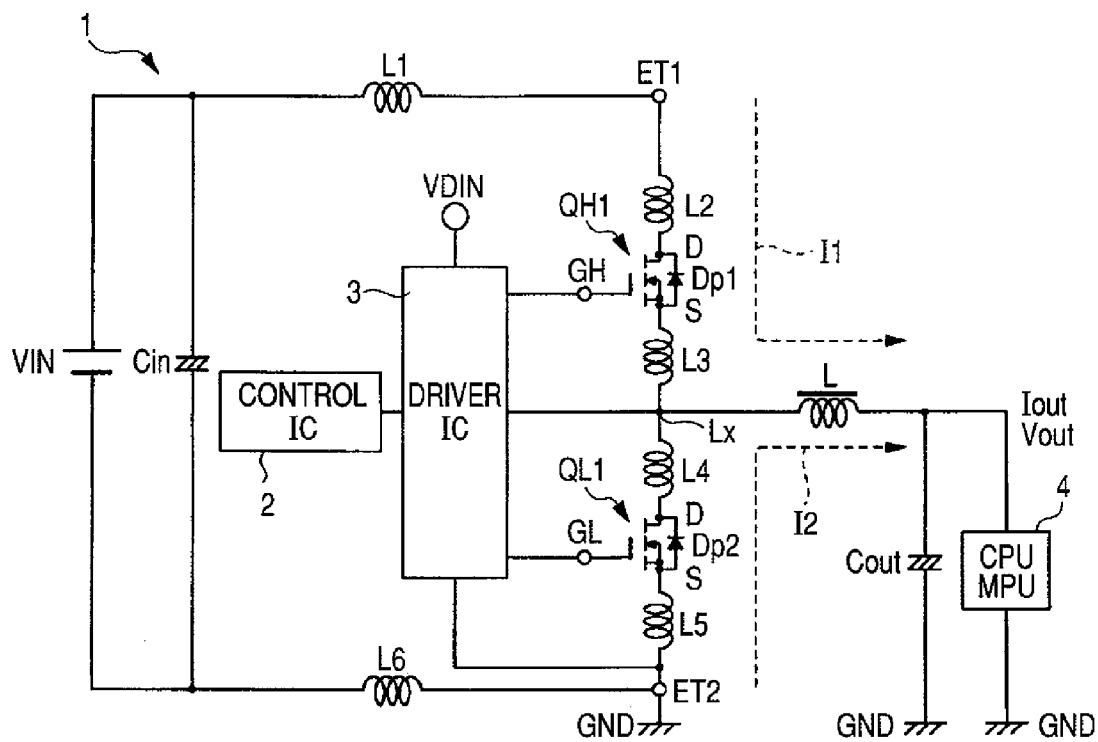
FIG. 1 is a circuit diagram of one example of a semiconductor device showing a first embodiment of the present invention.

The following embodiments will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range. Constituent elements each having the same function in all the drawings for describing the embodiments are respectively given the same reference numerals and their repetitive explanations are omitted where possible. Preferred embodiments of the present invention will hereinafter be described in detail based on the accompanying drawings.

First Preferred Embodiment

A semiconductor device according to a first embodiment is a non-insulated DC-DC converter employed in a power supply circuit of electronic equipment like, for example, a desktop personal computer, a notebook-size personal computer, a server or a game machine or the like.

FIG. 1 shows one example of a circuit diagram of a non-insulated DC-DC converter 1 discussed by the present inventors. The non-insulated DC-DC converter 1 has elements like a control circuit 2, a driver circuit 3, power MOS•FETs (hereinafter abbreviated simply as "power MOS") QH1 and QL1, an input capacitor Cin, an output capacitor Cout and a coil L, etc. Incidentally, symbol D indicates a drain, and symbol S indicates a source, respectively. Symbols L1 through L6 indicate parasitic inductances which are parasitic on a main circuit of the non-insulated DC-DC converter.

The control circuit 2 is a circuit like, for example, a pulse width modulation (Pulse Width Modulation: PWM) circuit or the like, which supplies a signal for controlling a width (on time) of voltage switch-on of each of the power MOSQH1 and MOSQL1. The output (terminal for control signal) of the control circuit 2 is electrically connected to the input of the driver circuit 3. The output of the driver circuit (first control circuit) 3 is electrically connected to a gate terminal GH of the power MOSQH1 and a gate terminal GL of the power MOSQL1. The driver circuit 3 is a circuit which controls the potentials of the gate terminals GH and GL of the power MOSQH1 and MOSQL1, respectively, in response to the control signals supplied from the control circuit 2 thereby to control the operations of the power MOSQH1 and MOSQL1. Incidentally, VDIN indicates an input source for the driver circuit.

The power MOSQH1 and MOSQL1 are connected in series between a high potential (first power supply potential) supply terminal (first power supply terminal) ET1 of an input power supply VIN, and a reference potential (second power supply potential) GND supply terminal (second power supply terminal) ET2. That is, the power MOSQH1 is provided in such a way that its source-to-drain path is connected in series between the high potential supply terminal ET1 of the input power supply VIN and an output node (output terminal) Lx. The power MOSQL1 is provided in such a manner that its source-to-drain path is series-connected between the output node Lx and the ground potential GND supply terminal ET2. Incidentally, Dp1 indicates a parasitic diode (internal diode) of the power MOSQH1, and Dp2 indicates a parasitic diode (internal diode) of the power MOSQL1.

The power MOSQH1 is of a field effect transistor for a high-side switch (high potential side: first operating voltage; hereinafter called simply "high side") and has a switch function for storing energy in the coil L for supplying power to the output (input of a load circuit 4) of the non-insulated DC-DC converter 1. The power MOS•FETQH1 is formed by an n channel vertical field effect transistor. The vertical field effect transistor is of an element whose channel is formed in the direction of thickness of a semiconductor chip. As compared with a horizontal field effect transistor, the vertical field effect transistor is capable of increasing its channel width per unit area and reducing its on resistance. It is therefore possible to realize miniaturization of the element and attain a reduction in packaging.

On the other hand, the power MOS (second field effect transistor) QL1 is of a field effect transistor for a low-side switch (low potential side: second operating voltage; hereinafter called simply "low side") and is also a rectifying transistor of the non-insulated DC-DC converter 1. The power MOSQL1 has the function of reducing the resistance of the transistor in sync with a frequency supplied from the control circuit 2 and performing rectification. The power MOSQL1 is formed by an n channel vertical power MOS in a manner similar to the power MOSQH1. The reason why the vertical type is used, is that the low-side power MOSQL1 has an advantage that since its on time (time taken while the voltage is being applied) is longer than that of the power MOSQH1 for the high-side switch and a loss produced due to its on resistance is taken larger than each switching loss, as shown in the timing chart of the non-insulated DC-DC converter 1 in FIG. 2, the vertical field effect transistor whose channel width per unit area can be increased as compared with the horizontal field effect transistor can be used. That is, it is because since the on resistance can be reduced by formation of the power MOSQL1 for the low-side switch by the vertical field effect transistor, voltage conversion efficiency can be enhanced even though a current that flows through the non-insulated DC-DC converter 1 increases. Incidentally, in FIG. 2, Ton indicates a pulse width at the turning on of the power MOSQH1 for the high-side switch, and T indicates a pulse cycle respectively.

The input capacitor Cin is electrically connected in parallel with the input power supply VIN of FIG. 1. The input capacitor Cin is a power supply circuit which temporarily stores energy (charge) supplied from the input power supply VIN and supplies the stored energy to the main circuit of the non-insulated DC-DC converter 1. Since the input power supply VIN is directed not only to a power supply for the non-insulated DC-DC converter 1 alone but also to a power supply for other device, it is placed in a position far away from the non-insulated DC-DC converter 1. Further, since power supply efficiency is reduced when power is directly supplied from the input power supply VIN to the non-insulated DC-DC converter 1, the input power supply VIN supplies power to the input capacitor Cin placed in a position relatively near the main circuit of the non-insulated DC-DC converter 1, and the input capacitor Cin supplies the power to the main circuit of the non-insulated DC-DC converter 1. An input power supply potential of the input power supply VIN ranges from approximately 5 to 12V, for example. The reference potential GND is lower than, for example, the input power supply potential and is 0(zero)V as a ground potential, for example. An operating frequency (cycle used when the power MOSQH1 and MOSQL1 are turned on and off) of the non-insulated DC-DC converter 1 is 1 MHz, for instance.

The output node Lx for supplying an output power supply potential to the outside is provided over a wiring that connects the source of the power MOSQH1 of the non-insulated DC-DC converter 1 and the drain of the power MOSQL1 thereof to each other. The output node Lx is electrically connected to the coil L via an output wiring and electrically connected to the load circuit 4 via an output wiring. A Schottky barrier diode (hereinafter abbreviated as "SBD") may electrically be connected between the output wiring that connects the output node Lx and the coil L and its corresponding reference potential GND supply terminal so as to become parallel to the power MOSQL1. The SBD is a diode whose forward voltage Vf is lower than that of the parasitic diode Dp2 of the power MOSQL1. The SBD has an anode electrically connected to the reference potential GND supply terminal ET2 and a cathode electrically connected to its corresponding output wiring that connects the output node Lx and the drain of the power MOSQL1. Since a voltage drop at a dead time when the power MOSQL1 is turned off, can be lowered by connecting the SBD in this way, a conduction loss of the diode can be reduced. Further, a diode recovery loss can be reduced by making a reverse recovery time (trr) earlier.

The output capacitor Cout is electrically connected between the output wiring connecting the coil L and the load circuit 4 and the reference potential GND supply terminal. For instance, a CPU (Central Processing Unit) or an MPU (Micro Processing Unit) or the like of the electronic equipment can be illustrated as the load circuit 4. Iout indicates an output current, and Vout indicates an output voltage, respectively.

In such a circuit, the power MOSQH1 and MOSQL1 are alternately turned off/on while synchronization is being achieved therebetween, whereby the conversion of a power supply voltage is carried out. That is, when the power MOSQH1 for the high-side switch is on, a current (first current) I1 flows from the terminal ET1 electrically connected to the drain D of the power MOSQH1 to the output node Lx through the power MOSQH1, whereas when the power MOSQH1 for the high-side switch is off, a current I2 flows due to a back electromotive voltage of the coil L. Turning on the power MOSQL1 for the low-side switch when the current I2 is flowing, enables a reduction in voltage drop. The current I1 is a large current of 20 A or so, for example.

Meanwhile, in such a non-insulated DC-DC converter 1, the parasitic inductances (L1+L2+L3+L4+L5+L6) parasitic on the main circuit around the input capacitor Cin become large with increases in current and frequency. In particular, a leap voltage at the turning off of the high-side power MOSQH1 of the non-insulated DC-DC converter 1 increases. As a result, a problem arises in that switching losses increase and a large loss occurs.

Figure 3:
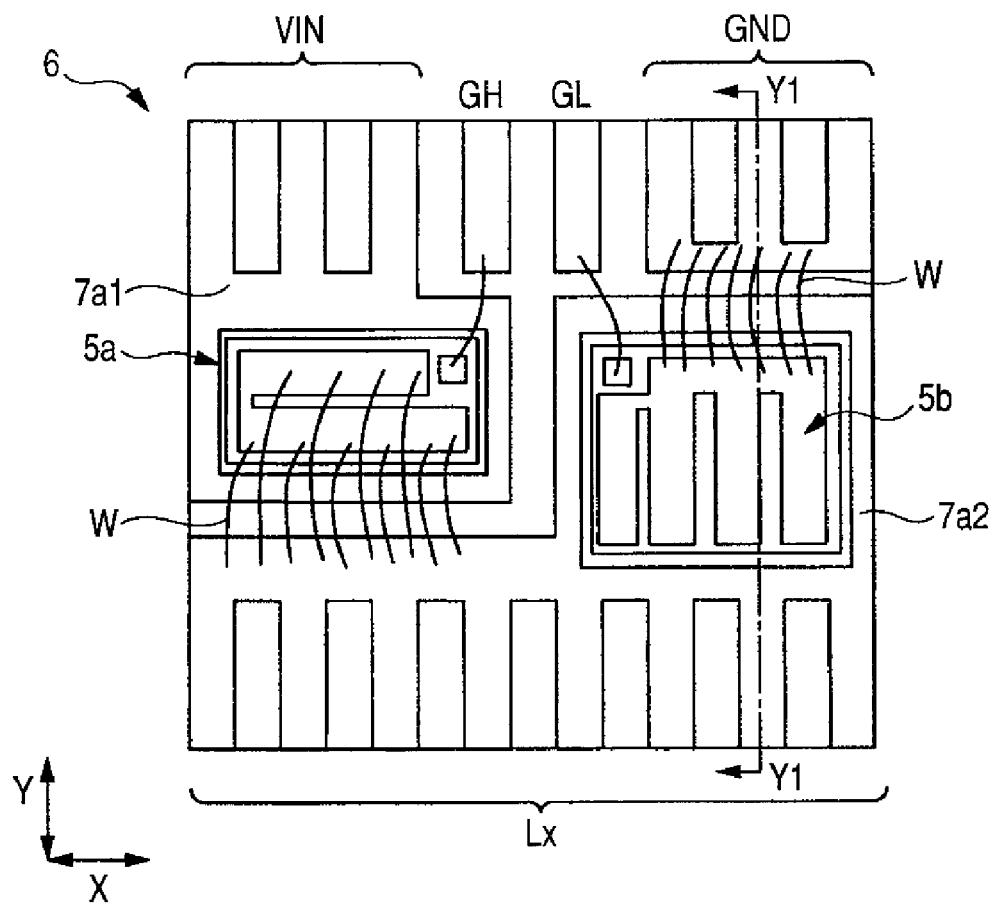
FIG. 3 is a plan view illustrating the interior of a package discussed by the present inventors.
Figure 4:
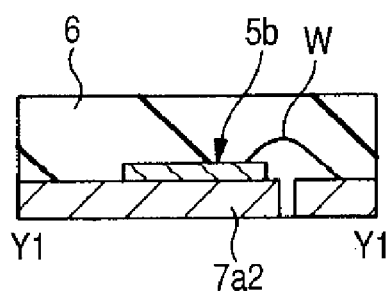
FIG. 4 is a sectional view taken along line Y1-Y1 of FIG. 3.

Now, according to the discussions of the present inventors, each of such configurations as shown in FIGS. 3 through 7 is illustrated as one example of a package configuration for reducing the parasitic inductances. FIG. 3 shows a plan view showing the interior of a package, and FIG. 4 shows a sectional view taken along line Y1-Y1 of FIG. 3, respectively. In FIGS. 3 and 4, a semiconductor chip 5a in which a high-side power MOSQH1 is formed, and a semiconductor chip 5b in which a low-side power MOSQL1 is formed, are accommodated in the same encapsulator (resin encapsulator) 6. The semiconductor chips 5a and 5b are respectively mounted over discrete die pads 7a1 and 7a2. The source of the high-side power MOSQH1 is electrically connected to its corresponding die pad 7a2 with the power MOSQL1 mounted thereon via bonding wires (hereinafter called simply "wires") W.

Figure 5:
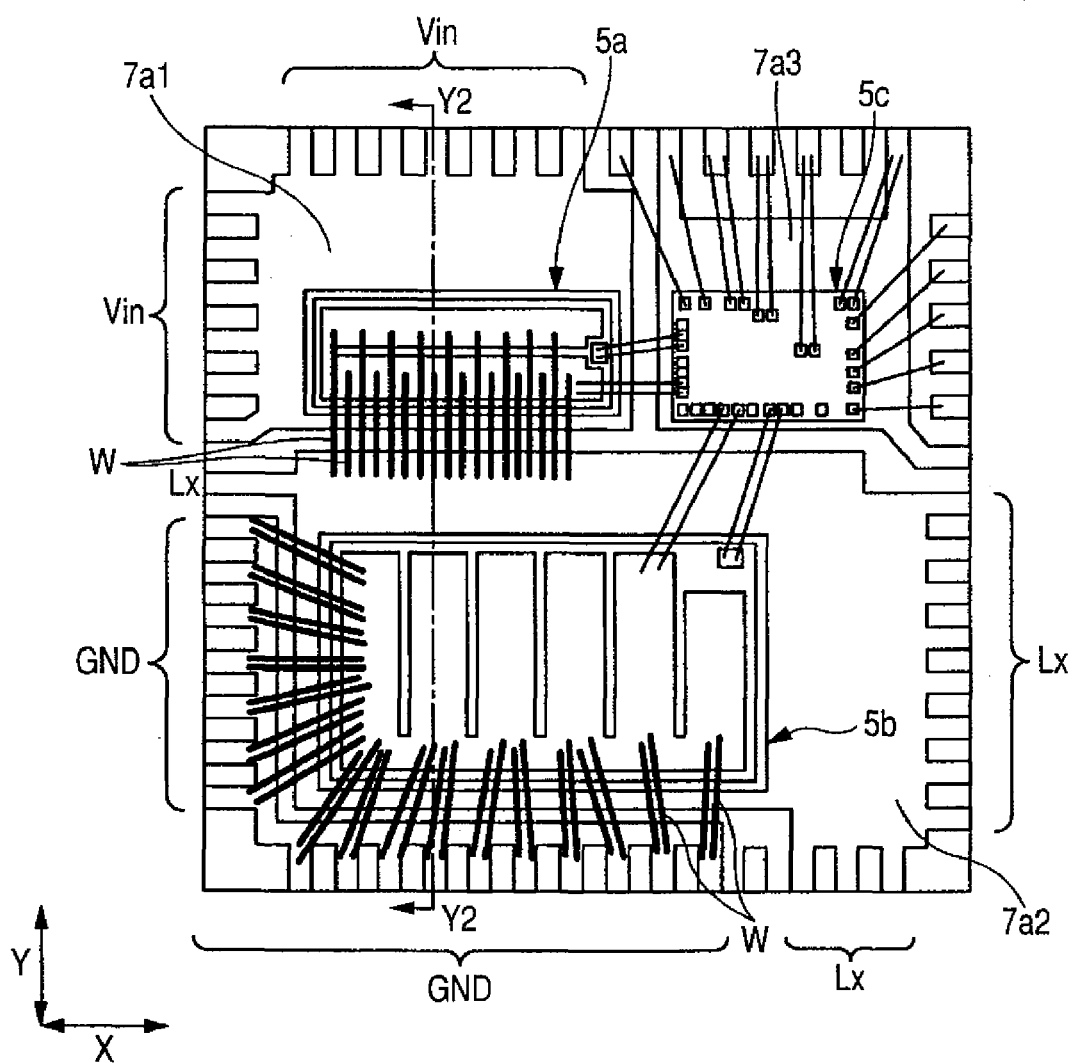
FIG. 5 is a plan view showing the interior of a package discussed by the present inventors.
Figure 6:
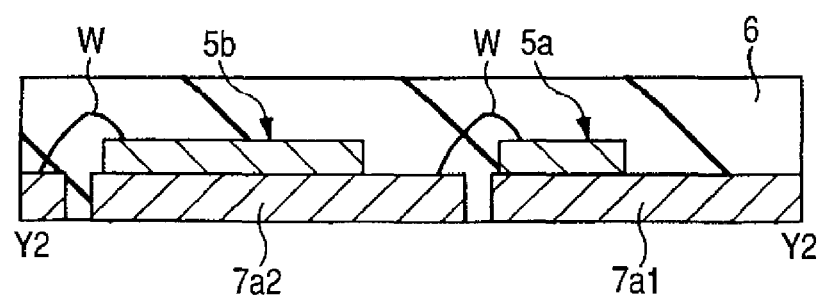
FIG. 6 is a sectional view taken along line Y2-Y2 of FIG. 5.

FIG. 5 shows a plan view showing the interior of a package, and FIG. 6 shows a sectional view taken along line Y2-Y2 of FIG. 5, respectively. In FIGS. 5 and 6, a semiconductor chip 5c formed with the driver circuit 3 is also stored in the same encapsulator 6 in addition to the semiconductor chips 5a and 5b. The semiconductor chip 5c is mounted over its corresponding die pad 7a3 different from the die pads 7a1 and 7a2. Even in the present example, semiconductor chips 5a and 5b are mounted over their corresponding discrete die pads 7a1 and 7a2. The source of a high-side power MOSQH1 is electrically connected to the die pad 7a2 with a low-side power MOSQL1 mounted thereon via wires W.

Figure 7:
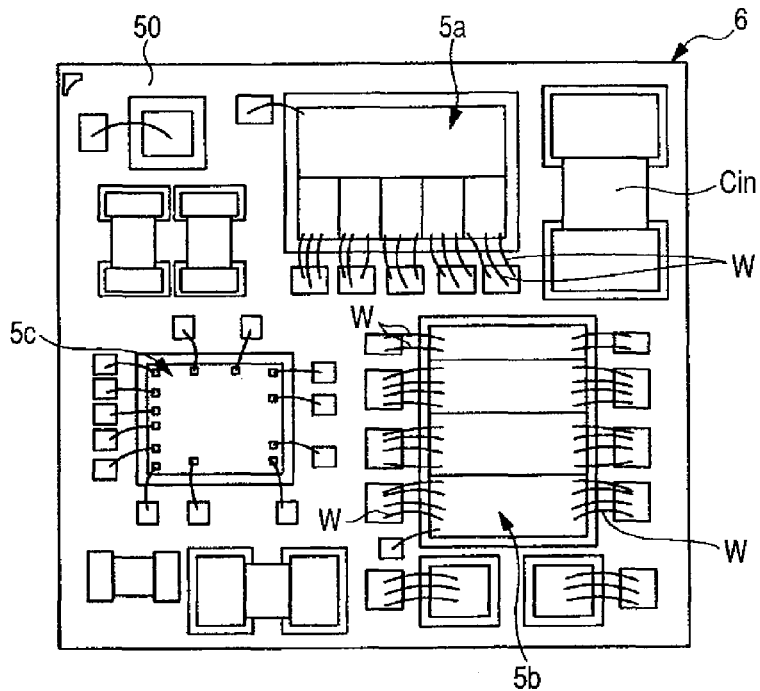
FIG. 7 is a plan view depicting the interior of a package of the patent document 2 discussed by the present inventors.

Further, FIG. 7 shows the package configuration disclosed in the patent document 2. In addition to the semiconductor chips 5a, 5b and 5c, an input capacitor Cin is also accommodated within the same encapsulator 6. In this case, the source of the high-side power MOSQH1 is electrically connected to wirings of a wiring board 50 through wires W. The wirings thereof are electrically connected to the drain of the low-side power MOSQL1. The source of the low-side power MOSQL1 is electrically connected to its corresponding output wiring of the wiring board 50 via the corresponding wire W.

Since the input capacitors Cin are externally provided in such configurations as shown in FIGS. 3 and 4 and FIGS. 5 and 6, the parasitic inductances L1 and L6 cannot be reduced. Since the source of the high-side power MOSQH1 and the die pad 7a2 are electrically connected to each other by the wires W, and the source of the low-side power MOSQL1 and its corresponding reference potential GND are electrically connected by the wires W, there is a limit to reduction in the parasitic inductances L3 and L5.

Even in the configuration in which the semiconductor chips 5a, 5b and 5c and the input capacitor Cin are accommodated within the same encapsulator 6 as shown in FIG. 7, they are connected by the wires W. Hence, the parasitic inductances L3 and L5 cannot be reduced and a certain degree of distance occurs between the input capacitor Cin and each of the power MOSQH1 and MOSQL1. Therefore, there is a limit even to reductions in the parasitic inductances L1 and L6.

Thus, in the present embodiment, the high-side power MOS and the low-side power MOS are mounted over a common die pad (tub/chip mounting section) to reduce the parasitic inductances L3 and L4 of the parasitic inductances L1 through L6. Therefore, in the present embodiment, the high-side power MOS of the non-insulated DC-DC converter 1 is formed by a p channel vertical power MOS or an n channel horizontal power MOS.

Figure 8:
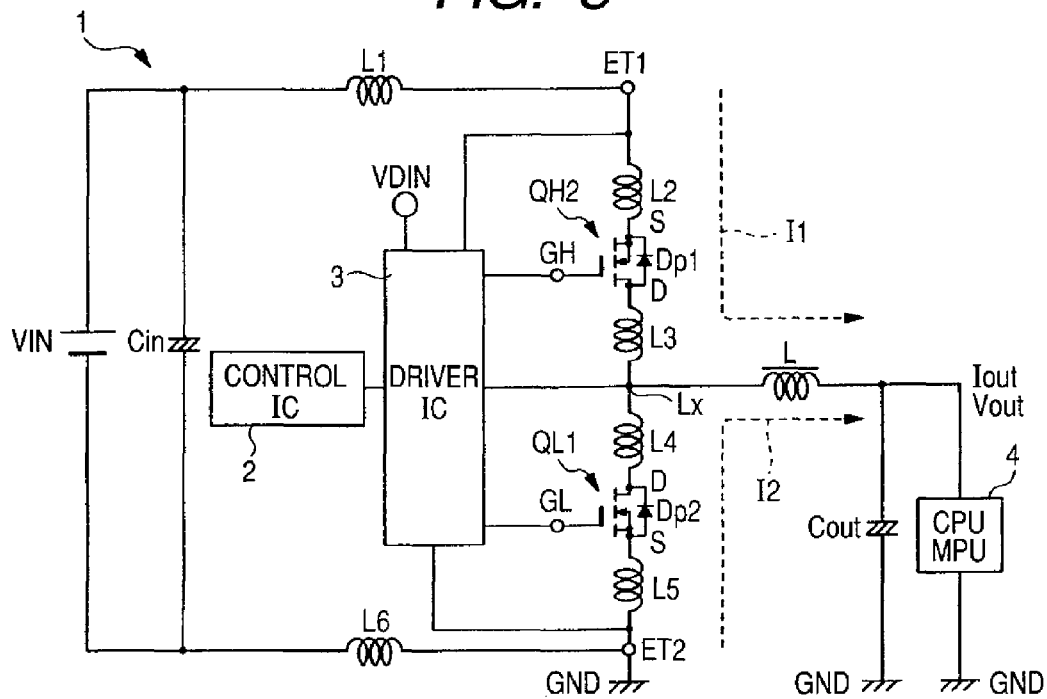
FIG. 8 is a circuit diagram of one example of the semiconductor device showing the first embodiment of the present invention.

A description will first be made of a configuration wherein a high-side power MOS is formed of a p channel vertical power MOS. FIG. 8 shows one example of a circuit diagram of the non-insulated DC-DC converter 1 according to the first embodiment. The high-side power MOS is constituted of a p channel vertical power MOSQH2. The function per se of the power MOSQH2 is identical to the power MOSQH1. The source S and drain D of the high-side power MOSQH2 shown in FIG. 8 are placed in opposing relationship to the source S and drain D of the high-side power MOSQH1 shown in FIG. 1. That is, the source S of the high-side power MOSQH2 is connected to its corresponding input power supply VIN, and the drain D of the high-side power MOSQH2 is connected to its corresponding drain D of a low-side power MOSQL1. This is because when the high-side power MOS and the low-side power MOS are built in the non-insulated DC-DC converter, they are also connected in such a manner that their parasitic diodes Dp1 and Dp2 are connected in the opposite direction. This is also because since the p channel vertical power MOS is opposite in pn junction to an n channel vertical power MOS, the direction of the parasitic diode Dp1 of the p channel vertical power MOS also becomes opposite to the direction of the parasitic diode Dp2 of the n channel vertical power MOS. The low-side power MOSQL1 is constituted of an n channel horizontal power MOS. Therefore, the channel characteristics of the high-side power MOSQH2 and the low-side power MOSQL1 are symmetrical with each other. Configurations other than these are identical to those described in FIGS. 1 and 2 or the like.

Since the high-side power MOS is formed of the p channel vertical power MOS in this way, the drain can be shared between the high-side power MOSQH2 and the low-side power MOSQL1. Therefore, there is no need to distribute or separate die pads between the high-side power MOSQH1 and the low-side power MOSQL1 as in a package configuration to be described later. Hence the common die pad can be utilized. It is therefore possible to considerably reduce the parasitic inductances L3 and L4. Further, the parasitic resistance can significantly be reduced as compared with the case in which the high-side power MOSQH1 and the low-side power MOSQL1 are connected by wires WA. Thus, each switching loss of the non-insulated DC-DC converter 1 can greatly be reduced. Further, since the high-side power MOSQH2 and the low-side power MOSQL1 can be placed at closer distance therebetween as compared with the separation of the high-side die pad and the low-side die pad, a reduction in package size can also be realized.

The p channel vertical power MOS is generally larger than the n channel vertical power MOS in on resistance. This is because the mobility of each of holes corresponding to carriers of the p channel MOS is smaller than that of each of electrons corresponding to carriers of the n channel MOS. In the high side of the non-insulated DC-DC converter, however, each switching loss is larger than the conduction loss caused by the on resistance. The more the operating frequency of the non-insulated DC-DC converter 1 increases in particular, the more the switching losses are suffered. Therefore, the lowering effect of the switching losses reducible by reducing the parasitic inductances L1 through L6 is larger than the conduction loss produced due to the increase in on resistance, and hence the whole loss can be reduced. Since, however, the p channel vertical power MOS can be reduced in on resistance and reduced in chip size too as compared with a horizontal power MOS to be described later, a reduction in cost is enabled as compared with the case in which the horizontal power MOS is used. Since the chip size of the vertical power MOS can be reduced as compared with the horizontal power MOS, the area (size) of its die pad can also be scaled down.

That is, a package size can be reduced as compared with the case in which the horizontal power MOS is mounted over the common die pad.

Figure 9:
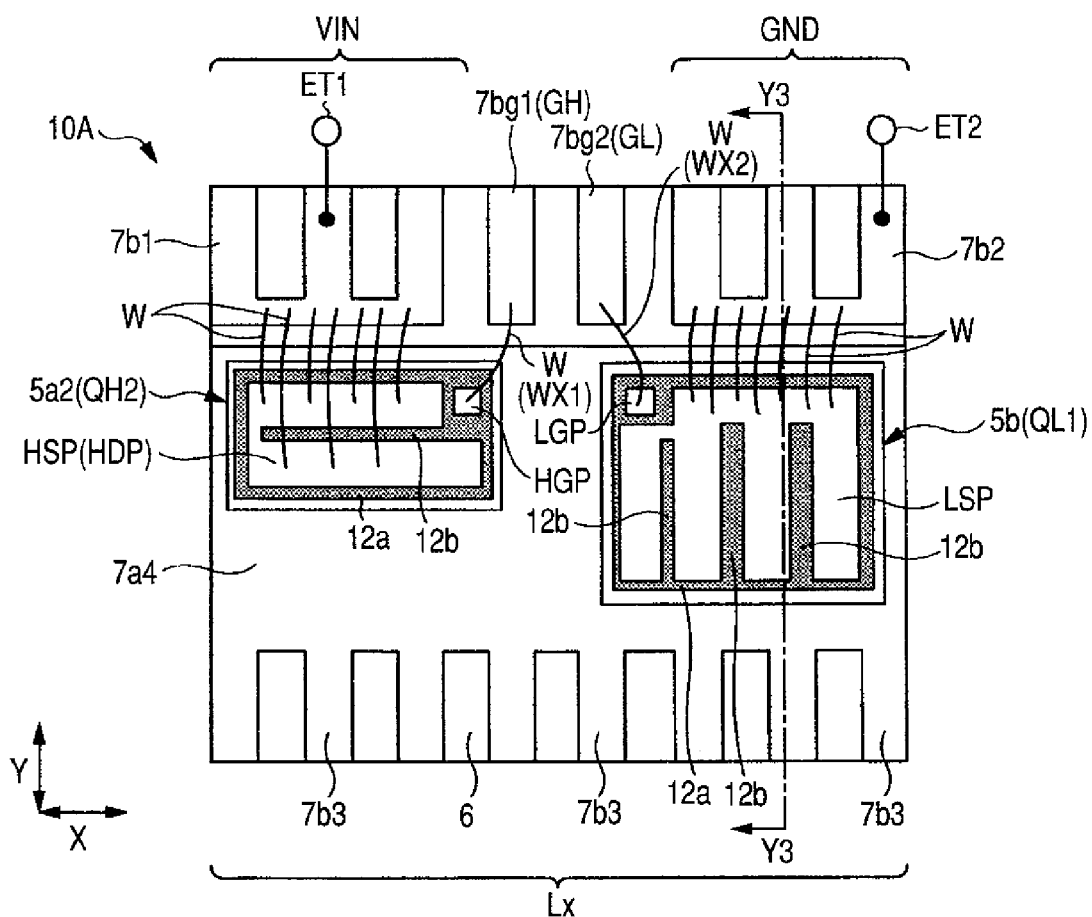
FIG. 9 is a plan view illustrating the interior of a package of the semiconductor device showing the first embodiment of the present invention.
Figure 10:
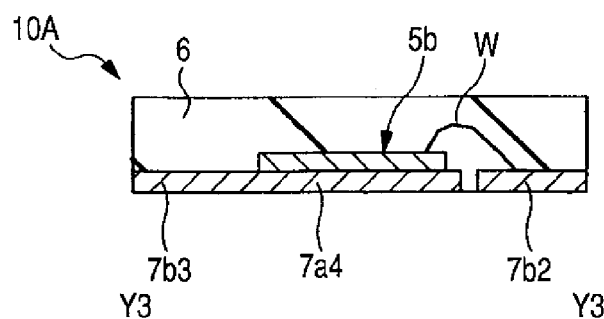
FIG. 10 is a sectional view taken along line Y3-Y3 of FIG. 9.

Next, FIGS. 9 and 10 show one example of a package structure where a p channel vertical power MOSQH2 is used as the high-side power MOS of the non-insulated DC-DC converter 1. FIG. 9 shows a plan view showing the interior of a package 10A, and FIG. 10 shows a sectional view taken along line Y3-Y3 of FIG. 9, respectively. Incidentally, FIG. 9 is shown as seen through the interior of the package 10A to make it easy to see the drawing. Symbol X indicates a first direction, and symbol Y indicates a second direction orthogonal to the first direction.

Two discrete semiconductor chips 5a2 and 5b are accommodated within the package 10A in a state of being mounted onto a common die pad (tub/first chip mounting section) 7a4. A high-side p channel vertical power MOSQH2 of the non-insulated DC-DC converter 1 is formed in the semiconductor chip (first semiconductor chip) 5a2. A low-side n channel vertical power MOSQL1 of the non-insulated DC-DC converter 1 is formed in the semiconductor chip 5b.

Accommodating the semiconductor chip 5a2 formed with the high-side power MOSQH2 and the semiconductor chip 5b formed with the low-side power MOSQL1 in one package 10A in this way makes it possible to reduce parasitic inductance parasitic on each wiring that connects the high-side power MOSQH2 and the low-side power MOSQL1. It is therefore possible to reduce the whole loss of the non-insulated DC-DC converter 1. In the first embodiment in particular, the drain of the high-side p channel vertical power MOSQH2 and the drain of the low-side n channel vertical power MOSQL1 are electrically connected to each other through a common die pad 7a4. Thus, the parasitic inductances L3 and L4 can be reduced drastically. The parasitic resistance can greatly be reduced as compared with the case in which the high-side power MOSQH2 and the low-side power MOSQL1 are connected by the wires WA. Since the semiconductor chips 5a2 and 5b can be placed closer to each other, the package 10A can also be reduced in size.

The semiconductor chip 5a2 has a square flat surface that intersects its thickness. The semiconductor chip 5a2 is mounted over the die pad 7a4 in a state in which its main surface is turned up and the back surface thereof opposite to the main surface of the semiconductor chip 5a2 is directed to the die pad 7a4. A bonding pad (hereinafter called simply "pad") HSP for a source electrode of the power MOSQH2, and a pad HGP for a gate electrode thereof are disposed over the main surface of the semiconductor chip 5a2. The pad HSP for the source electrode is electrically connected to a lead (external terminal for the supply of input power and first external terminal) 7b1 through a plurality of wires W. The lead 7b1 is an external terminal electrically connected to the terminal ET1 and is placed in the neighborhood of one long side of the die pad 7a4 in a state of being separated from the die pad 7a4. The semiconductor chip 5a2 per se is disposed closer to the lead 7b1 than the center of the die pad 7a4 as viewed in the second direction Y. With the layout of such a semiconductor chip 5a2, the parasitic inductance L2 can be reduced. This is because the length of each wire W for electrically connecting to the lead 7b1 can be made short as compared with the case in which the semiconductor chip 5a2 is placed in the vicinity (on the lead 7b3 side as viewed from the center) of the center of the die pad 7a4 as viewed in the second direction Y. The pad HSP for the gate electrode is electrically connected to a lead 7bg1 through a wire W. The lead 7bg1 is an external terminal corresponding to the gate terminal GH to which an output signal from the driver circuit 3 is inputted. The lead 7bg1 is placed substantially in the vicinity of the center of one long side of the die pad 7a4 in a state of being separated from the die pad 7a4. Further, the back surface of the semiconductor chip 5a2 serves as the drain electrode of the power MOSQH2 and is electrically connected to the die pad 7a4.

On the other hand, the semiconductor chip 5b larger than the semiconductor chip 5a2 in plain area is mounted over the die pad 7a4 in a state in which its main surface is turned up and its back surface opposite to the main surface of the semiconductor chip 5b is directed to the die pad 7a4. The semiconductor chip 5b has a square flat surface that intersects its thickness. A pad LSP for a source electrode of the power MOSQL1, and a pad LGP for a gate electrode thereof are disposed in the main surface of the semiconductor chip 5b. The pad LSP for the source electrode is electrically connected to a lead (external terminal for the supply of the reference potential and second external terminal) 7b2 through a plurality of wires W. The lead 7b2 is an external terminal electrically connected to the terminal ET2 and is placed in the neighborhood of one long side of the die pad 7a4 in a state of being separated from the die pad 7a4. The positions for connection of the plurality of wires W to the pad LSP are placed closer to the lead 7b2 than the center of the semiconductor chip 5b as viewed in the second direction Y. The semiconductor chip 5b per se is also disposed closer to the lead 7b2 than the center of the die pad 7a4 as viewed in the second direction Y. With the layout of such wires W and semiconductor chip 5b, the parasitic inductance L5 can be reduced. This is also identical to the reason described in the semiconductor chip 5a2. That is, it is because the length of each wire W for electrically connecting to the lead 7b2 can be made short as compared with the case in which the semiconductor chip 5b is placed in the vicinity (on the lead 7b3 side as viewed from the center) of the center of the die pad 7a4 as viewed in the second direction Y. The pad LGP is electrically connected to a lead 7bg2 through a wire W. The lead 7bg2 is an external terminal corresponding to the gate terminal GL to which an output signal from the driver circuit 3 is inputted. The lead 7bg2 is placed substantially in the vicinity of the center of one long side of the die pad 7a4 in a state of being separated from the die pad 7a4. Since the leads 7bg1 and 7bg2 of the semiconductor chips 5a2 and 5b are disposed in the center of the die pad 7a4 as viewed in its longitudinal direction so as to adjoin each other, the distances between the gate electrodes of the power MOSQH2 and MOSQL1 operated in sync with each other, and the control circuit 2 can be shortened and made substantially identical in length to each other. It is therefore possible to improve operational performance and reliability of the non-insulated DC-DC converter 1. Further, the back surface of the semiconductor chip 5b serves as the drain electrode of the power MOSQL1 and is electrically connected to the die pad 7a4. At the other long side of the die pad 7a4, a plurality of leads (output external terminals) 7b3 are formed integrally with the die pad 7a4. The plurality of leads 7b3 are external terminals electrically connected to the output node Lx.

The semiconductor chips 5a2 and 5b are disposed in such a manner that the pads HGP and LGP for their gate electrodes are positioned on the center side as viewed in the first direction X. Thus, since the lengths of input wirings W (particularly, wires WX1 and WX2) of the high-side power MOSQH2 and low-side power MOSQL1 can be made equal to each other, the stability of operation of the non-insulated DC-DC converter 1 can be improved.

If the die pad 7a4 is merely used in common, then the plurality of leads are laid out in various ways. However, if the leads 7b1 through 7b3, 7bg1 and 7bg2 electrically connected via the plurality of wires W are disposed on both sides as viewed in the longitudinal direction of the die pad 7a4, then predetermined intervals should be provided adjacent to both sides as viewed in the longitudinal direction of the die pad 7a4. Since the plurality of leads 7b1 through 7b3, 7bg1 and 7bg2 are different in electric characteristic, the intervals are provided for the purpose of their insulation.

In the present embodiment in contrast, the plurality of leads (output external terminals) 7b3 are formed integrally with the die pad 7a4 and disposed side by side on the same side as viewed in the longitudinal direction of the die pad 7a4. In other words, since the leads 7b1 through 7b3, 7bg1 and 7bg2 electrically connected via the plurality of wires W are disposed side by side only on the side opposite to the lead 7b3, the predetermined intervals provided for insulation (separation) from the die pad 7a4 are provided only on the one side as viewed in the longitudinal direction of the die pad 7a4. As a result, miniaturization of the package 10A can be realized as compared with the case in which the predetermined intervals are provided on both sides of the die pad 7a4.

Such two semiconductor chips 5a2 and 5b, some of leads 7b1 through 7b3, 7bg1 and 7bg2, part of the die pad 7a4 and wires W are sealed with an encapsulator 6. The die pad 7a4 and the leads 7b1 through 7b3, 7bg1 and 7bg2 are formed with a metal material like, for example, 42 alloy or the like as a main material. The thickness of each of them is approximately 200 μm, for example. As other material for the die pad 7a4 and leads 7b1 through 7b3, 7bg1 and 7bg2 may be used, with, for example, one plated with copper or one obtained by sequentially plating nickel (Ni), palladium (Pd) and gold (Au) onto the surface of copper from the surface. Each of the wires W is made up of a metal thin line like, for example, gold (Au) or the like. The encapsulator 6 is constituted of, for example, an epoxy resin. Due to the reasons for attainment of a reduction in stress or the like, for example, a phenyl curing agent, and a biphenyl thermosetting resin added with silicon rubber and filler or the like may be used as a material for the encapsulator 6. A transfer mold method suitable for mass production is used as a method for forming the encapsulator 6. The back surface of one die pad 7a4 flat and substantially rectangular, for example is exposed at the back surface of the encapsulator 6. Some of the plurality of leads 7b1 through 7b3, 7bg1 and 7bg2 are exposed at the side face of the encapsulator 6 and on the outer periphery of the back surface thereof.

Figure 11:
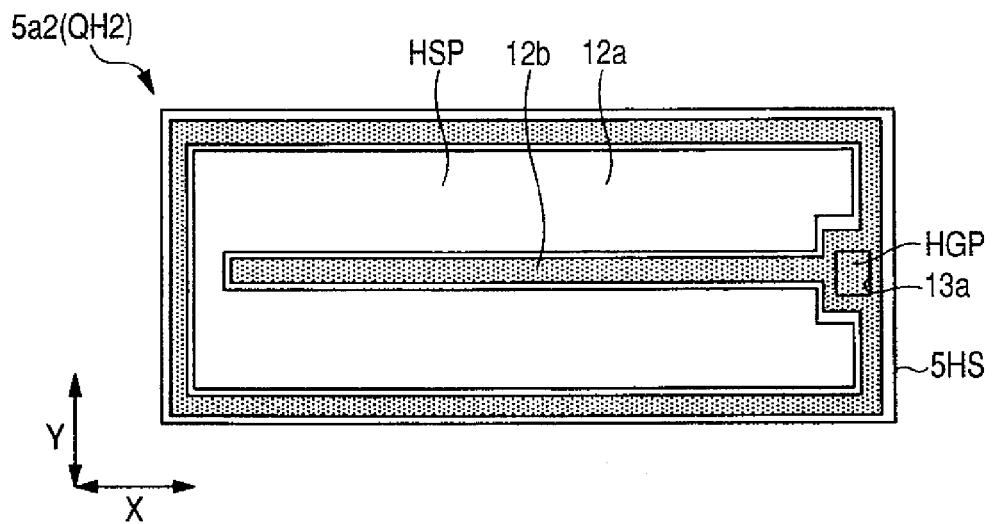
FIG. 11 is an enlarged plan view of a semiconductor chip formed with a field effect transistor for a high-side switch shown in FIG. 9.
Figure 12:
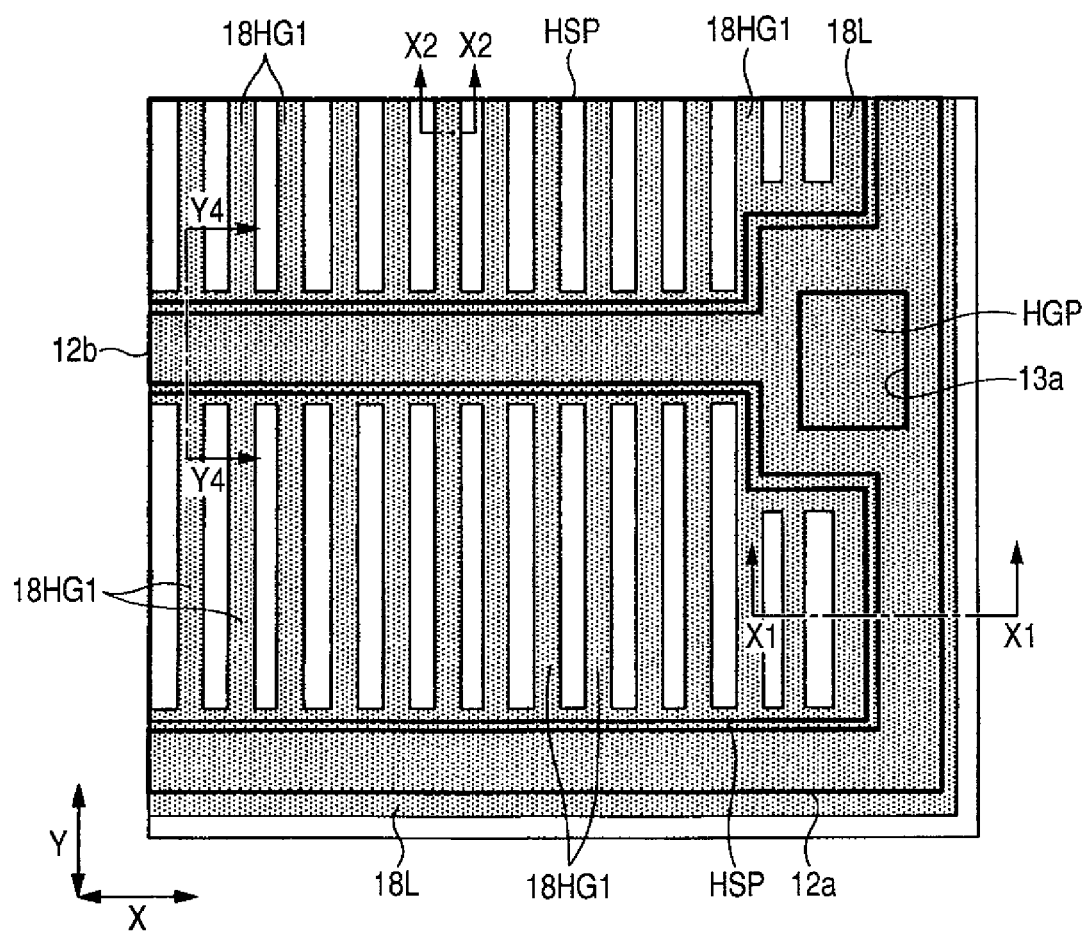
FIG. 12 is a fragmentary enlarged plan view of the semiconductor chip shown in FIG. 11.
Figure 13:
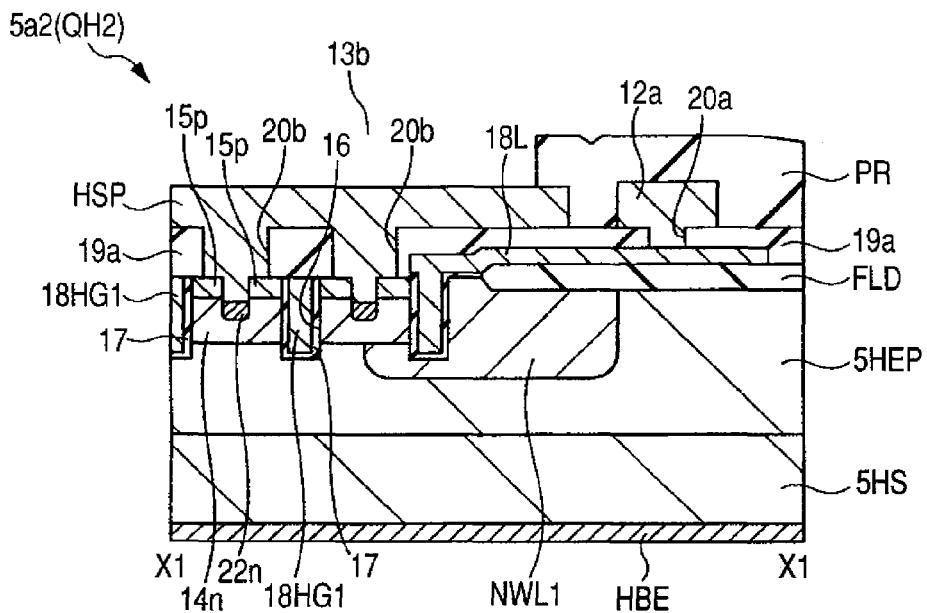
FIG. 13 is a sectional view taken along line X1-X1 of FIG. 12.
Figure 14:
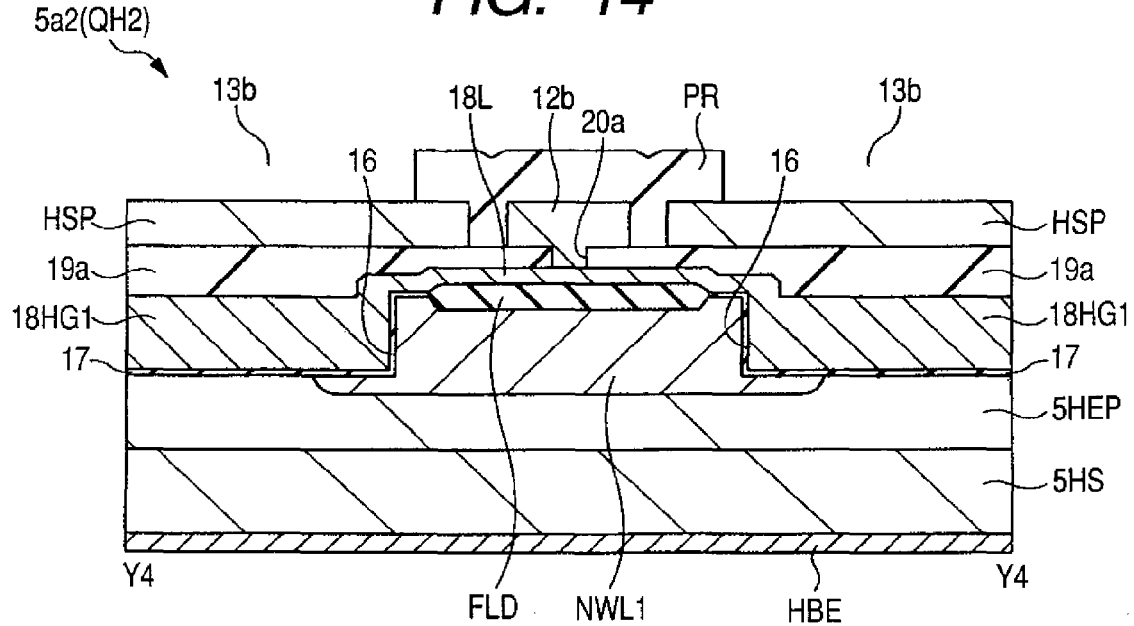
FIG. 14 is a sectional view taken along line Y4-Y4 of FIG. 12.
Figure 15:
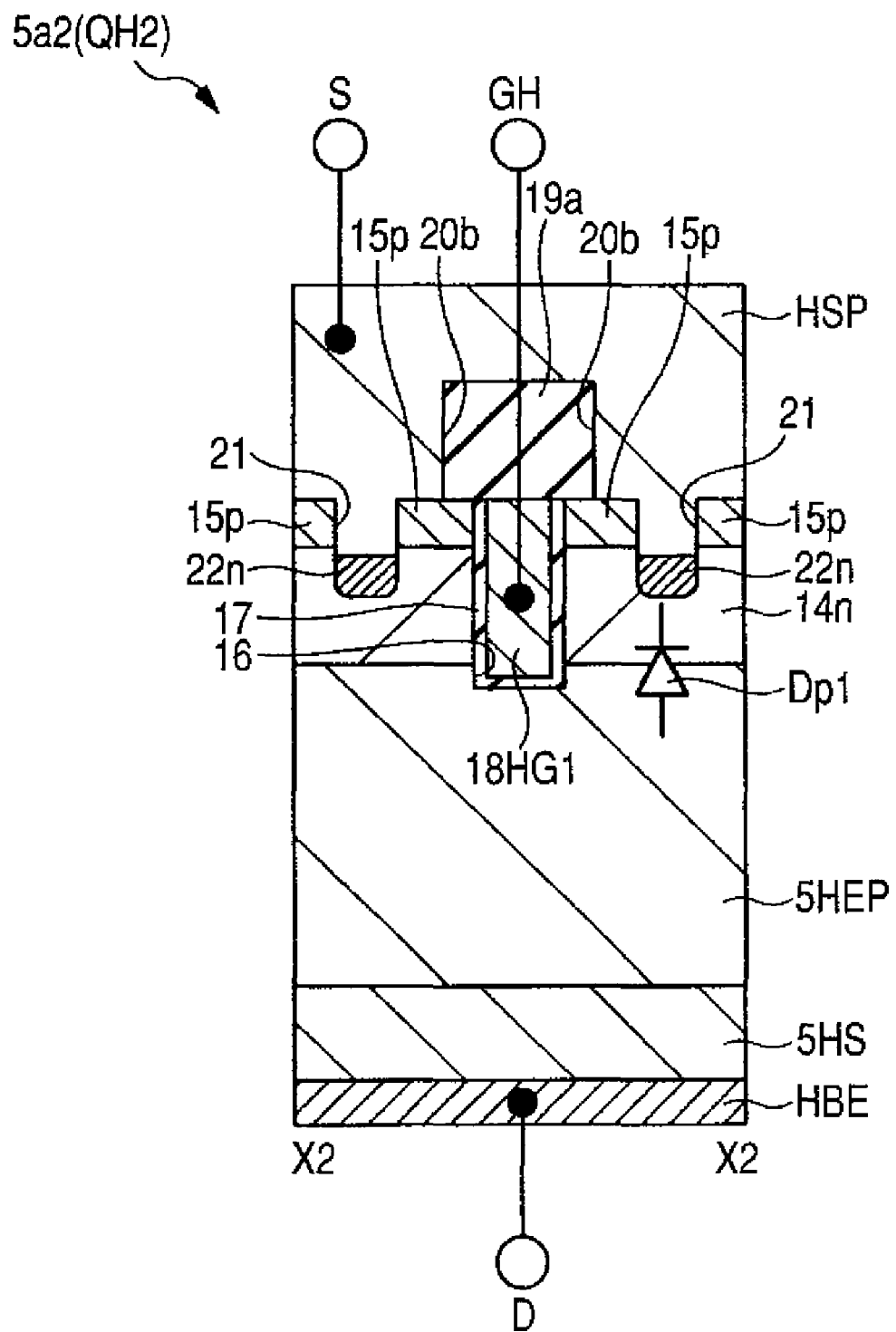
FIG. 15 is a sectional view taken along line X2-X2 of FIG. 12.

The semiconductor chip 5a2 formed with the high-side power MOSQH2 will next be explained. FIG. 11 shows an enlarged plan view of the semiconductor chip 5a2 formed with the high-side power MOSQH2, FIG. 12 shows a fragmentary enlarged plan view of the semiconductor chip 5a2 shown in FIG. 11, FIG. 13 shows a sectional view taken along line X1-X1 of FIG. 12, FIG. 14 shows a sectional view taken along line Y4-Y4 of FIG. 12, and FIG. 15 is a sectional view taken along line X2-X2 of FIG. 12, respectively.

A plane shape of the semiconductor chip 5a2 is shaped in the form of, for example, such a rectangle that the length thereof in a first direction X is longer than the length thereof in a second direction Y. The semiconductor chip 5a2 has a main surface (device forming surface: first surface) with an elemental device formed thereon, and a back surface (back-surface electrode forming surface: second surface) placed on the opposite side thereof.

A pad HGP for a gate electrode of the power MOSQH2, gate fingers (gate electrode patterns) 12a and 12b electrically connected to the pad HGP for the gate electrode, and pads HSPs each used for a source electrode of the power MOSQH2 are disposed in the main surface of the semiconductor chip 5a2. A back surface electrode HBE for a drain electrode thereof, which is made up of, for example, gold (Au), is disposed in the back surface of the semiconductor chip 5a2. The back surface electrode HBE is electrically connected to the die pad 7a4.

The pad HGP for the gate electrode is disposed in the vicinity of one end of the semiconductor chip 5a2 as viewed in the first direction X within the main surface of the semiconductor chip 5a2. The pad HGP is formed of parts of the gate fingers 12a and 12b exposed from an aperture or opening 13a defined in part of a surface protective film PR corresponding to the top layer of the semiconductor chip 5a2. The surface protective film PR is formed of, for example, a laminated film of a silicon oxide film and a silicon nitride ($Si_3N_4$) film, or one formed by laminating an organic film like a polyimide film (PiQ) over the laminated film. One gate finger 12a is formed near the outer periphery of the main surface of the semiconductor chip 5a2 along the outer periphery thereof. The other gate finger 12b is formed in the center as viewed in the second direction Y, of the semiconductor chip 5a2 in a state of extending along the first direction X. One end of the gate finger 12b is connected to the gate finger 12a, whereas the other end thereof is terminated at a position away from the gate finger 12a. The gate fingers 12a and 12b are respectively brought to a configuration wherein, for example, a barrier metal layer like titanium tungsten (TiW) or the like and a metal layer like aluminum (Al) or the like are stacked on each other in order from a lower layer. The gate fingers 12a and 12b are formed integrally with each other. Since the gate resistance of the power MOSQH2 can be reduced owing to the provision of such gate fingers 12a and 12b, such a configuration can adapt to increases in the current and frequency of the non-insulated DC-DC converter 1. Each of the pads HSPs for the source electrode is placed in a position where it is surrounded by the gate fingers 12a and 12b. The pad HSP is formed of part of a conductor pattern exposed from an aperture or opening 13b defined in part of the surface protective film PR. The upper and lower pads HSPs are electrically connected to each other at an interrupted or terminated spot of the gate finger 12b. While each pad HSP is made up of the same metal as the gate fingers 12a and 12b, the pads HSP and the gate fingers 12a and 12b are electrically connected to one another.

A semiconductor substrate (first semiconductor layer) 5HS that constitutes the semiconductor chip 5a2 is constituted of, for example, a $p^+0$ type silicon monocrystal. An epitaxial layer (second semiconductor layer) 5HEP constituted of a $p^-$ type silicon monocrystal is formed at a layer above the semiconductor substrate. A field insulating film FLD made up of, for example, silicon oxide ($SiO_2$ or the like) is formed in a main surface of the epitaxial layer 5HEP. A plurality of unit transistor cells constituting the power MOSQH2 are formed in an active region surrounded by the field insulating film FLD and an n-type well region NWL1 placed in a layer below the field insulating film. The power MOS is formed by connecting the plurality of unit transistor cells in parallel.

Each of the unit transistor cells is configured as, for example, a p channel vertical power MOSQH2 of a trench gate structure. With the provision of such a trench gate structure, miniaturization and high integration of the unit transistor cell of the power MOSQH2 can be attained. Each unit transistor cell has a semiconductor substrate 5HS and an epitaxial layer 5HEP each having a function serving as a drain region, n type semiconductor regions 14n each having a function serving as a channel forming region, the $p^+$ type semiconductor regions 15p each having a function serving as a source region, a trench 16 defined or dug in the direction of thickness of the epitaxial layer 5HEP, a gate insulting film 17 formed in the bottom and side faces of each trench 16, and a gate electrode 18HG1 embedded in the trench 16 through the gate insulating film 17 interposed therebetween.

The pad HGP for the gate electrode and the gate fingers 12a and 12b are electrically connected to a gate wiring 18L drawn or led out onto the field insulating film FLD through a contact hole 20a defined in an insulating layer 19a. The gate wiring 18L is made up of, for example, polycrystalline silicon low in resistance and is electrically connected to the gate electrodes 18HG1 formed integrally with the same. The present embodiment illustrates by way of example, a case in which as indicated by hatching with a satin finished surface shown in FIG. 12, the gate electrodes 18HG1 (trenches 16) are laid out in stripe form. That is, a plurality of plane band-like gate electrodes 18HG1 extending in the second direction Y are disposed side by side in plural form along the first direction X within a region or area for forming each unit transistor group of the power MOSQH2. However, the plane layout shapes of the gate electrodes 18HG1 (trenches 16) are not limited to the stripe form and may be changed in various ways. The plane layout shapes may be set in plane lattice form, for example. The depth of each trench 16 is set to such an extent that it extends through the n type semiconductor region 14n. Incidentally, the insulating layer 19a is formed of, for example, PSG (Phospho Silicate Glass) or the like and provides insulation between the gate electrodes 18HG1 and the gate wiring 18L and source electrode pads HSPs. On the other hand, the pads HSPs are electrically connected to the p$^+$ type semiconductor regions 15p for the source through contact holes 20b defined in the insulating layer 19a. In addition, the pads HSPs are electrically connected to n$^+$ type semiconductor regions 22n through trenches 21 dug in the n type semiconductor regions 14n in the epitaxial layer 5HEP and electrically connected to the n type semiconductor regions 14n for channel formation through the n$^+$ type semiconductor regions 22n. When the n$^+$ type semiconductor regions 22n are not formed, a large current suddenly flows into a channel region when the current changes from off to on, so that each transistor breaks down. Thus, as in the present embodiment, the n$^+$ type semiconductor regions 22n are formed and a load current is caused to flow therethrough until the current is switched to on, whereby damage of the transistor is prevented. Channels (p type channels) of such a power MOSQH2 are respectively formed between the epitaxial layer 5HEP and the p$^+$ type semiconductor regions 15p along the direction (direction of depth of each trench 16: direction intersecting the main and back surfaces of the semiconductor substrate) of thickness of the semiconductor substrate 5HS within the n type semiconductor regions 14n opposite to the side faces of the gate electrodes 18HG1 of the individual unit transistors through the gate insulating film 17 interposed between. A drive current also flows along each channel. Incidentally, while FIG. 11 is a plan view, the gate fingers 12a and 12b and pads HSPs are given hatching with the satin finished surface to make it easy to see the drawing. While FIG. 12 is a plan view, the gate electrodes 18HG1 and gate wiring 18L are given hatching with the satin finished surface to make it easy to see the drawing. In order to make it easy to understand the configuration, FIG. 12 is shown as seen through the gate electrodes 18HG1 and gate wiring 18L.

Figure 16:
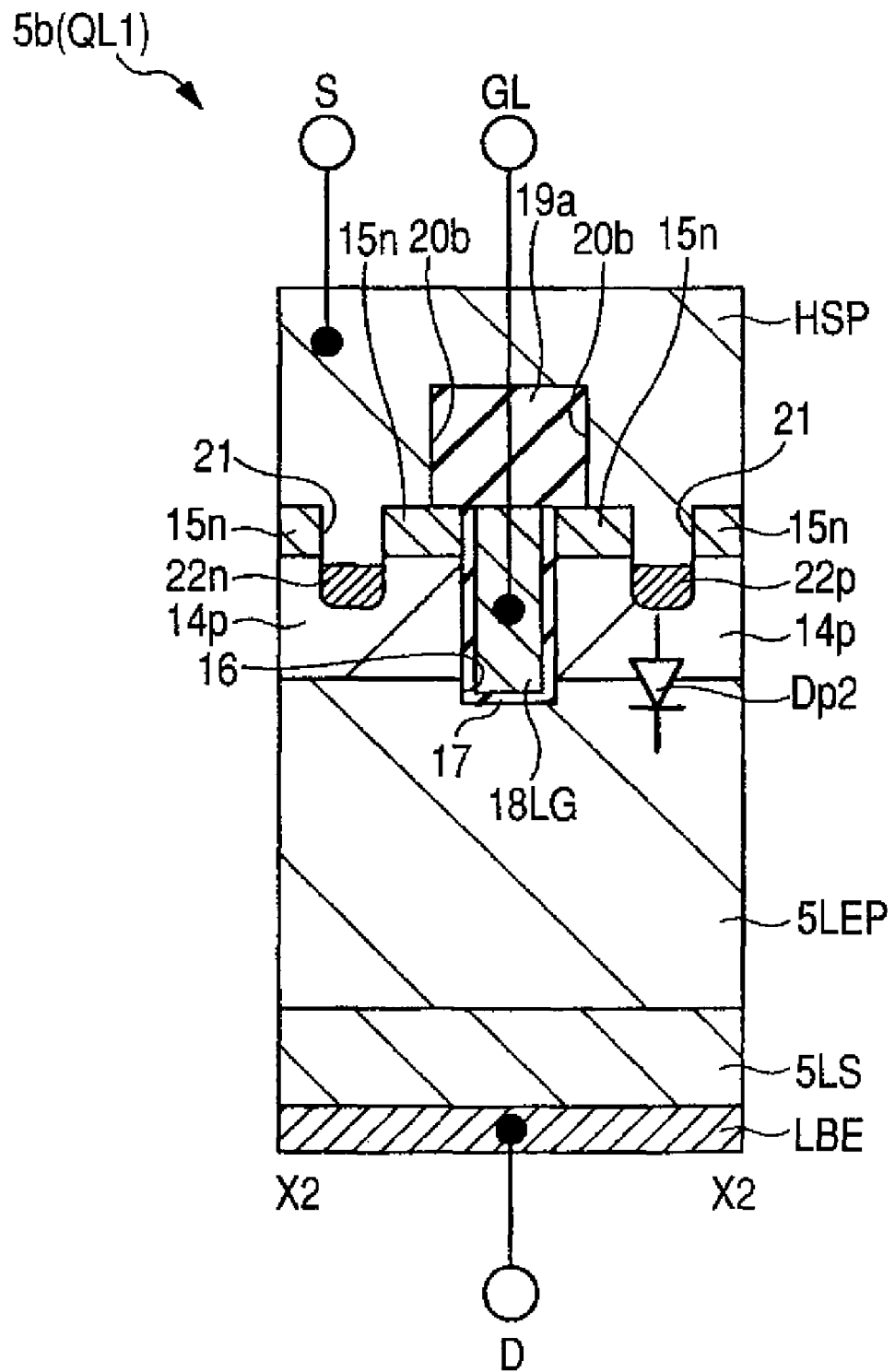
FIG. 16 is a sectional view of a unit transistor cell of a field effect transistor for a low-side switch in the semiconductor chip shown in FIG. 9.

A description will next be made of the semiconductor chip 5b formed with the low-side power MOSQL1. FIG. 16 shows a sectional view of each unit transistor cell of the n channel vertical power MOSQL1 of the semiconductor chip 5b shown in FIG. 9.

The semiconductor chip 5b is substantially identical in basic configuration to the semiconductor chip 5a2. A plane form of the semiconductor chip 5b is shaped in the form of, for example, such a rectangle that the length thereof in the first direction X is longer than that thereof in the second direction Y. The semiconductor chip 5b has a main surface (device forming surface: first surface) with an elemental device formed thereon, and a back surface (back-surface electrode forming surface: second surface) placed on the opposite side thereof.

A pad LGP for a gate electrode of the power MOSQL1, gate fingers 12a and 12b electrically connected to the pad LGP for the gate electrode, and pads LSPs each used for a source electrode of the power MOSQL1 are disposed in the main surface of the semiconductor chip 5b. A back surface electrode LBE for a drain electrode thereof, which is made up of, for example, gold (Au), is disposed in the back surface of the semiconductor chip 5b. The back surface electrode LBE is electrically connected to the die pad 7a4.

According to the discussions of the present inventors, the gate resistance of the power MOSQL1 cannot be reduced and its switching speed becomes slow in such a structure that the gate fingers are provided only on the outer periphery of the main surface of the semiconductor chip 5b in the semiconductor chip 5b of the low-side power MOSQL1. The present inventors have first found out the presence of a problem that when the gate resistance reaches a certain value or more in the low-side power MOSQL1 of the non-insulated DC-DC converter 1, a self turn-on phenomenon comes to the fore suddenly, so that a loss increases significantly. The self turn-on phenomenon is a malfunction that when the low-side power MOSQL1 is turned off and the high-side power MOSQH2 is turned on, the potential of each wiring that connects the low-side power MOSQL1 and the high-side power MOSQH2 rises, and the gate voltage of the low-side power MOSQL1 rises depending on the ratio between a drain-to-gate capacitance of the low-side power MOSQL1 and a source-to-gate capacitance thereof, so that the low-side power MOSQL1 is turned on without intention. Since the current value of the non-insulated DC-DC converter 1 is small and its frequency is also low in the existing circumstances, the influence of an increase in loss due to the self turn-on phenomenon is small and the gate resistance of the low-side power MOSQL1 is not so emphasized as compared with the gate resistance of the power MOSQH2. However, a problem arises in that the loss due to the self turn-on phenomenon increases with the increases in the current and frequency of the non-insulated DC-DC converter 1 as described above. Therefore, in the first embodiment, the plurality of gate fingers 12b are disposed over the unit transistor groups in the main surface of the semiconductor chip 5b as shown in FIG. 9. Thus, since the gate resistance of the low-side power MOSQL1 can be reduced, the self turn-on phenomenon can be suppressed. It is therefore possible to reduce the loss of the non-insulated DC-DC converter 1. The present embodiment can adapt even to the increases in the current and frequency of the non-insulated DC-DC converter 1. Each of the pads LSPs for the source electrode is shaped in a flat comb-teeth form. While the gate fingers 12a and 12b and pads LSP and LGP are formed by patterning the same metal by means of etching, they are insulated from one another.

A semiconductor substrate (first semiconductor layer) 5LS that constitutes the semiconductor chip 5b is made up of, for example, an n$^+$ type silicon monocrystal. An epitaxial layer (second semiconductor layer) 5LEP formed of an n$^-$0 type silicon monocrystal is formed at a layer thereabove. A plurality of unit transistor cells of the power MOSQL1 are formed in an active region surrounded by a field insulating film FLD of the main surface of the epitaxial layer 5LEP and a p well formed in a layer therebelow.

Each of the unit transistor cells is configured as, for example, an n channel vertical power MOSQL1 of a trench gate structure. With the provision of such a trench gate structure, miniaturization and high integration of the unit transistor cell of the power MOSQL1 can be attained. Each unit transistor cell has a semiconductor substrate 5LS and an epitaxial layer 5LEP each having a function serving as a drain region, p type semiconductor regions 14p each having a function serving as a channel forming region, the n⁺ type semiconductor regions 15n each having a function serving as a source region, a trench 16 defined or dug in the direction of thickness of the epitaxial layer 5LEP, a gate insulting film 17 formed in the bottom and side faces of each trench 16, and a gate electrode 18LG embedded in the trench 16 through the gate insulating film 17 interposed therebetween.

The plane layout of the gate electrodes 18LG and the configuration of connections among the gate electrodes 18LG, gate fingers 12a and 12b and pad LGP are identical to the semiconductor chip 5a2. The depth of each trench 16 is set to such an extent that it extends through the p type semiconductor region 14p. On the other hand, the pads LSPs for the source electrode are electrically connected to the n⁺ type semiconductor regions 15n for the source through contact holes 20b defined in the insulating layer 19a. In addition, the pads LSPs are electrically connected to p⁺ type semiconductor regions 22p through trenches 21 dug in the epitaxial layer 5LEP and electrically connected to the p type semiconductor regions 14p for channel formation through the p⁺ type semiconductor regions 22p. In each unit transistor cell, an operating current of such a power MOSQL1 flows between the epitaxial layer 5LEP for the drain and the n⁺ type semiconductor regions 15n for the source in the direction of thickness of the semiconductor substrate 5LS along the side face (i.e., the side face of each trench 16) of the gate electrode 18LG.

Second Preferred Embodiment

A second embodiment will explain a case in which an n channel horizontal power MOS is used for a high-side power MOS of a non-insulated DC-DC converter. While the present embodiment is identical to FIG. 1 in circuit diagram, each p⁺ type punch-out layer is used in the n channel horizontal power MOS. Thus, such a configuration that a drain electrode is disposed in a main surface of a semiconductor chip and a source electrode is disposed in a back surface of the semiconductor chip, is taken. Therefore, a die pad can be shared between a high-side power MOS and a low-side power MOS in a similar to the use of the p channel vertical power MOS as in the first embodiment. It is thus possible to reduce the parasitic inductances L3 and L4. The parasitic resistance of each wiring that electrically connects the source of the high-side power MOS and the drain of the low-side power MOS can also be reduced. In the high-side power MOS, switching losses (turn-on loss and turn-off loss) look large with an increase in the operating frequency of the non-insulated DC-DC converter 1 due to the parasitic capacitance added to the high-side power MOS. Since, however, a gate-to-drain feedback capacitance can be reduced as compared with the vertical power MOS when the horizontal power MOS is used as the high-side power MOS, the switching losses can be reduced. Since the parasitic inductances L3 and L4 can be reduced in a manner similar to the case in which the p channel vertical power MOS is used, the switching losses can further be reduced.

The layout of semiconductor chips 5a2 and 5b in a package 10A is also similar to that described in FIGS. 9 and 10. Although a plan view of the semiconductor chip 5a2 is also substantially identical to FIG. 11, each pad HSP for the source electrode shown in FIG. 11 results in a pad for a drain electrode and the back surface electrode at the back surface of the semiconductor chip 5a2 results in a source electrode in the second embodiment. Even in the case of the second embodiment, the semiconductor chips 5a2 and 5b have gate fingers 12a and 12b in a manner similar to the first embodiment. Plane layouts of a gate electrode and each gate wiring of the high-side power MOS in the semiconductor chip 5a2 of the second embodiment are also identical to those described in FIGS. 11 and 12 or the like.

Figure 17:
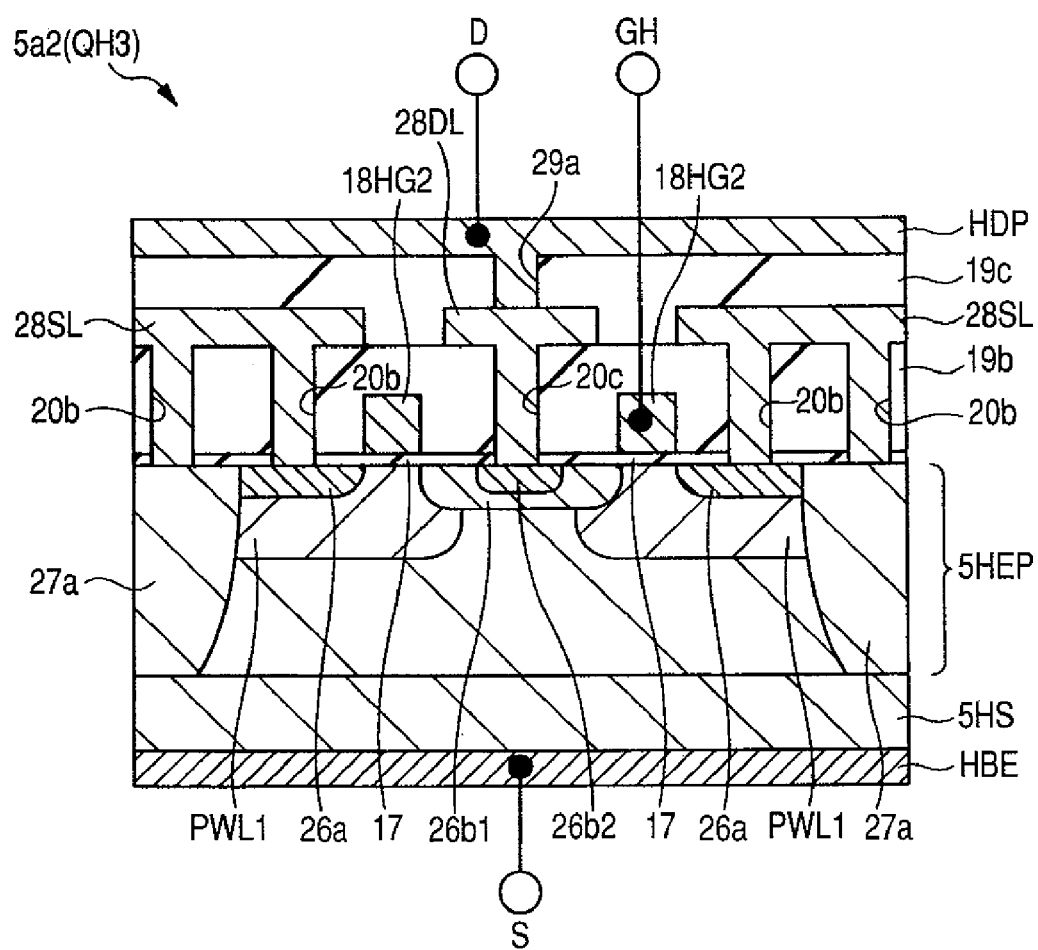
FIG. 17 is a sectional view of a unit transistor cell of a field effect transistor for a high-side switch in a semiconductor device showing a second embodiment of the present invention.

FIG. 17 shows one example of a sectional view of a unit transistor cell of the semiconductor chip 5a2 according to the second embodiment.

p type well regions PWL1 are formed in an epitaxial layer 5HEP by, for example, ion-implanting an impurity such as boron (B). The high-side n channel horizontal power MOSQH3 is formed in a main surface (i.e., a main surface of the epitaxial layer 5HEP) of a semiconductor substrate 5HS. The function per se of the power MOSQH3 is identical to the power MOSQH1. A gate insulating film 17 for the power MOSQH3 is made up of, for example, a thin silicon oxide film ($SiO_2$ or the like) or the like and is formed over the main surface (i.e., the main surface of the epitaxial layer 5HEP) of the semiconductor substrate 5HS by, for example, a thermal oxidation method or the like. Gate electrodes 18HG2 for the power MOSQH3 are formed over the gate insulating film 17. The gate electrodes 18HG2 are formed by, for example, patterning a polycrystalline silicon film and a metal silicide layer (e.g., titanium silicide layer or cobalt silicide layer) formed over the main surface of the semiconductor substrate 5HS by use of a photolithography method and an etching method. n⁺ type semiconductor regions (n⁺ type diffusion layers) 26a each used as a source region of the power MOSQH3 are formed in the p type well regions PWL1 in such a state as to extend to one ends of the gate electrodes 18HG2. A drain region of the power MOSQH3 is formed between the adjacent gate electrodes 18HG2 and 18HG2 so as to be shared therebetween and includes an n type semiconductor region (n⁻ type diffusion layer) 26b1 and an n⁺ type semiconductor layer (n⁺ type diffusion layer) 26b2. The n⁻ type semiconductor region (n⁻ type diffusion layer) 26b1 is formed so as to extend to the ends of the respective gate electrodes 18HG2. The n⁺ type semiconductor region (n⁺ type diffusion region) 26b2 is provided away by the n⁻ type semiconductor region 26b1 from each of the gate electrodes 18HG2 and set higher than the n⁻ type semiconductor region 26b1 in impurity concentration. That is, the drain region is configured as an LDD (Lightly Doped Drain) structure. The n⁻ type semiconductor region 26b1 and the n⁺ type semiconductor region 26b2 are respectively formed by, for example, ion-implanting an impurity such as phosphorous (P). Channels (n type channels) of such a power MOSQH3 are located above the p type well regions PWL1 opposite to the lower surfaces of the gate electrodes 18HG2 through the gate insulating film 17 interposed therebetween and are formed between the n⁺ type semiconductor regions (n⁺ type diffusion layers) 16a and the n⁻ type semiconductor region (n⁻ type diffusion layer) 26b1 and n⁺ type semiconductor region (n⁺ type diffusion layer) 26b2 along the main surface of the semiconductor substrate 5HS. Incidentally, p⁺ type semiconductor regions 27a (the p⁺ type punch-out layers) 27a are formed in the epitaxial layer 5HEP. The p⁺ type semiconductor region 27a is formed by, for instance, ion-implanting the impurity such as boron (B)

and formed in such an impurity distribution as to reach the semiconductor substrate 5HS from the main surface of the epitaxial layer 5HEP.

An insulating layer 19b constituted of, for example, a silicon oxide film or the like is formed over the main surface of the semiconductor substrate 5HS so as to cover the gate electrodes 18HG2. Source wirings 28SL and a drain wiring 28DL are formed over the insulating layer 19b. The source wiring 28SL and the drain wiring 28DL are respectively constituted of a laminated film obtained by depositing an aluminum alloy film over an aluminum alloy or a barrier film, for example. The source wirings 28SL are electrically connected to their corresponding the $n^+$ type semiconductor regions 26a for the source and the $p^+$ type semiconductor regions 27a for the punch-out layer through contact holes 20b defined in the insulating layer 19b. Therefore, the $n^+$ type semiconductor regions 26a of the high-side power MOSQH3 are connected to their corresponding $p^+$ type semiconductor regions 27a through the source wirings 28SL and electrically connected to the back surface electrode HBE of the back surface of the semiconductor substrate 5HS through the semiconductor substrate 5HS. That is, the back surface electrode HBE serves as the source electrode of the high-side power MOSQH3, and the reference potential GND is applied thereto. The drain wiring 28DL is electrically connected to its corresponding $n^+$ type semiconductor region 26b2 through a contact hole 20c defined in the insulating layer 19b.

An insulating layer 19c is deposited over the insulting layer 19b so as to cover the source wirings 28SL and the drain wiring 28DL. The insulating layer 19c is constituted of the same insulating material as the insulating layer 19b. A pad HDP for the drain electrode and a pad HGP for each gate electrode are disposed in an upper surface (the main surface of the semiconductor chip 5a2) of the insulating layer 19c. Configurations of the pads HDP and HGP are identical to the pad HGP employed in the first embodiment. The pad HDP is electrically connected to the drain wiring 28DL via a through hole 29a defined in the insulating layer 19c. The pad HDP is electrically connected to its corresponding lead 7b1 through the wires WA1 (see FIG. 9). The pad HGP is electrically connected to the gate electrodes 18HG2 through wirings formed in the semiconductor chip 5a2. Incidentally, a surface protective film PR is formed at the top layer of the main surface of the semiconductor chip 5a2 in a manner similar to the first embodiment even in this case. Part thereof is made open to expose the pads HGP and HDP.

Third Preferred Embodiment

A third embodiment will explain a configuration wherein three semiconductor chips constituting a non-insulated DC-DC converter are accommodated within one package.

Figure 18:
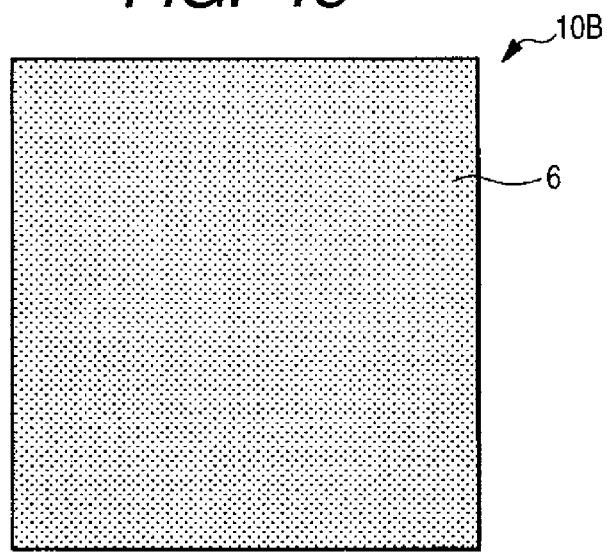
FIG. 18 is an overall plan view illustrating a main surface side of a package of a semiconductor device showing a third embodiment of the present invention.
Figure 19:
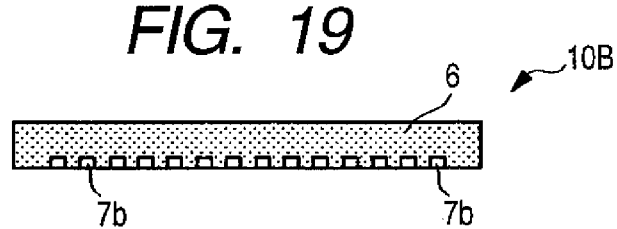
FIG. 19 is a side view of the package shown in FIG. 18.
Figure 20:
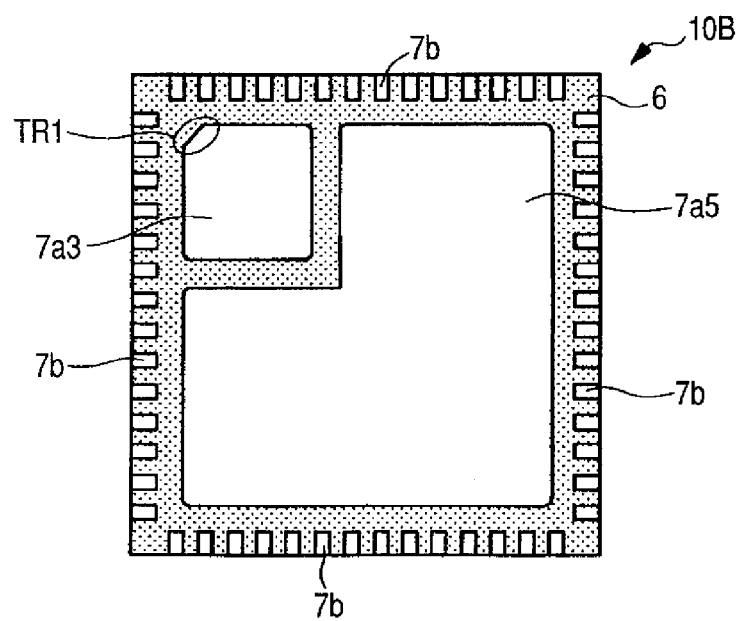
FIG. 20 is an overall plan view showing a back surface side of the package shown in FIG. 18.

FIG. 18 shows an overall plan view illustrating a main surface side of a package 10B employed in the third embodiment, FIG. 19 shows a side view of the package 10B shown in FIG. 18, and FIG. 20 shows an overall plan view illustrating a back surface side of the package 10B shown in FIG. 18, respectively.

The package 10B of the third embodiment is provided as a QFN (Quad Flat Non-leaded package) configuration, for example. However, the package 10B is not limited to the QFN configuration and can be changed in various ways. The package 10B may be formed as a flat package configuration like, for example, a QFP (Quad Flat Package), an SOP (Small Out-line Package) or the like.

An encapsulator 6 that constitutes the package 10B has an outward appearance shaped in the form of a thin plate. Back surfaces of two die pads (first and second chip mounting sections) 7a3 and 7a5 flat and substantially rectangular, for example are exposed from a back surface of the encapsulator 6. A material for each of the die pads 7a3 and 7a5 is identical to the die pads 7a1, 7a2 and 7a4 referred to above. Some of a plurality of leads (external terminals) 7b are exposed along the outer periphery of the encapsulator 6 from the four side faces of the encapsulator 6 and the outer periphery of the back surface thereof. As will be described later, the semiconductor chips 5a2 and 5b are respectively mounted over a main surface of the die pad 7a5. The semiconductor chip 5c is mounted over a main surface of the die pad 7a3. A positioning taper TR1 (index mark) is formed at one corner of the die pad 7a3. Incidentally, in the present structure, both the back surfaces (surfaces opposite to the surfaces over which the semiconductor chips 5a2, 5b and 5c are mounted) of the die pads 7a3 and 7a5 and the back surfaces (junction surfaces joined or bonded to terminals of a wiring board) of the leads 7b exist in a mounting surface (surface opposite to the wiring board when the package 10B is mounted onto the wiring board) of the package 10B.

Figure 21:
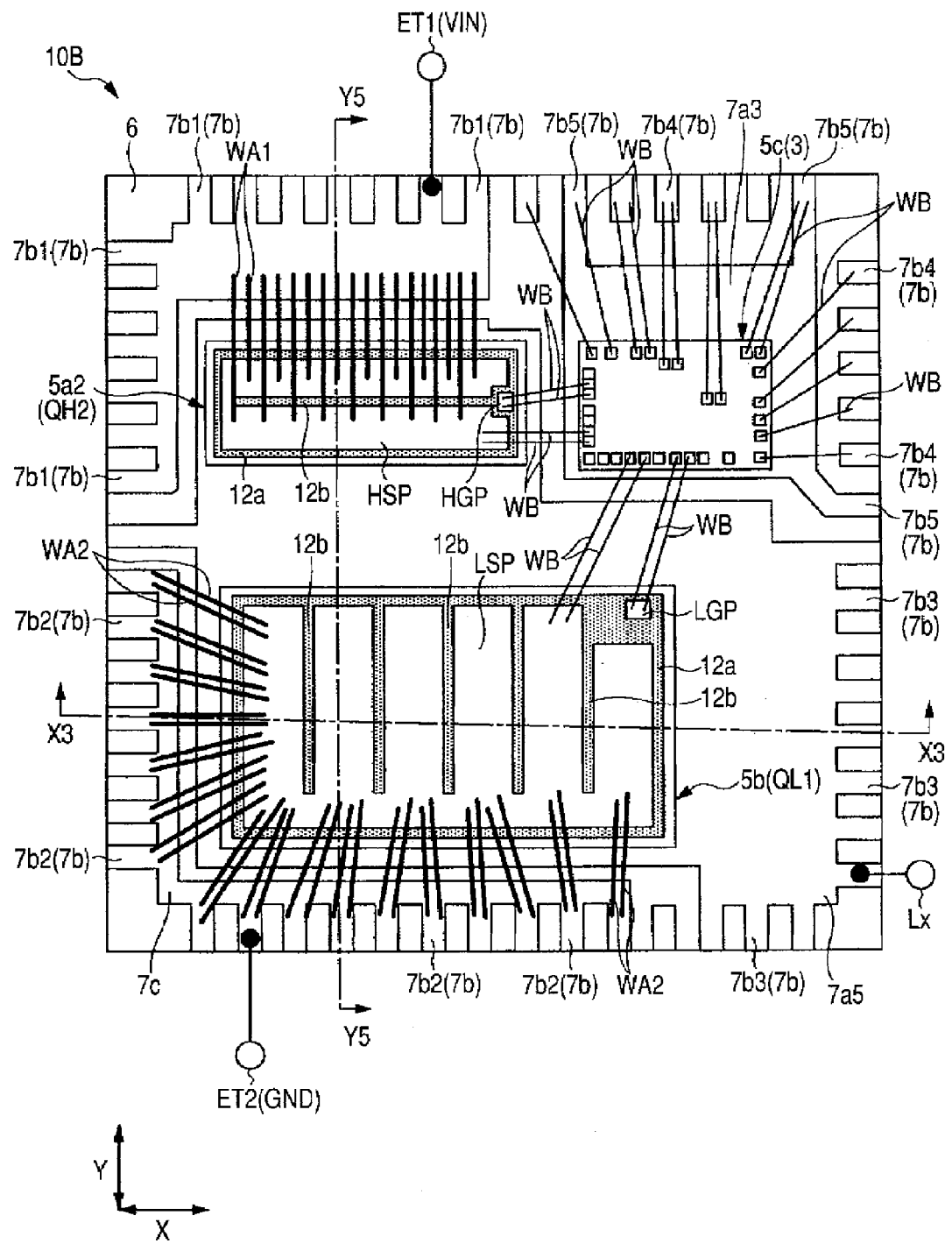
FIG. 21 is an overall plan view showing the main surface side of the package as seen through the interior of the package shown in FIG. 18.
Figure 22:
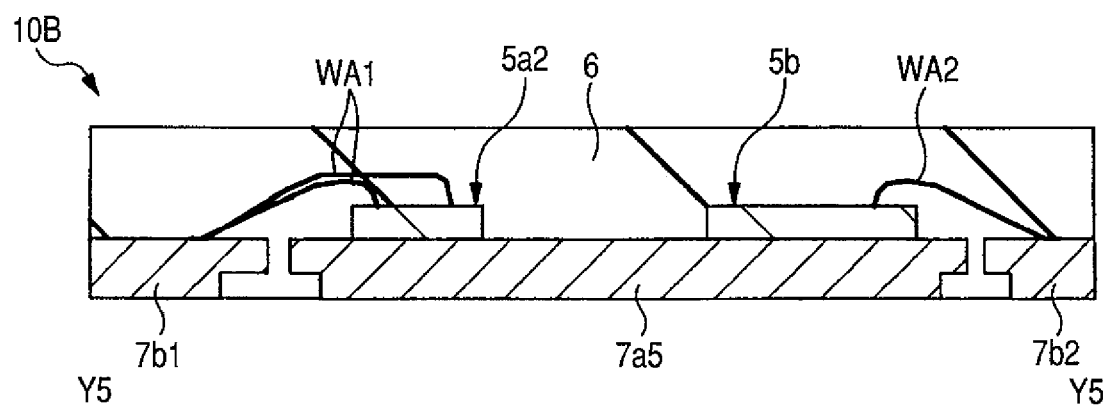
FIG. 22 is a sectional view taken along line Y5-Y5 of FIG. 21.
Figure 23:
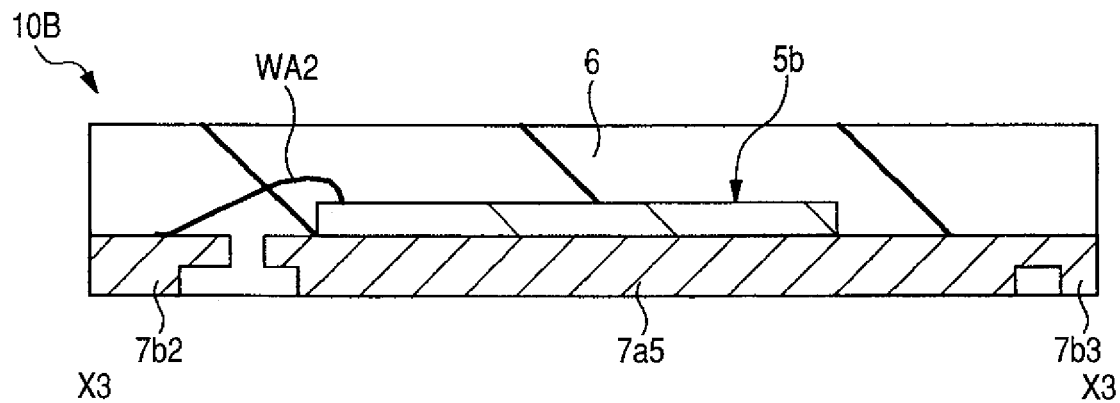
FIG. 23 is a sectional view taken along line X3-X3 of FIG. 21.
Figure 24:
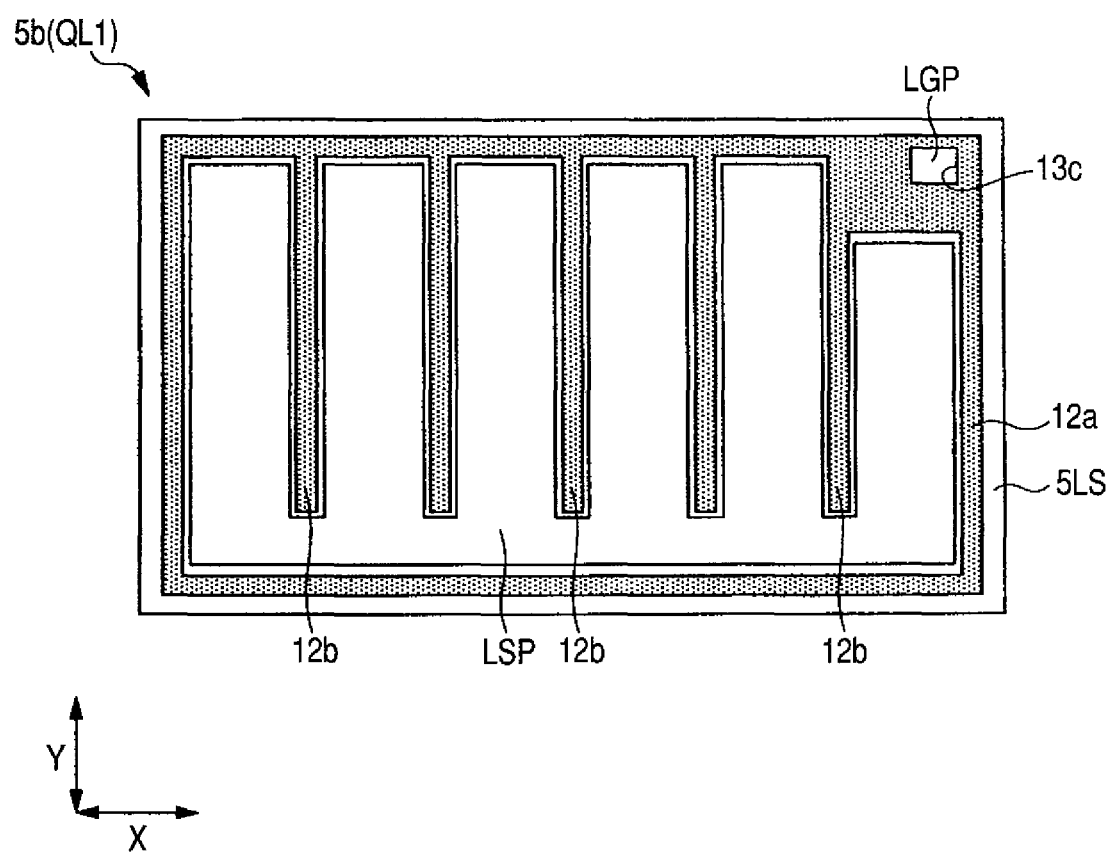
FIG. 24 is an overall plan view of a semiconductor chip formed with a field effect transistor for a low-side switch in the package shown in FIG. 18.

Next, FIG. 21 shows an overall plan view showing a main surface side of the package 10B as seen through the interior of the package 10B shown in FIG. 18, FIG. 22 shows a sectional view taken along line Y5-Y5 of FIG. 21, FIG. 23 shows a sectional view taken along line X3-X3 of FIG. 21, and FIG. 24 shows an overall plan view of the semiconductor chip 5b in the package 10B, respectively.

Some of the two die pads 7a3 and 7a5, the semiconductor chips 5a2 and 5b mounted over the die pad 7a5, the semiconductor chip 5c mounted over the die pad 7a3, wires WA1, WA2 and WB, and some of the leads 7 are encapsulated in the package 10B.

The die pads 7a3 and 7a5 are disposed adjacent to each other in a state of being separated from each other with a predetermined interval provided therebetween. Heat generated upon the operations of the semiconductor chips 5a2, 5b and 5c are mainly radiated from the back surface sides of the die pads 7a3 and 7a5 to the outside through the die pads 7a3 and 7a5 from the back surfaces of the semiconductor chips 5a2, 5b and 5c. Therefore, the die pads 7a3 and 7a5 are respectively formed larger than the areas of the semiconductor chips 5a2, 5b and 5c. Thus, the radiation of the non-insulated DC-DC converter 1 can be improved.

Parts of the outer peripheries of the back surface sides of the die pads 7a3 and 7a5 and the leads 7b are formed with half etching regions such that their thicknesses become thin. This is because the adhesion between each of the die pads 7a3 and 7a5 and leads 7b and the encapsulator 6 is improved to reduce or prevent peeling of the die pads 7a3 and 7a5 and leads 7b and their deformations and failures.

The semiconductor chip 5a2 formed with the high-side power MOSQH2 and the low-side power MOSQL1 are mounted over the largest die pad 7a5 in a state in which their main surfaces are being turned up. Since the parasitic inductances L3 and L4 can be reduced with the mounting of the semiconductor chips 5a2 and 5b over the same die pad 7a5 even in the case of the third embodiment, switching losses can be reduced. Since the semiconductor chip 5a2 formed with the high-side power MOSQH2 and the semiconductor chip 5b formed with the low-side power MOSQL1 can be disposed close to each other as compared with the case in which the high-side power MOS is formed of an n channel vertical power MOS, the package 10B can be reduced in size.

The configuration of the semiconductor chip 5a2 is identical to one described in FIGS. 9 through 15 showing the first embodiment. The high-side power MOSQH2 of the semiconductor chip 5a2 is constituted of a p channel vertical power MOS. Pads HSPs for a source electrode, of the power MOSQH2 and a pad HGP thereof for a gate electrode are disposed in the main surface of the semiconductor chip 5a2. The pads HSPs for the source electrode are electrically connected to leads 7b1 (7b) through a plurality of wires WA1 and electrically connected to pads for a source electrode, of a driver circuit 3 of the semiconductor chip 5c through a plurality of wires WB. The pad HGP for the gate electrode is electrically connected to pads for an output (drain) electrode, of the driver circuit 3 of the semiconductor chip 5c through a plurality of wires WB. Further, a drain electrode of the power MOSQH2 lying in the back surface of the semiconductor chip 5a2 is electrically connected to a plurality of leads 7b3 (7b) formed integrally with the outer periphery of the die pad 7a5 and a drain electrode of the low-side power MOSQL1 of the semiconductor chip 5b through the die pad 7a5. The leads 7b3 are electrically connected to the output node Lx. Incidentally, the wires WA1 are disposed in zigzags in such a manner that the wires WA1 adjacent to one another in the first direction X are alternately connected to the pads HSPs placed above and below.

The semiconductor chip 5a2 is disposed closer to the leads 7b1 than the center of the die pad 7a5. Thus, since the lengths of the wires WA1 for electrically connecting the pads HSPs for the source electrode of the power MOSQH2 and the leads 7b1 can be shortened, the parasitic inductance L2 between the source of the power MOSQ1 and the terminal ET1 can be reduced. The semiconductor chip 5a2 is disposed such that its long side extends along the direction (first direction X) adjacent to the leads 7b1. Thus, since the wires WA1 can be disposed in plural form, the parasitic inductance L2 between the source of the power MOSQ1 and the terminal ET1 can be reduced. With the formation of the semiconductor chip 5a2 in rectangular form, the length of each gate wiring (gate electrode) formed of polysilicon, extending in the second direction Y of FIG. 21 can be shortened. It is therefore possible to reduce gate resistance of the power MOSQH2. Further, the semiconductor chip 5a2 is disposed in such a manner that the distance between the semiconductor chips 5a2 and 5c becomes shorter than the distance between the semiconductor chips 5a2 and 5b, particularly, the pad HGP of the semiconductor chip 5a2 and the pad of the semiconductor chip 5c are close to each other in terms of the distance therebetween. This shows a configuration which has considered that in the high-side power MOSQH2, an increase in the inductance of its gate greatly influences an increase in switching loss. Since the semiconductor chip 5a2 can be disposed close to the semiconductor chip 5c, the length of each of the wires WB that electrically connect the pad HGP of the power MOSQH2 and the output electrode pads of the driver circuit 3 can be shortened. Therefore, the inductance that is parasitic on the gate of the power MOSQH2 can be reduced, and the switching losses of the power MOSQH2 can be reduced. Since the parasitic inductance between the driver circuit 3 and the power MOSQH2 can be reduced, the speed of transfer of each control signal can be improved. With the above-described layout of semiconductor chip 5a2, the switching losses of the power MOSQH2 can be reduced and voltage conversion efficiency of the non-insulated DC-DC converter 1 can be enhanced.

While the wires WA1 and WB2 are formed of gold (Au), for example, ones thicker than the wires WB are used as the wires WA1. Thus, since wiring inductance on the source side of the power MOSQH2 can be reduced, the switching losses of the non-insulated DC-DC converter 1 can be reduced and the voltage conversion efficiency can be enhanced.

On the other hand, pads LSPs for a source electrode of the power MOSQL1 and a pad LGP for a gate electrode are disposed in the main surface of the semiconductor chip 5b. The pads LSPs are electrically connected to leads 7b2 (7b) through a plurality of wires WA2 and electrically connected to the source electrode pads of the driver circuit 3 of the semiconductor chip 5c through a plurality of wires WB. The pad LGP for the gate electrode is electrically connected to the pads for the output (drain) electrode of the driver circuit 3 of the semiconductor chip 5c through a plurality of wires WB. Further, the drain electrode of the power MOSQL1 at the back surface of the semiconductor chip 5b is electrically connected to the leads 7b3 (7b) and the drain electrode of the high-side power MOSQH2 of the semiconductor chip 5a2 through the die pad 7a5.

The semiconductor chip 5b formed with the low-side power MOSQL1 is shaped in the form of a rectangle whose length in the first direction X of FIGS. 21 and 24 is longer than the length thereof in the second direction Y. A pad LGP for a gate electrode, of the power MOSQL1, gate fingers 12a and 12b, and pads LSPs for a source electrode, of the power MOSQL1 are disposed over the main surface of the semiconductor chip 5b. A back surface electrode for a drain electrode, which is made up of, for example, gold (Au), is disposed over the back surface of the semiconductor chip 5b.

The pad LGP for the gate electrode is disposed in the neighborhood of the corner at the main surface of the semiconductor chip 5b and formed by some of the gate fingers 12a and 12b exposed through an opening 13c defined in part of a surface protective film corresponding to the top layer of the semiconductor chip 5b. One gate finger 12a is formed near the outer periphery of the main surface of the semiconductor chip 5a2 along the outer periphery thereof. The other plural gate fingers 12b are formed in a state of extending from one long side of the semiconductor chip 5b to the other long side thereof. One end of each gate finger 12b is connected to the gate finger 12a, whereas the other end thereof is terminated at a position away from the gate finger 12a. Since the gate resistance of the power MOSQL1 can be reduced owing to the provision of such gate fingers 12a and 12b, such a configuration can adapt to increases in the current and frequency of the non-insulated DC-DC converter 1. Each of the pads LSPs for the source electrode is placed in a position where it is surrounded by the gate fingers 12a and 12b. The pad LSP is formed of part of a conductor pattern exposed from an aperture or opening defined in part of the surface protective film PR. While each pad LSP is made up of the same metal as the gate fingers 12a and 12b, the pads LSPs and the gate fingers 12a and 12b are electrically insulated from one another.

While the semiconductor chip 5b is disposed along the semiconductor chip 5a, the semiconductor chip 5b is separated from the semiconductor chip 5b and disposed away from the center of the die pad 7a2 so as to approach the leads 7b2. That is, the semiconductor chip 5b is disposed closer to the leads 7b2 connected with a terminal ET2 supplied with a reference potential GND. Connecting points of wires WA2 to the pads LSPs for the source electrode are disposed closer to the leads 7b2 than the center of the semiconductor chip 5b. Owing to these, the lengths of the wires WA2 for electrically connecting the pads LSPs of the power MOSQL1 and the leads 7b2 can be shortened. The two sides corresponding to the long and short sides intersecting each other, of the semiconductor chip 5b are disposed along the layout shapes (L shape as viewed in the plane) of the plural leads 7b2. Particularly, the pads LSPs for the source electrode of the power MOSQL1 are brought to such shapes as to extend along the layout shapes of the plural leads 7b2. Thus, the wires WA2 can be disposed in plural numbers. Further, the plural leads 7b2 are placed along the two sides perpendicular to each other, of the die pad 7a5 and connected to a flat L-shaped wiring section 7c that extends along the two sides. By collectively connecting the plural leads 7b2 to the wiring section 7c in this way, the plural leads 7b2 increase in volume as compared with their division. Therefore, wiring resistance can be reduced and the reference potential GND can be enhanced. This configuration is such a configuration which has considered that an increase in on resistance on the source side, of the low-side power MOSQL1 greatly influences an increase in switching loss. Since the on resistance on the source side of the power MOSQL1 can be reduced owing to such a configuration as described above, the conduction loss of the power MOSQL1 can be lowered. Since variations in parasitic impedance produced in the wires WA2 can be reduced, variations in the magnitude of current flowing through each wire WA2 can also be reduced. Thus, voltage conversion efficiency of the non-insulated DC-DC converter 1 can be improved. The reference potential GND can be enhanced and hence the stability of operation of the non-insulated DC-DC converter 1 can be improved.

The wires WA2 and WB are both made up of, for example, gold (Au), whereas the wires WA2 make use of ones thicker than the wires WB. With the use of the thick wires WA2 as the wires electrically connected to the source of the power MOSQL1, wiring resistance on the source side of the power MOSQL1 can be reduced. Therefore, the on resistance of the power MOSQL1 can be reduced. It is thus possible to improve voltage conversion efficiency of the non-insulated DC-DC converter 1.

Since the die pad 7a5 on which the semiconductor chip 5b formed with the low-side power MOSQL1 highest in heating value is mounted, and the die pad 7a3 on which the semiconductor chip 5c formed with the driver circuit 3 is mounted, are separated from each other, heat generated at the semiconductor chip 5b can be prevented from being transferred directly to the die pad 7a3. Owing to these, the stability of operation of the non-insulated DC-DC converter 1 can be improved.

Further, the semiconductor chip 5c formed with the driver circuit 3 is mounted over the die pad 7a3 placed on the upper right side of FIG. 21 and smallest in area in a state of its main surface being turned up. In addition to the above pads, pads for respective signal input (gate) electrodes of the driver circuit 3, and source electrode pads are placed in the main surface of the semiconductor chip 5c. The gate electrode pads are electrically connected to leads 7b4 (7b) through a plurality of wires WB. The source electrode pads are electrically connected to leads 7b5 (7b) formed integrally with the die pad 7a3 through a plurality of wires.

The semiconductor chip 5c formed with the driver circuit 3 is also shaped in the form of a flat rectangle. The pads connected to the power MOSQH2 and MOSQL1 are disposed in the main surface of the semiconductor chip 5c along two sides placed on the sides adjacent to the semiconductor chips 5a2 and 5b respectively. Thus, since the length of each wire WB can further be shortened, the parasitic inductance produced in each wiring path can further be reduced. Since the semiconductor chip 5a2 needs a desire to reduce the switching losses rather than the on resistance as described above, the distance between the semiconductor chip 5c and the semiconductor chip 5a2 is provided so as to be shorter than the distance between the semiconductor chip 5c and the semiconductor chip 5b as described above, and additionally, even as to the wires WB, the wires WB respectively electrically connected to the source and gate of the power MOSQH2 are formed shorter than the wires WB respectively electrically connected to the source and gate of the power MOSQL1. Incidentally, ones thinner than the wires WA1 and WA2 are used as the wires WB. This is because when the thick wires are used, the sizes of the pads over the main surface of the semiconductor chip 5c should also inevitably be increased, thus causing an increase in chip size and a rise in manufacturing cost.

Figure 2:
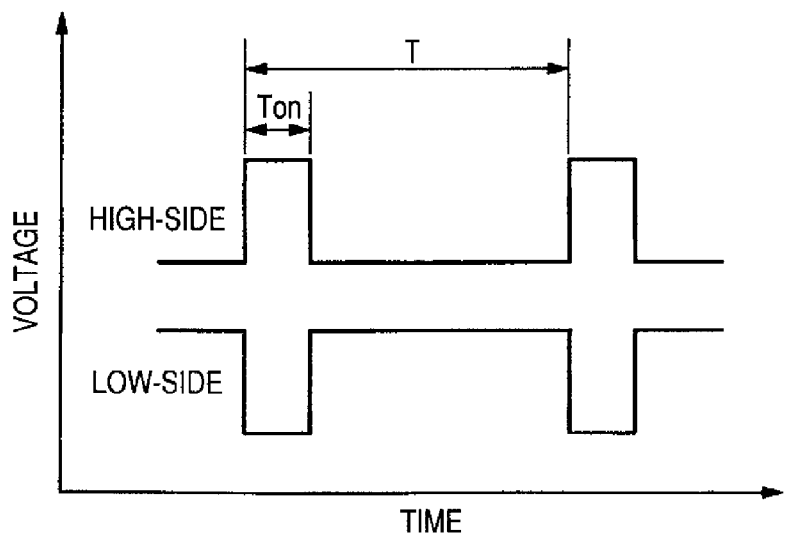
FIG. 2 is a timing chart of the semiconductor device shown in FIG. 1.

The semiconductor chips 5a2, 5b and 5c are different in outer size (area) due to the differences among their characteristics. The outer size of the semiconductor chip 5a2 is formed larger than that of the semiconductor chip 5c. The outer size of the semiconductor chip 5b is formed larger than that of the semiconductor chip 5a2. Since the semiconductor chip 5c having the driver circuit 3 is a control circuit that controls the gates of the power MOSQH2 and MOSQL1, it is desirable that the outer size of each elemental device is set as small as possible in consideration of the size of the whole package. On the other hand, it is desirable that the on resistance produced in each transistor is reduced as much as possible in each of the power MOSQH2 and MOSQL1. Since the reduction in on resistance can be realized by expanding a channel width per unit transistor cell area, the outer sizes of the semiconductor chips 5a2 and 5b are formed larger than the outer size of the semiconductor chip 5c. Further, since the low-side power MOSQL1 is longer in on time than the high-side power MOSQH2 as shown in FIG. 2, it is necessary to lower the on resistance of the power MOSQL1 than that of the power MOSQH2. Therefore, the outer size of the semiconductor chip 5b is formed larger than that of the semiconductor chip 5a2.

Fourth Preferred Embodiment

A fourth embodiment will explain a configuration wherein three semiconductor chips constituting a non-insulated DC-DC converter are accommodated or held in one package and a high-side power MOS is formed of an n channel horizontal power MOS.

Figure 25:
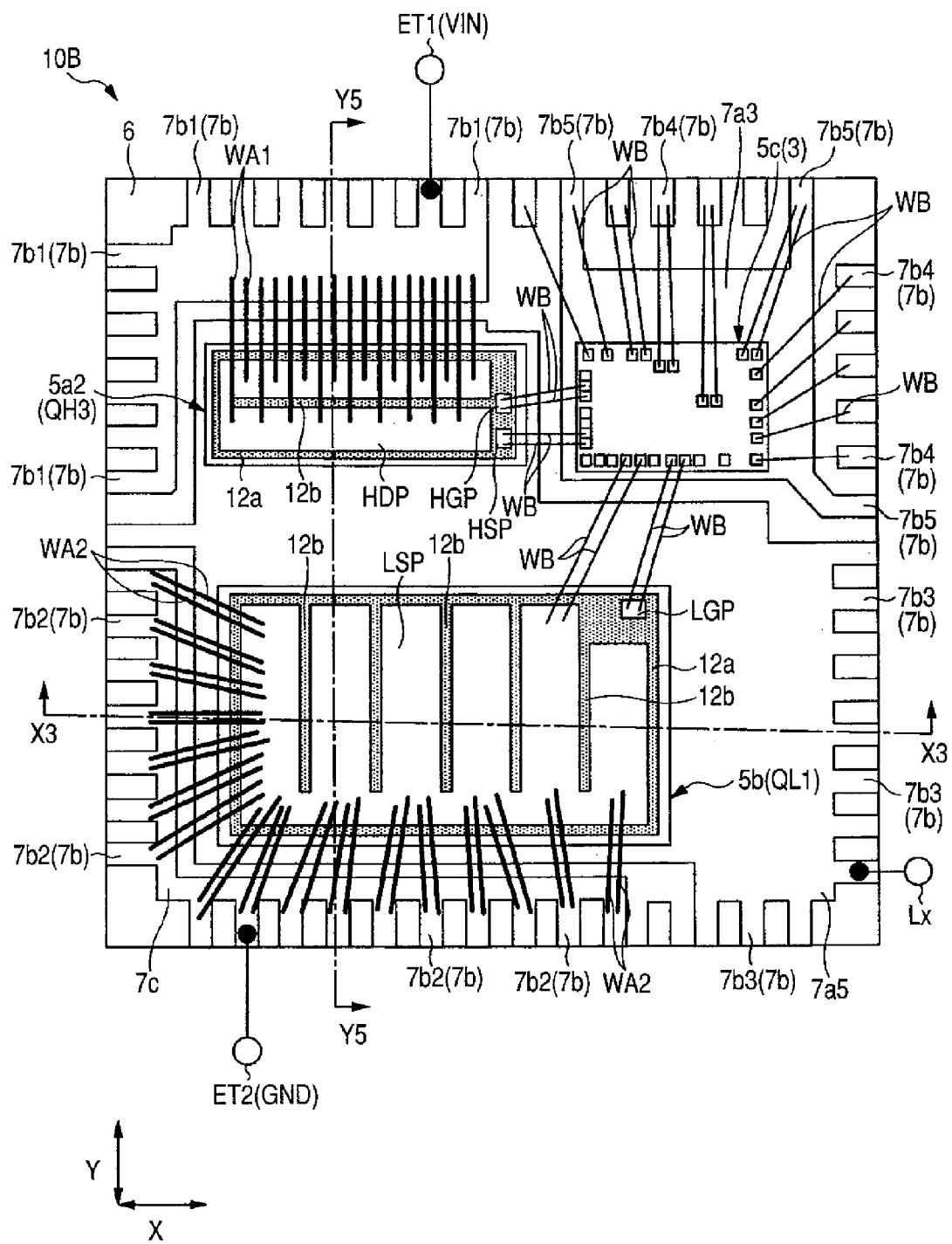
FIG. 25 is an overall plan view showing a main surface side of a package of a semiconductor device illustrative of a fourth embodiment of the present invention.
Figure 26:
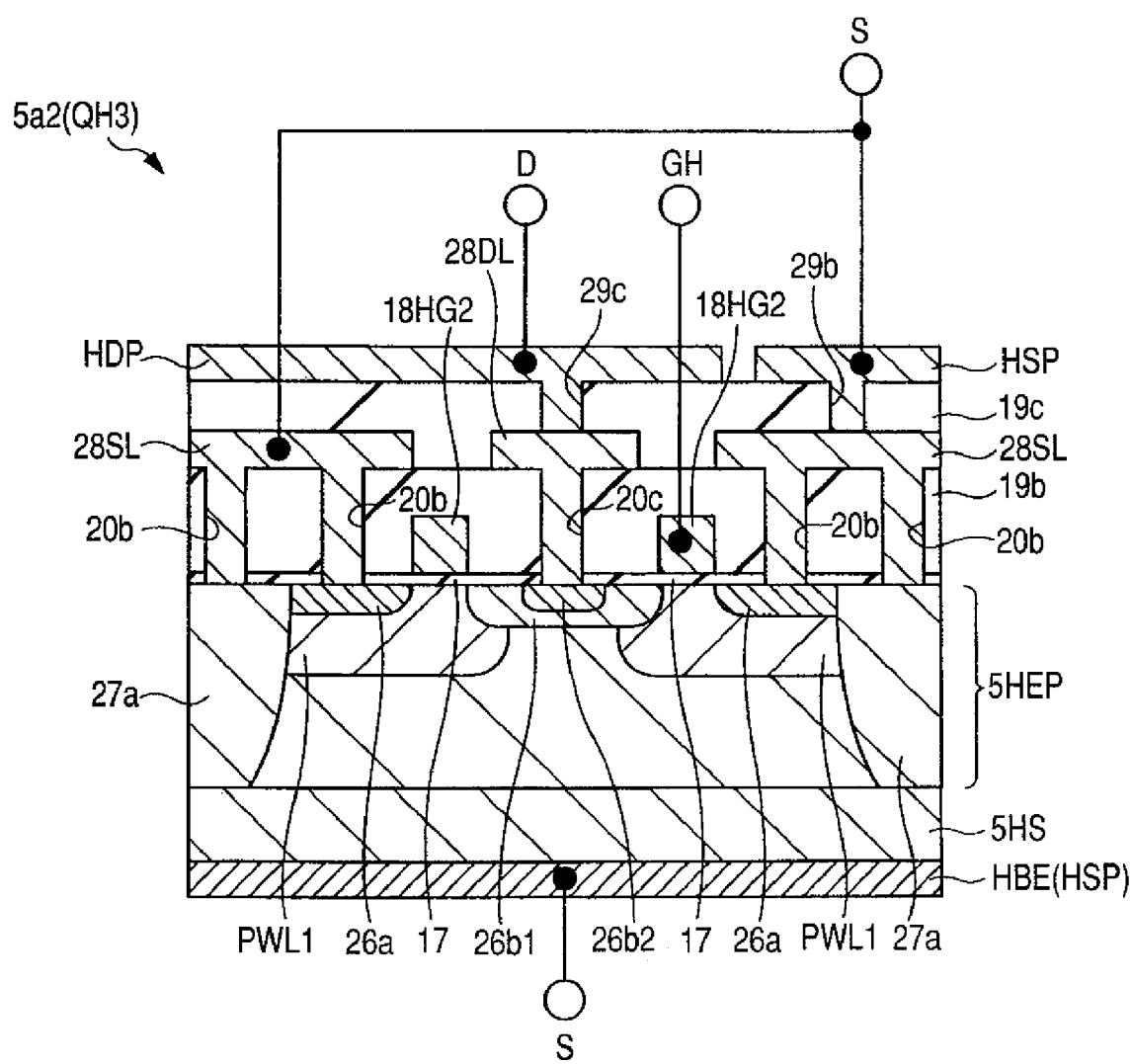
FIG. 26 is a sectional view of a unit transistor cell of a semiconductor chip formed with a power MOS•FET for high side in the package shown in FIG. 25.

FIG. 25 shows an overall plan view illustrating a main surface side of a package 10B of the fourth embodiment as seen through the interior of the package 10B, and FIG. 26 shows a sectional view of a unit transistor cell of a semiconductor chip 5a2 formed with a high-side power MOSQH3 in the package 10B shown in FIG. 25, respectively. Incidentally, a sectional view taken along-line Y5-Y5 of FIG. 25 is identical to FIG. 22, and a sectional view taken along line X3-X3 of FIG. 25 is identical to FIG. 23.

The layouts of leads 7b, wires WA1, WA2 and WB, die pads 7a3 and 7a5, and semiconductor chips 5a2, 5b and 5c are identical to those described in the third embodiment. The present embodiment is different therefrom in that a pad HSP for a source electrode, of the high-side power MOSQH3 is disposed even in a main surface (corresponding to the same surface as for the layouts of a pad HGP for a gate electrode and pads HDPs for a drain electrode) of the semiconductor chip 5a2 in a state of being electrically isolated from the pads HGP and HDP.

Although a device structure per se formed in the semiconductor chip 5a2 shown in FIG. 26 is identical to one shown in FIG. 17, the pad HSP for the source electrode is drawn out even to the main surface of the semiconductor chip 5a2 by changing the configuration of a wiring layer. That is, source wirings 28SL of the semiconductor chip 5a2 are electrically connected to the pad HSP placed over the main surface of the semiconductor chip 5a2 through a through hole 29b defined in an insulating layer 19c. Incidentally, a back surface electrode HBE also serves as the source electrode as mentioned in the second embodiment.

As shown in FIG. 25, the source electrode pad HSP placed over the main surface of the semiconductor chip 5a2 is electrically connected to pads for a source electrode of a driver circuit 3 placed over its corresponding main surface of the semiconductor chip 5c through a plurality of wires WB. In the present embodiment, the wires WB that connect the pad HSP of the main surface of the semiconductor chip 5a2 and the source electrode pads of the main surface of the semiconductor chip 5c are disposed so as to become substantially horizontal. The source electrode pads of the driver circuit 3 of the semiconductor chip 5c and the die pad 7a5 may be electrically connected to one another by wires WB. Since, however, the lengths of the wires WB can be shortened by electrically connecting the source electrode pad HSP of the main surface of the semiconductor chip 5a2 and the source electrode pads of the main surface of the semiconductor chip 5c through a plurality of wires WB as described above, the parasitic inductance L3 can be reduced. It is therefore possible to reduce switching losses of the high-side power MOSQH3. Thus, voltage conversion efficiency of the non-insulated DC-DC converter 1 can be improved.

Fifth Preferred Embodiment

A fifth embodiment will explain a configuration wherein lead plates each made up of a metal are used in place of the wires WA in the package 10A shown in FIG. 9.

Figure 27:
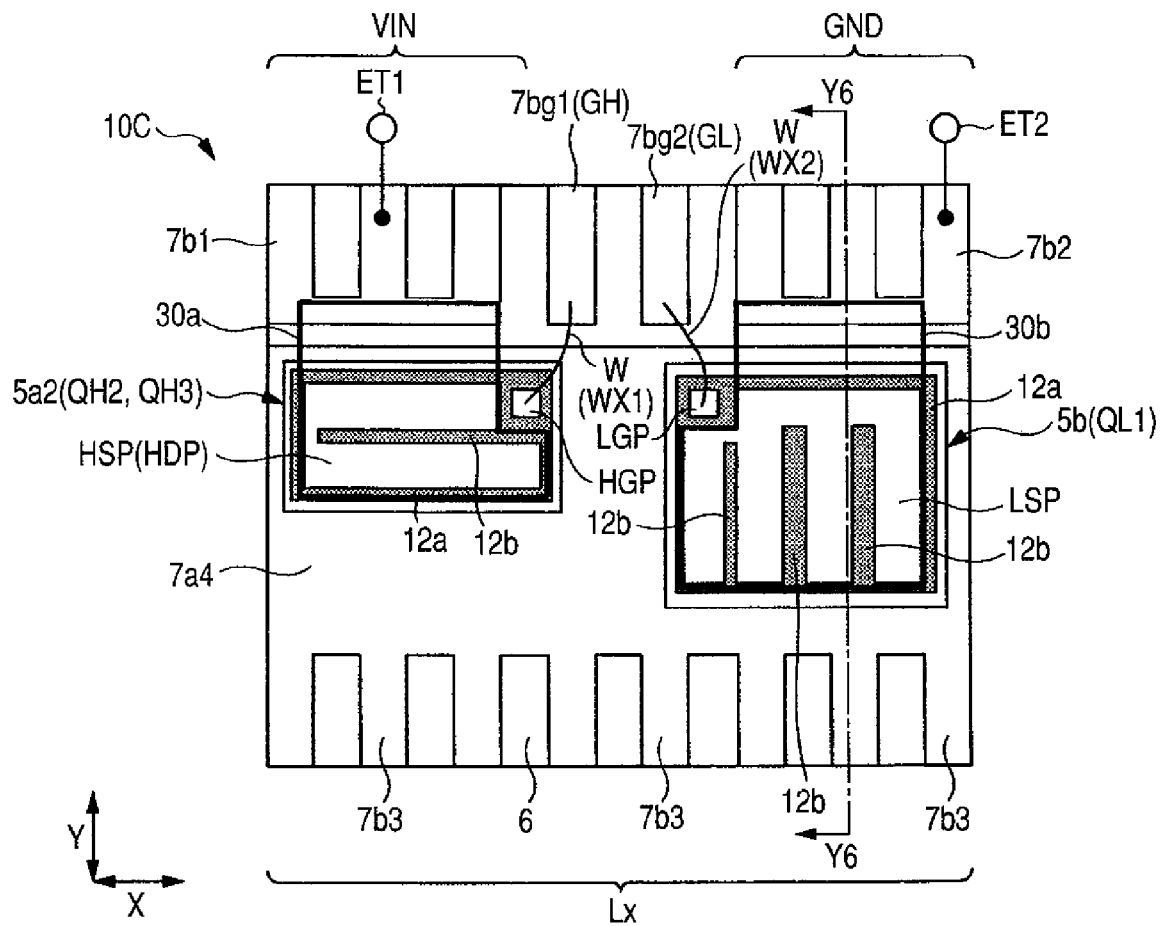
FIG. 27 is an overall plan view showing a main surface side of a package of a semiconductor device illustrative of a fifth embodiment of the present invention as seen through the interior of the package.
Figure 28:
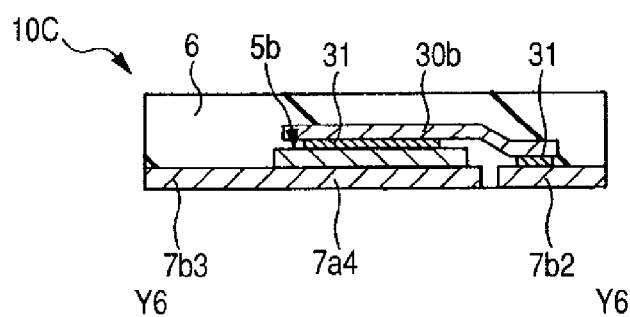
FIG. 28 is a sectional view taken along line Y6-Y6 of FIG. 27.

FIG. 27 shows an overall plan view illustrating a main surface side of a package 10C of the fifth embodiment as seen through the interior of the package 10C, and FIG. 28 shows a sectional view taken along line Y6-Y6 of FIG. 27, respectively. Incidentally, FIG. 27 shows lower semiconductor chips 5a2 and 5b as seen through the lead plates to make it easy to see the drawing. A high-side power MOS corresponding to either a p channel vertical power MOSQH2 or an n channel horizontal power MOSQH3 is formed in the semiconductor chip 5a2.

In the fifth embodiment, pads (pads HSPs for a source electrode where the p channel vertical power MOSQH2 is formed in the semiconductor chip 5a2, and pads HDPs for a drain electrode where the n channel horizontal power MOSQH3 is formed in the semiconductor chip 5a2) placed over a main surface of the semiconductor chip 5a2 formed with the high-side power MOS, and leads 7b1 for an input power supply VIN are electrically connected to one another by a lead plate 30a. Pads LSPs for a source electrode, which are placed over a main surface of the semiconductor chip 5b formed with a low-side power MOS, and leads 7b2 for a reference potential GND are electrically connected to one another by a lead plate 30b. In the present embodiment, the lead plates 30a and 30b are covered with an encapsulator 6 over their entirety.

The lead plates 30a and 30b are respectively made up of a metal high in conductivity and thermal conductivity like, for example, copper (Cu) or aluminum (Al) or the like and disposed so as to cover the majority of the main surfaces of the semiconductor chips 5a2 and 5b that serve as heat generation sources. One end of the lead plate 30a is bonded and electrically connected to the pads HSPs (or pads HDPs) through a junction layer 31. The other end of the lead plate 30a is bonded and electrically connected to the leads 7b1 through the junction layer 31. One end of the lead plate 30b is bonded and electrically connected to the pads LSPs through a junction layer 31. The other end of the lead plate 30b is bonded and electrically connected to the leads 7b2 through the junction layer 31. The junction layers 31 are made up of, for example, lead (Pb)—tin (Sn) solder or gold (Au) or the like.

A conductive resin can also be used as the junction layers 31. Pads HGP and LGP for gate electrodes and leads 7bg1 and 7bg2 are electrically connected by wires W respectively.

According to the fifth embodiment, the parasitic inductances L2 and L5 can be reduced by use of the lead plates 30a and 30b. Parasitic resistance can also be reduced as compared with the wires W. It is thus possible to further reduce switching losses and conduction losses of a non-insulated DC-DC converter 1 and to further improve voltage conversion efficiency of the non-insulated DC-DC converter 1.

Sixth Preferred Embodiment

A sixth embodiment will explain a configuration wherein lead plates are exposed onto the surface of a package.

Figure 29:
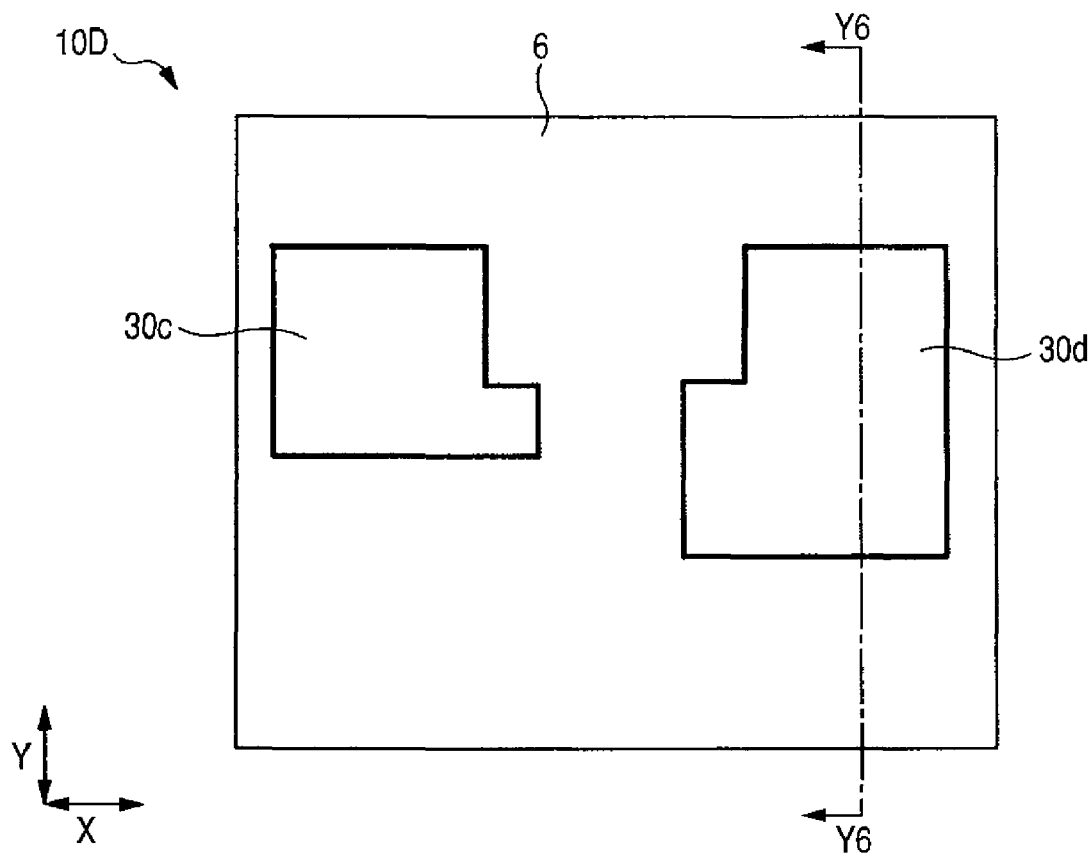
FIG. 29 is an overall plan view showing an upper surface of a package of a semiconductor device illustrating a sixth embodiment of the present invention.
Figure 30:
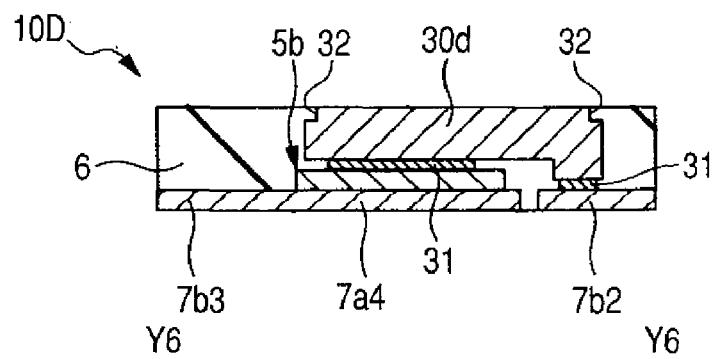
FIG. 30 is a sectional view taken along line Y6-Y6 of FIG. 29.

FIG. 29 shows an overall plan view illustrating an upper surface (corresponding to a surface opposite to a mounting surface of a package 10D where the package 10D is mounted to a printed wiring board) of the package 10D according to the sixth embodiment, and FIG. 30 shows a sectional view taken along line Y6-Y6 of FIG. 29, respectively. Incidentally, an internal plan view of the package 10D is identical to FIG. 27.

In the sixth embodiment, parts of lead plates 30c and 30d are exposed from the upper surface of the package 10D. Thus, radiation can be enhanced. Allowing the lead plates 30c and 30d to have a radiating function makes it unnecessary to add other parts for radiation. Therefore, the process of assembling a semiconductor device can be simplified as compared with the addition of the radiating parts, and the time required to assemble the semiconductor device can be shortened. Since the number of parts can be reduced, the cost of the semiconductor device can be cut down. Incidentally, the material for the lead plates 30c and 30d and their plane shapes are respectively identical to the lead plates 30a and 30b.

Depressions (chamfered portions) 32 are formed on the upper outer peripheries of the lead plates 30c and 30d. Thus, a resin for an encapsulator 6 is chamfered onto the depressions 32 of the lead plates 30c and 30d, thereby making it possible to improve the strength of bonding between the lead plates 30c and 30d and the encapsulator 6. It is therefore possible to suppress or prevent a defective condition that the lead plates 30c and 30d come off. The depressions 32 may be provided on the lower outer peripheries (on the sides nearer semiconductor chips 5a2 and 5b) of the lead plates 30c and 30d. Configurations other than these are identical to those in the first, second and fifth embodiments.

Figure 31:
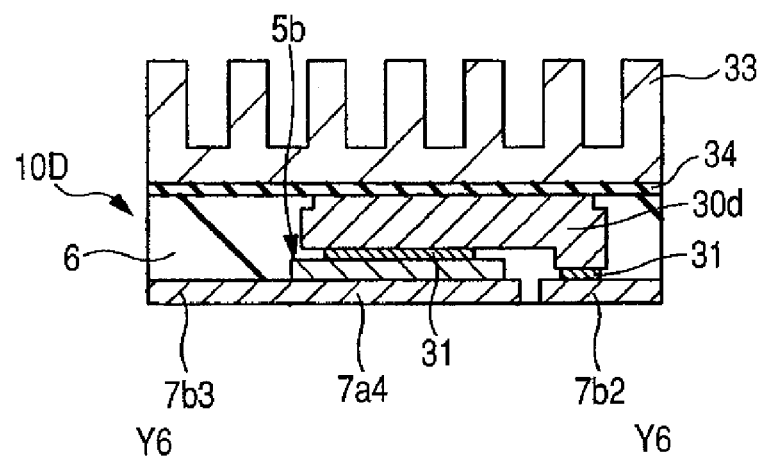
FIG. 31 is a sectional view of one example of a configuration wherein a radiating fin is bonded onto the upper surface of the package shown in FIGS. 29 and 30.

FIG. 31 shows a sectional view illustrating one example of a configuration wherein a radiating fin (heat sink) 33 is bonded onto the upper surface of the package 10D shown in FIGS. 29 and 30. The radiating fin 33 is made up of a metal like, for example, copper (Cu) or aluminum (Al) or the like and bonded to the upper surface of the package 10D and exposed surfaces of the lead plates 30c and 30d through an insulative adhesive 34 like, for example, silicon rubber or the like. A plurality of depressions and projections are provided at an upper portion of the radiating fin 33. Bonding such a radiating fin 33 thereto enables a further improvement in radiation.

Seventh Preferred Embodiment

A seventh embodiment will explain a configuration wherein an input capacitor Cin is mounted onto a package.

Figure 32:
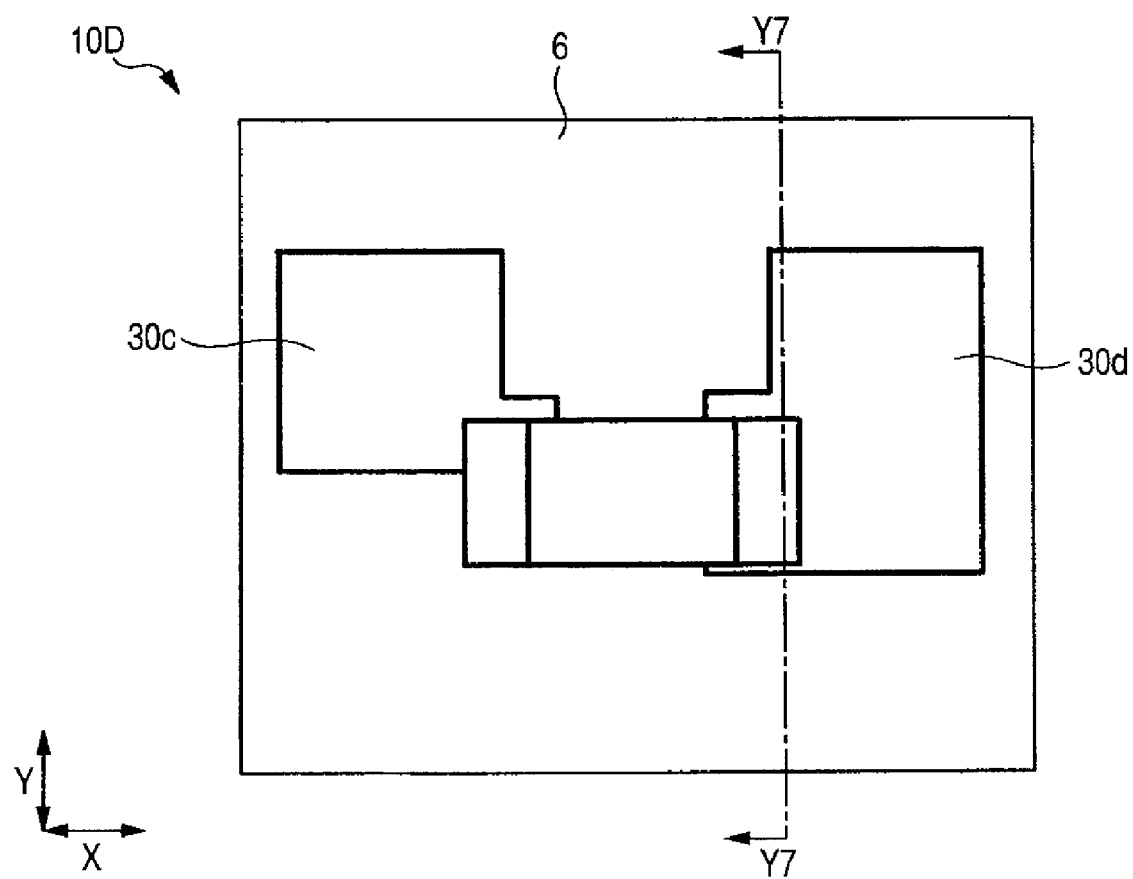
FIG. 32 is an overall plan view showing an upper surface of a package of a semiconductor device illustrating a seventh embodiment of the present invention.
Figure 33:
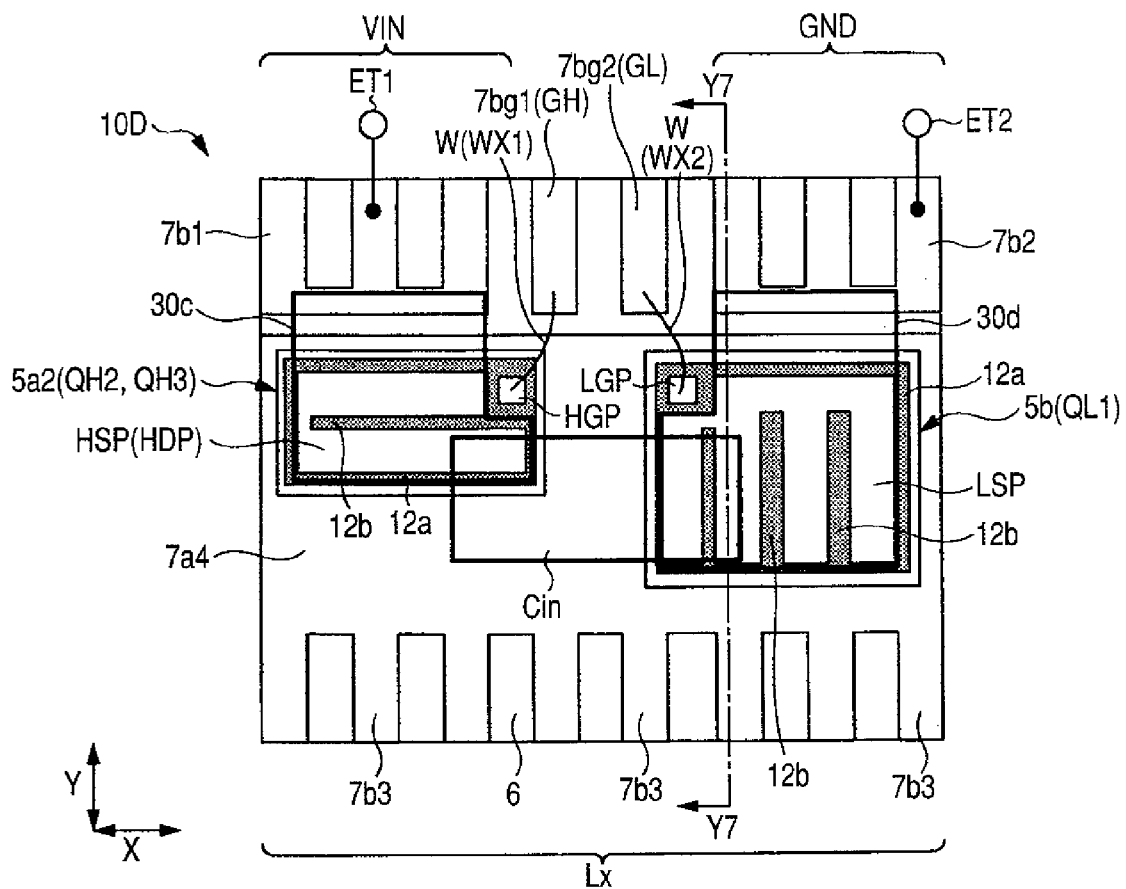
FIG. 33 is an overall plan view showing a main surface side of the package as seen through the interior of the package shown in FIG. 32.
Figure 34:
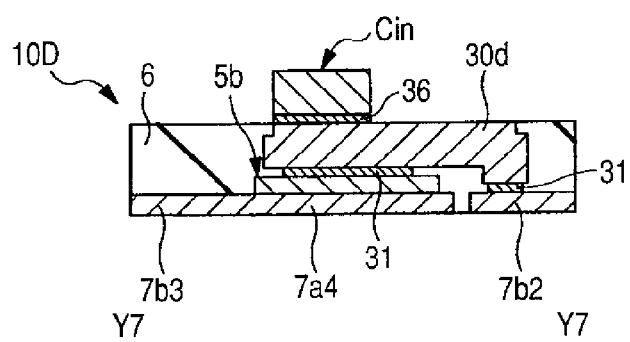
FIG. 34 is a sectional view taken along lines. Y7-Y7 of FIGS. 32 and 33.

FIG. 32 shows an overall plan view illustrating an upper surface (corresponding to a surface opposite to a mounting surface of a package 10D where the package 10D is mounted to a printed wiring board) of a package 10D of the seventh embodiment, FIG. 33 shows an overall plan view illustrating a main surface side of the package 10D as seen through the interior of the package shown in FIG. 32, and FIG. 34 shows a sectional view taken along line Y7-Y7 of FIG. 33, respectively.

In the seventh embodiment, the input capacitor Cin is directly mounted over the upper surface of the package 10D. That is, when the input capacitor Cin is seen in the plane, the input capacitor Cin is disposed in such a way that some of the input capacitor Cin are superimposed on both of the semiconductor chips 5a2 and 5b. In the configuration of the package 10D, the lead plate 30c is connected to an input power supply VIN, whereas the lead plate 30d is connected to a ground potential GND. Therefore, the input capacitor Cin can directly be mounted over upper surfaces from which the two lead plates 30c and 30d are exposed, so as to act as a bridge between the lead plates 30c and 30d in the package 10D. Since the input capacitor Cin is exposed to the outside in the seventh embodiment, this is suitable for dissipating heat generated in the input capacitor Cin per se.

One of a pair of electrodes 35a of the input capacitor Cin is bonded and electrically connected to the lead plate 30c via a junction layer 36 interposed therebetween, whereas the other thereof is bonded and electrically connected to the lead plate 30d via the junction layer 36 interposed therebetween. With the existence of the lead plates 30c and 30d, flatness and sufficient connecting areas can be ensured for connecting surfaces of the pair of electrodes 35a of the input capacitor Cin. Therefore, connection ease and reliability of the input capacitor Cin can be improved.

The junction layer 36 that bonds the input capacitor Cin onto the lead plates 30c and 30d, is constituted of, for example, lead (Pb)—tin (Sn) solder or gold (Au) or the like in a manner similar to a junction layer 31 that bonds the lead plates 30c and 30d to source electrodes HSPs (or drain electrodes HDPs) and leads 7b1 and 7b2. Upon the fabrication of the package 10D, however, the input capacitor Cin is mounted after the lead plates 30c and 30d are bonded onto the source electrodes HSPs (or drain electrode HDPs) and leads 7b1 and 7b2 by the junction layer 31. Therefore, the melting point of the junction layer 36 for bonding the input capacitor Cin should be kept lower than that of the junction layer 31 for bonding the lead plates 30c and 30d. Thus, for example, a gold bump having a melting point ranging from 400° C. to 450° C., or high-temperature solder (lead—tin solder) having a melting point ranging from 350° C. to 400° C. is used for the junction layer 31 used for the bonding of the lead plates 30c and 30d. For example, high-temperature solder (lead—tin solder), which has a melting point ranging from 350° C. to 400° C. and is lower than the melting point of the junction layer 36, is used for the junction layer 36 used for the bonding of the input capacitor Cin.

Figure 35:
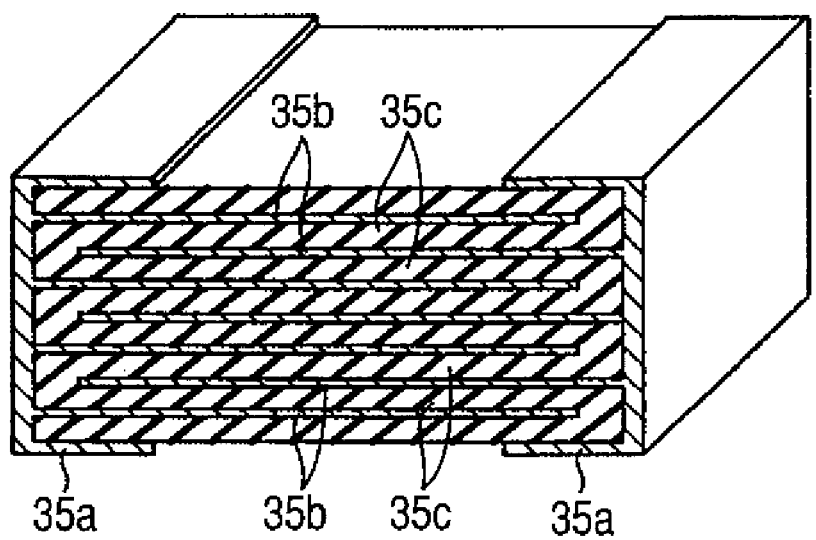
FIG. 35 is a partly broken perspective view of one example of an input capacitor.

Incidentally, FIG. 35 shows a partly broken perspective view illustrative of one example of the input capacitor Cin. The input capacitor Ci includes a pair of electrodes 35a respectively disposed at both ends thereof, and a plurality of internal electrodes 35b, and dielectrics 35c interposed among the plural internal electrodes 35b. The internal electrodes 35b are alternately disposed in such a manner that ones connected to one of the pair of electrodes 35a and ones connected to the other thereof are opposite to one another. The pair of electrodes 35a has a configuration wherein a plated layer made of, for example, nickel and a plated layer made of, for example, tin are sequentially applied onto the surface of a bedding or base electrode made of, for example, silver. The internal electrodes 35b comprise, for example, palladium (Pd), copper or nickel. The dielectrics 35c are made up of, for example, titanium oxide, calcium zirconate or barium titanate.

Thus, in the seventh embodiment, the input capacitor Cin can directly be mounted onto the upper surface of the package 10D. That is, the input capacitor Cin can be disposed in a near position directly above each of the semiconductor chips 5a2 and 5b. Therefore, the parasitic inductances L1 and L6 can be reduced and the efficiency of power supply can be improved. That is, since all the parasitic inductances L1 through L6 can be reduced in the package 10D of the seventh embodiment, switching losses of the non-insulated DC-DC converter 1 can be reduced and an improvement in the efficiency of a system is enabled.

A user is able to select, according to the configuration of the entire system of the non-insulated DC-DC converter 1, a case in which the radiating fin 33 is mounted over the upper surface of the package 10D as shown in FIG. 31 illustrative of the sixth embodiment and a case in which the input capacitor Cin is mounted over the upper surface of the package 10D as described in the seventh embodiment. When it is desired to reduce the on resistance of the system, for example, the radiating fin 33 may preferably be mounted. On the other hand, when it is desired to reduce the switching losses of the system, for example, the input capacitor Cin may preferably be mounted.

Eighth Preferred Embodiment

An eighth embodiment will explain a configuration wherein the input capacitor is accommodated in a package.

Figure 36:
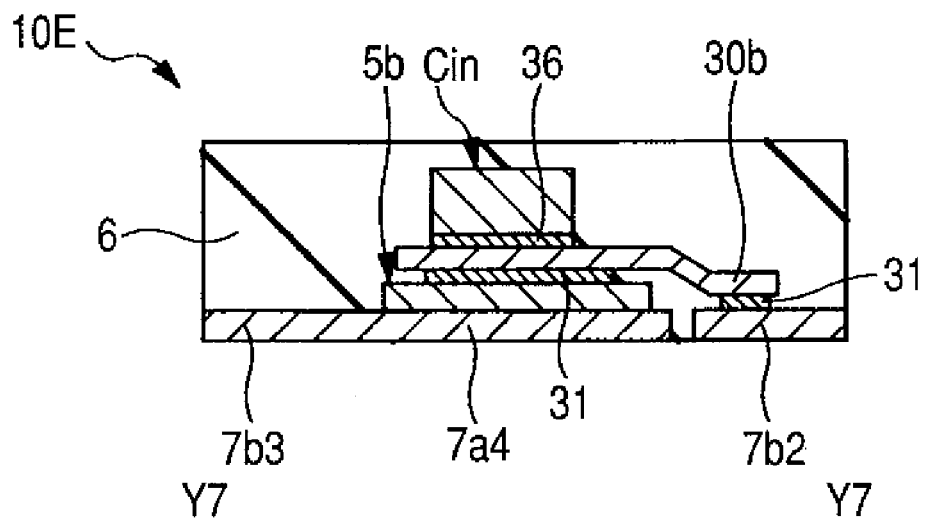
FIG. 36 is a sectional view of a spot corresponding to line Y7-Y7 of FIG. 32 in a package of a semiconductor device showing an eighth embodiment of the present invention.

FIG. 36 shows a sectional view illustrative of a spot corresponding to line Y7-Y7 of FIG. 32 in a package 10E of the eighth embodiment. Incidentally, a plan view of the package 10E is identical to FIG. 27.

While the input capacitor Cin is connected to lead plates 30a and 30b through a junction layer 36 interposed therebetween in the eighth embodiment in a manner similar to the seventh embodiment, the input capacitor Cin is accommodated in an encapsulator 6.

The eighth embodiment is capable of obtaining the following advantageous effects in addition to the effects obtained in the seventh embodiment. That is, the eighth embodiment can obtain the advantages that it is not necessary for a user to mount the input capacitor Cin, and extra efforts are not taken upon packaging. Since such a configuration as not to expose the lead plates 30a and 30b is taken, the fabrication of the package 10E is easy.

Ninth Preferred Embodiment

A ninth embodiment will explain a configuration wherein the wires are replaced by lead plates in the third embodiment.

Figure 37:
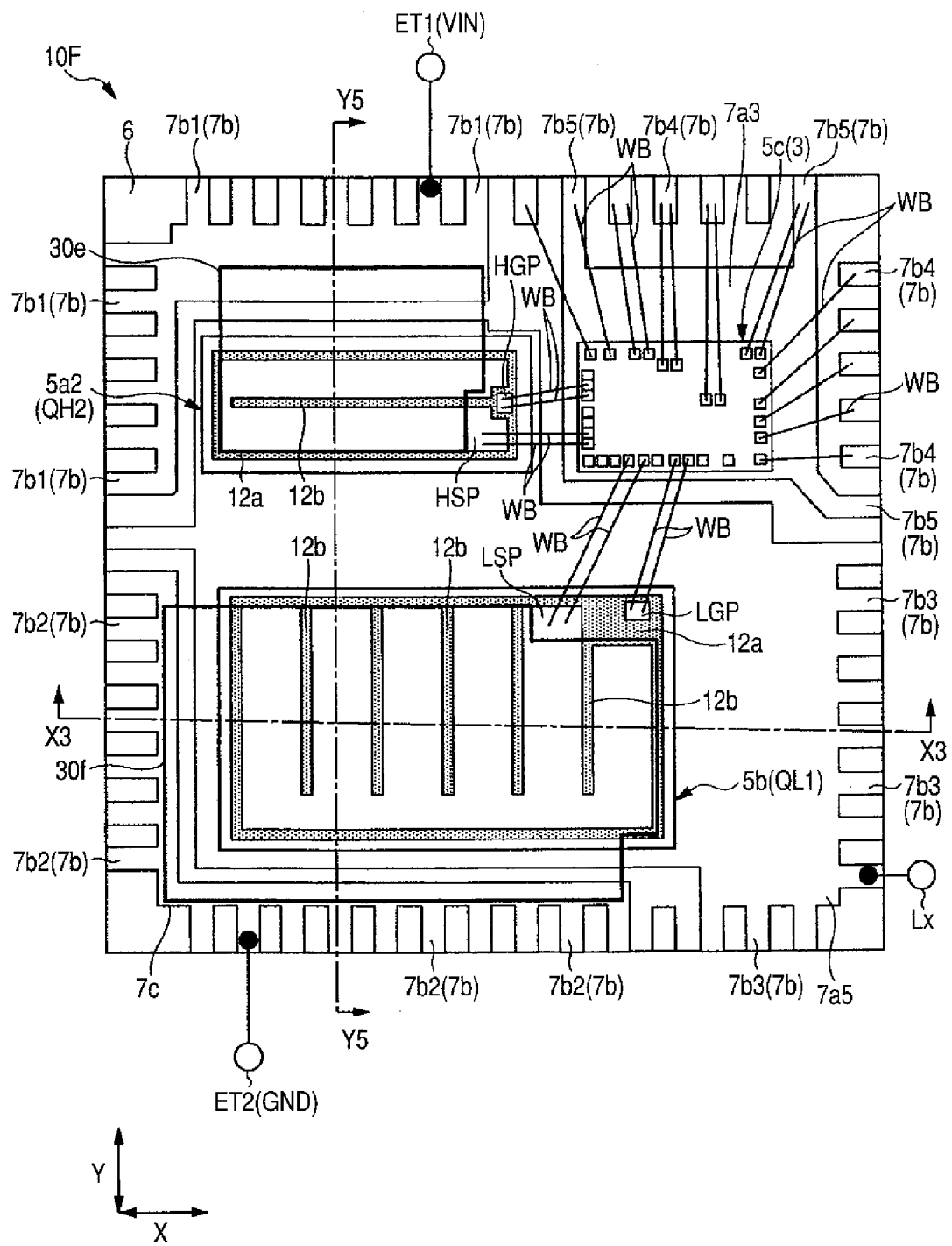
FIG. 37 is an overall plan view showing a main surface side of a package of a semiconductor device illustrating a ninth embodiment of the present invention as seen through the interior of the package.
Figure 38:
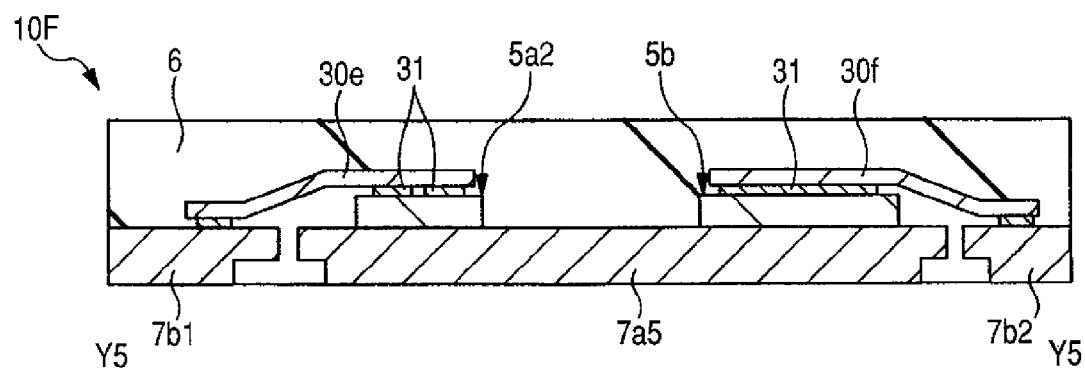
FIG. 38 is a sectional view taken along line Y5-Y5 of FIG. 37.
Figure 39:
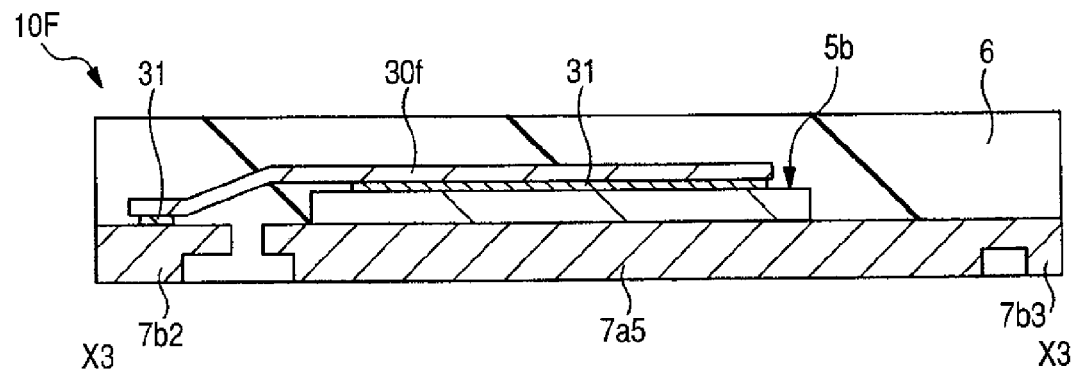
FIG. 39 is a sectional view taken along line X3-X3 of FIG. 37.

FIG. 37 shows an overall plan view illustrative of a main surface side of a package 10F of the ninth embodiment as seen through the interior of the package 10F, FIG. 38 shows a sectional view taken along line Y5-Y5 of FIG. 37, and FIG. 39 shows a sectional view taken along line X3-X3 of FIG. 37, respectively. Incidentally, FIG. 37 shows lower semiconductor chips 5a2 and 5b as seen through the lead plates to make it easy to see the drawing. A p channel vertical power MOSQH2 is formed in the semiconductor chip 5a2.

In the ninth embodiment, pads HSPs placed over a main surface of the semiconductor chip 5a2 formed with a high-side power MOS, and leads 7b1 for an input power supply VIN are electrically connected to one another by a lead plate 30e. Pads LSPs for a source electrode, which are placed over a main surface of the semiconductor chip 5b formed with a low-side power MOS, and leads 7b2 for a reference potential GND are electrically connected by a lead plate 30f. The material for each of the lead plates 30e and 30f is identical to the leads 30a through 30d. The lead plates 30e and 30f are disposed so as to cover the majority of the main surfaces of the semiconductor chips 5a2 and 5b that serve as heat generation sources in a manner similar to the leads 30a through 30d. In the present embodiment, the lead plates 30e and 3 of are covered with an encapsulator 6 over their entirety.

According to the ninth embodiment, the parasitic inductances L2 and L5 can be reduced by use of the lead plates 30e and 30f. Parasitic resistance can also be reduced as compared with the wires W. It is thus possible to further reduce switching losses and conduction losses of a non-insulated DC-DC converter 1 and to further improve voltage conversion efficiency of the non-insulated DC-DC converter 1.

Tenth Preferred Embodiment

A tenth embodiment will explain a configuration wherein the lead plates of the ninth embodiment are exposed onto the surface of a package.

Figure 40:
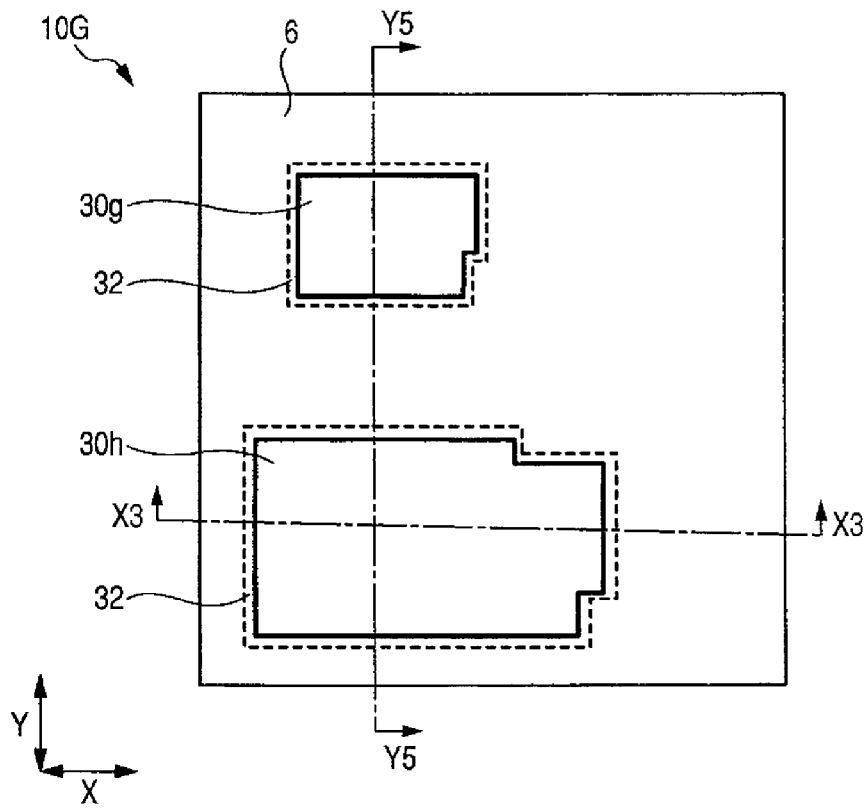
FIG. 40 is an overall plan view showing an upper surface of a package of a semiconductor device illustrating a tenth embodiment of the present invention.
Figure 41:
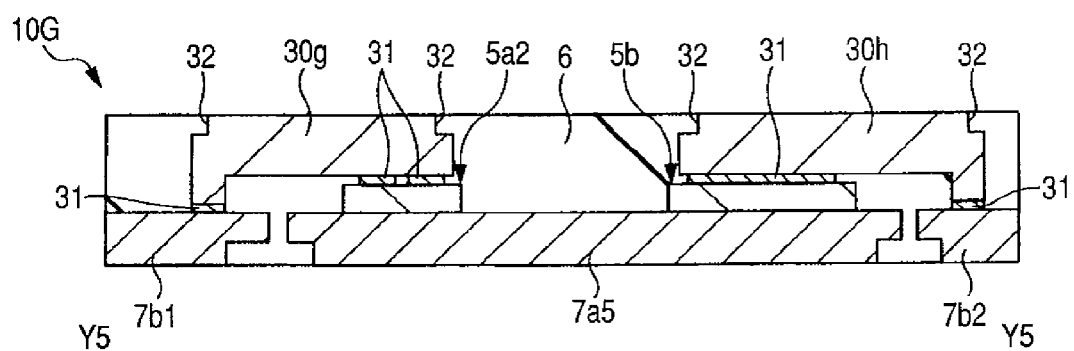
FIG. 41 is a sectional view taken along line Y5-Y5 of FIG. 40.
Figure 42:
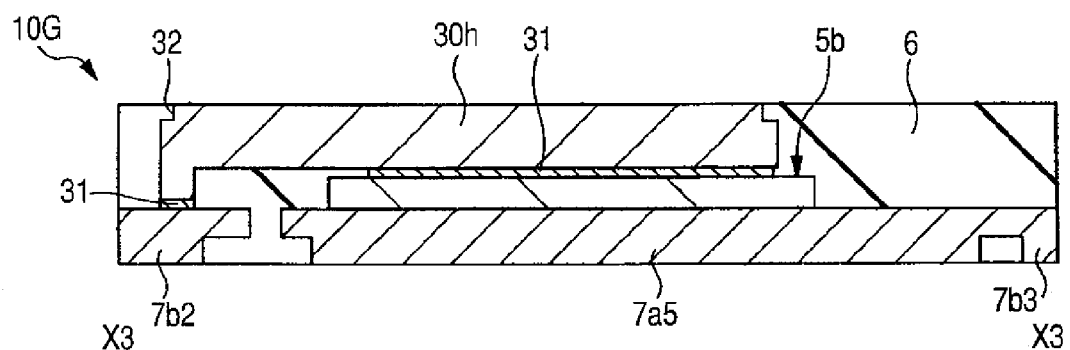
FIG. 42 is a sectional view taken along line X3-X3 of FIG. 40.

FIG. 40 shows an overall plan view illustrating an upper surface (corresponding to a surface opposite to a mounting surface of a package 10G where the package 10G is mounted to a printed wiring board) of the package 10G according to the tenth embodiment, FIG. 41 shows a sectional view taken along line Y5-Y5 of FIG. 40, and FIG. 42 shows a sectional view taken along line X3-X3 of FIG. 40, respectively. Incidentally, an internal plan view of the package 10G is identical to FIG. 37.

In the tenth embodiment, parts of lead plates 30g and 30h are exposed from the upper surface of the package 10G. Thus, radiation can be enhanced. Allowing the lead plates 30g and 30h to have a radiating function makes it unnecessary to add other parts for radiation. Therefore, the process of assembling a semiconductor device can be simplified as compared with the addition of the radiating parts, and the time required to assemble the semiconductor device can be shortened. Since the number of parts can be reduced, the cost of the semiconductor device can be cut down. Incidentally, the material for the lead plates 30g and 30h and their plane shapes are respectively identical to the lead plates 30e and 30f.

Depressions (chamfered portions) 32 are provided on the upper outer peripheries of the lead plates 30g and 30h in a manner similar to the sixth embodiment, thereby making it possible to improve the strength of bonding between the lead plates 30g and 30h and an encapsulator 6. It is therefore possible to suppress or prevent a defective condition that the lead plates 30g and 30h come off. The depressions 32 may be provided on the lower outer peripheries (on the sides nearer semiconductor chips 5a2 and 5b) of the lead plates 30g and 30h. Configurations other than these are identical to those in the third and ninth embodiments. Incidentally, the structure of the tenth embodiment can be applied even to the case in which a high-side power MOS of the semiconductor chip 5a2 is formed of an n channel horizontal power MOS. In such a case, the lead plate 30g is connected to drain electrode pads HDPs disposed over a main surface of the semiconductor chip 5a2 via a junction layer 31.

Figure 43:
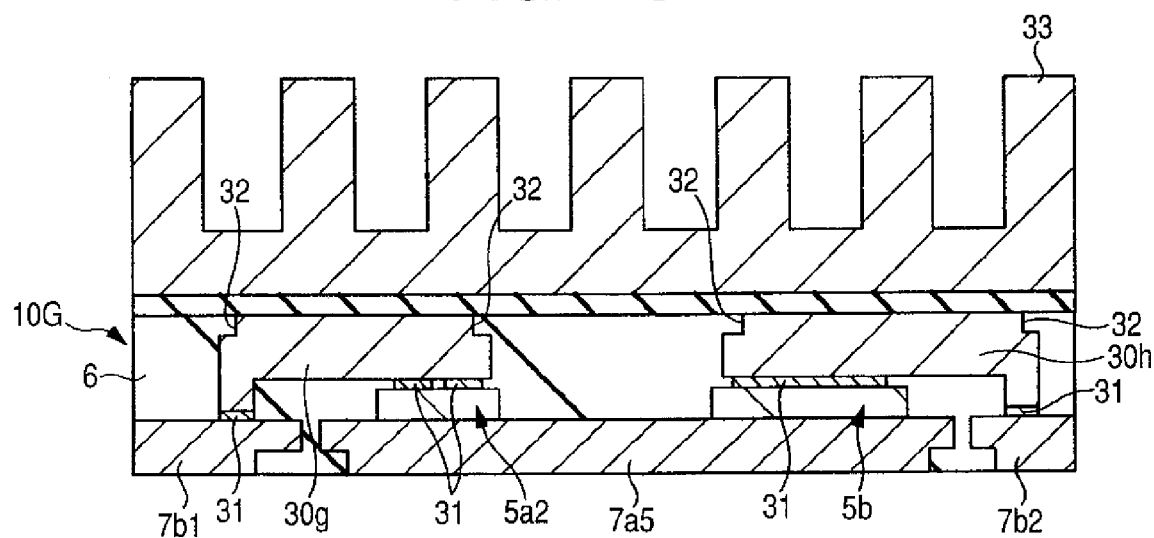
FIG. 43 is a sectional view showing one example of a configuration wherein a radiating fin is bonded onto the upper surface of the package shown in FIGS. 40 through 42.

FIG. 43 shows a sectional view illustrating one example of a configuration wherein a radiating fin (heat sink) 33 is bonded onto the upper surface of the package 10G shown in FIGS. 40 through 42 via an adhesive 34 interposed therebetween. Bonding such a radiating fin 33 thereto enables further enhancement of radiation.

Eleventh Preferred Embodiment

An eleventh embodiment will explain a configuration wherein an input capacitor Cin is mounted onto the package 10G of the tenth embodiment.

Figure 44:
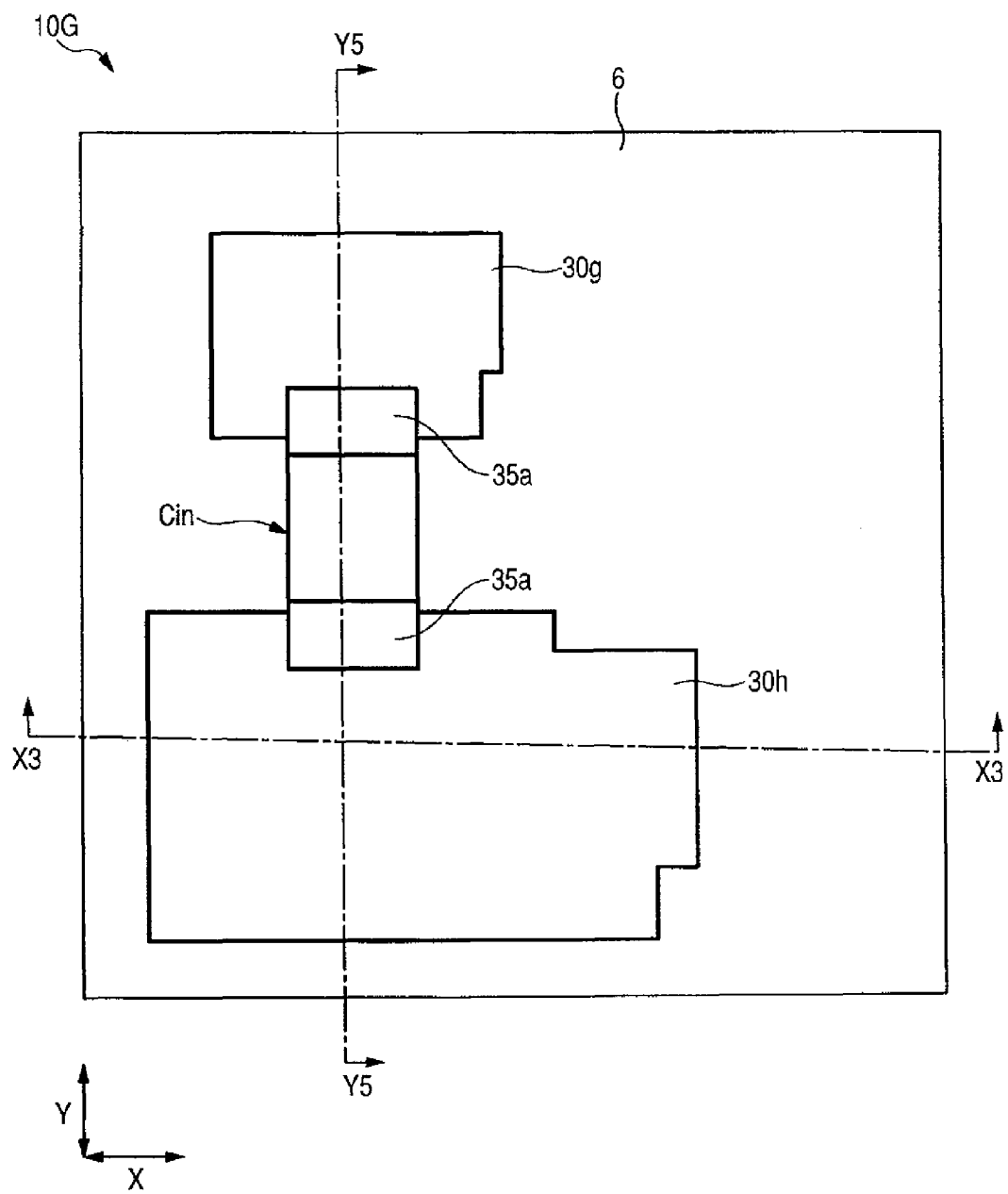
FIG. 44 is an overall plan view showing an upper surface of a package of a semiconductor device illustrative of an eleventh embodiment of the present invention.
Figure 45:
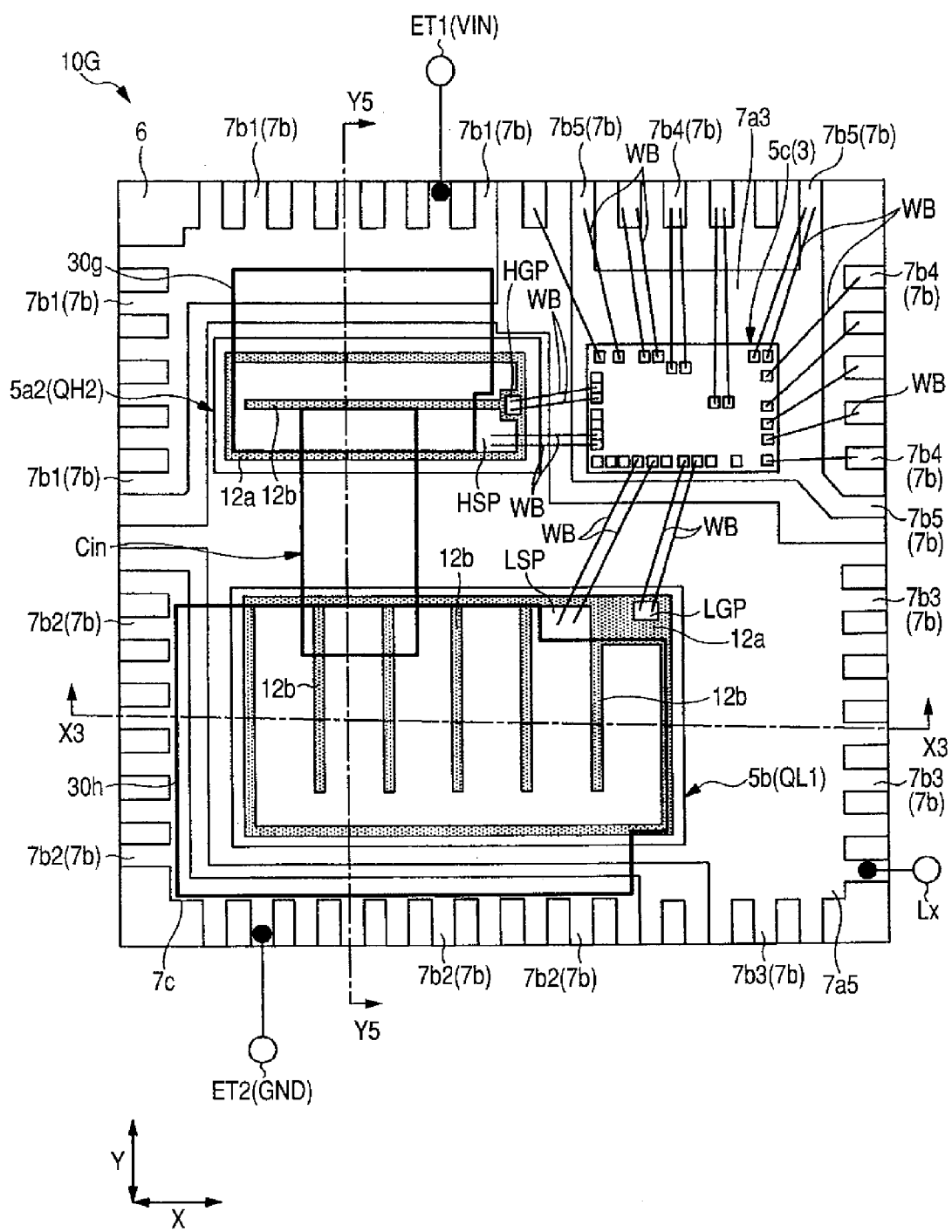
FIG. 45 is an overall plan view illustrating a main surface side of the package as seen through the interior of the package shown in FIG. 44.
Figure 46:
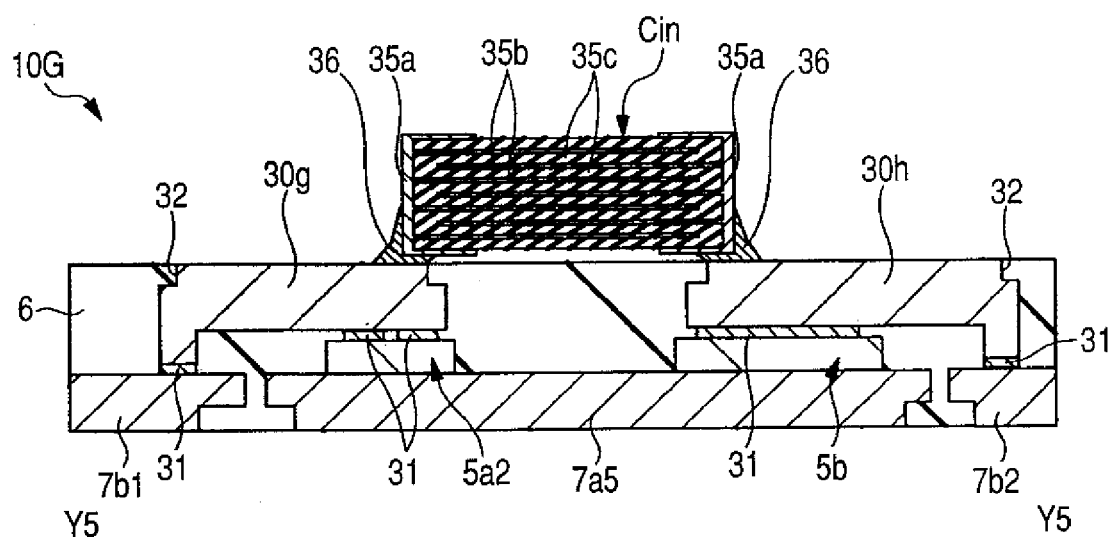
FIG. 46 is a sectional view taken along lines Y5-Y5 of FIGS. 44 and 45.

FIG. 44 shows an overall plan view illustrating an upper surface (corresponding to a surface opposite to a mounting surface of the package 10G where the package 10G is mounted to a printed wiring board) of the package 10G of the eleventh embodiment, FIG. 45 shows an overall plan view illustrating a main surface side of the package 10G as seen through the interior of the package shown in FIG. 44, and FIG. 46 shows a sectional view taken along line Y5-Y5 of each of FIGS. 44 and 45, respectively. Incidentally, a sectional view taken along line X3-X3 of each of FIGS. 44 and 45 is identical to FIG. 42.

In the eleventh embodiment, the input capacitor Cin is directly mounted over the upper surface of the package 10G in a manner similar to the seventh embodiment. That is, when the input capacitor Cin is seen in the plane, the input capacitor Cin is disposed in such a way that some of the input capacitor Cin are superimposed on both of semiconductor chips 5a2 and 5b. In this configuration, a lead plate 30g is connected to an input power supply VIN, whereas a lead plate 30h is connected to a ground potential GND. Therefore, the input capacitor Cin can directly be mounted over upper surfaces from which the two lead plates 30g and 30h are exposed, so as to act as a bridge between the lead plates 30g and 30h in the package 10G. Since the input capacitor Cin is exposed to the outside even in the eleventh embodiment, this is suitable for dissipating heat generated in the input capacitor Cin per se.

One of a pair of electrodes 35a of the input capacitor Cin is bonded and electrically connected to the lead plate 30g via a junction layer 36 interposed therebetween, whereas the other thereof is bonded and electrically connected to the lead plate 30h via the junction layer 36 interposed therebetween. With the existence of the lead plates 30g and 30h, flatness and sufficient connecting areas can be ensured for connecting surfaces of the pair of electrodes 35a of the input capacitor Cin. Therefore, connection ease and reliability of the input capacitor Cin can be improved. Incidentally, the material for the junction layers 31 and 36 is identical to one described in the seventh embodiment. The configuration of the input capacitor Cin is also identical to one described in FIG. 35.

Thus, in the eleventh embodiment, the input capacitor Cin can directly be mounted onto the upper surface of the package 10G. The input capacitor Cin can be disposed in a near position directly above each of the semiconductor chips 5a2 and 5b. Therefore, the parasitic inductances L1 and L6 can be reduced and the efficiency of power supply can be improved. That is, since all the parasitic inductances L1 through L6 can be reduced in the configuration having the three semiconductor chips 5a2, 5b and 5c in the package 10G of the eleventh embodiment, switching losses of a non-insulated DC-DC converter 1 can be reduced and an improvement in the efficiency of a system is made possible.

In a manner similar to the case described in the seventh embodiment, a user is able to select, according to the configuration of the entire system of the non-insulated DC-DC converter 1, a case in which the radiating fin 33 is mounted over the upper surface of the package 10G as shown in FIG. 43 illustrative of the tenth embodiment and a case in which the input capacitor Cin is mounted over the upper surface of the package 10G as described in the eleventh embodiment. When it is desired to reduce the on resistance of the system, for example, the radiating fin 33 may preferably be mounted. On the other hand, when it is desired to reduce the switching losses of the system, for example, the input capacitor Cin may preferably be mounted.

Figure 47:
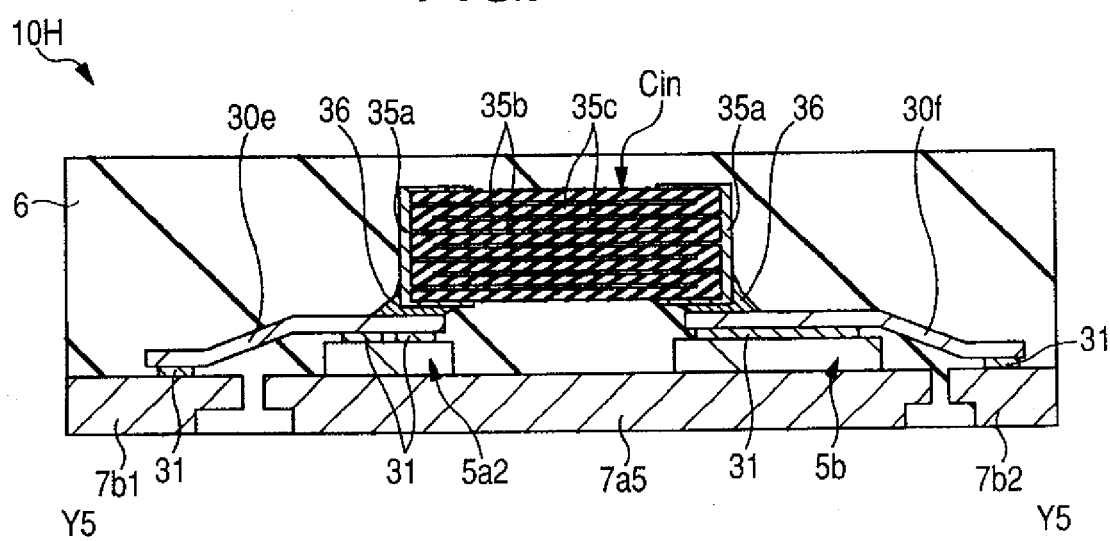
FIG. 47 shows one example of a configuration of a package in which an input capacitor is contained therein, and is a sectional view of a spot corresponding to each of lines Y5-Y5 of FIGS. 44 and 45.

FIG. 47 is one example of a configuration of a package 10H in which an input capacitor Cin is contained therein, and shows a sectional view illustrative of a spot corresponding to line Y5-Y5 of each of FIGS. 44 and 45. A plan view of the package 10H is identical to FIGS. 44 and 45. While the input capacitor Cin is connected to lead plates 30e and 30f through a junction layer 36 interposed therebetween in the present embodiment in a manner similar to FIGS. 44 and 45, the input capacitor Cin is accommodated in an encapsulator 6. In this case, the present embodiment can obtain the advantages that it is not necessary for a user to mount the input capacitor Cin, and extra efforts are not taken upon packaging. Since such a configuration as not to expose the lead plates 30e and 30f is taken, the fabrication of the package 10H is easy.

Figure 48:
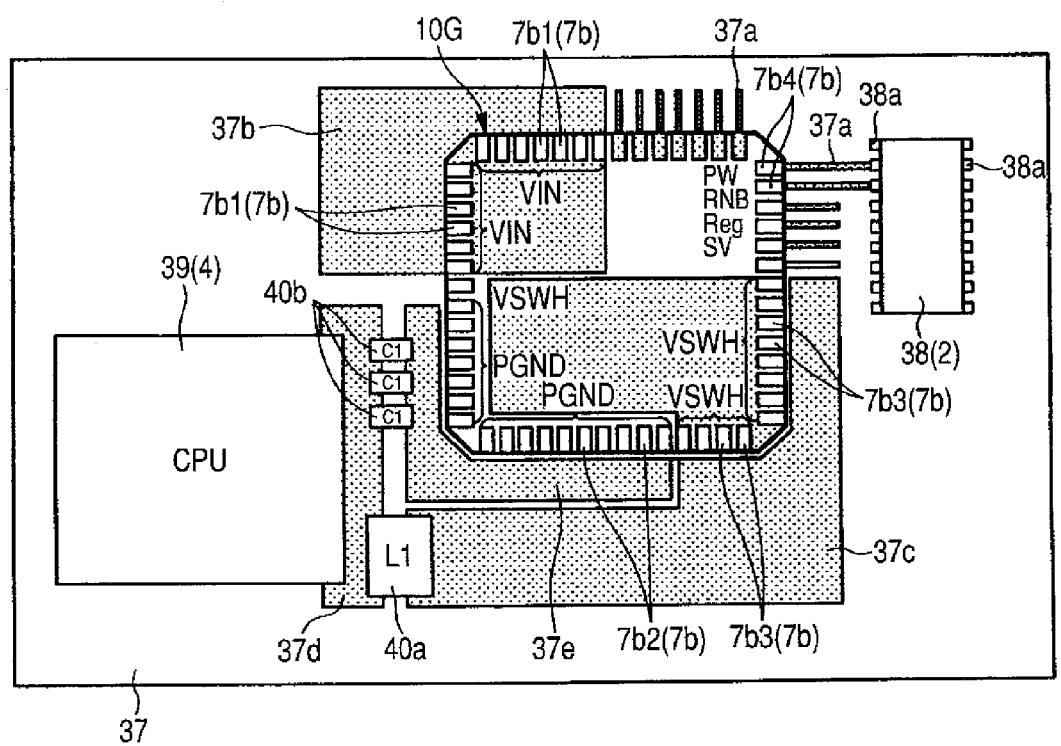
FIG. 48 is a plan view showing an example of a mounted state of the package or the like of the semiconductor device showing the eleventh embodiment of the present invention.
Figure 49:
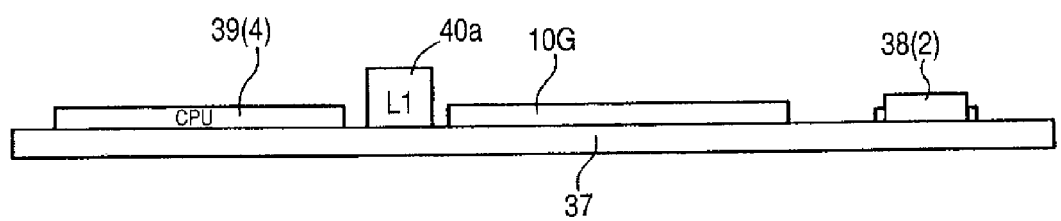
FIG. 49 is a side view of the package shown in FIG. 48.

Next, FIG. 48 shows a plan view illustrative of one example of a mounted state of the package 10G or the like, and FIG. 49 shows a side view of the package 10G or the like shown in FIG. 48, respectively. Incidentally, FIG. 48 is shown as seen through the package 10G in such a way that the manner of wiring of a wiring board 37 is understood.

The wiring board 37 is constituted of, for example, a printed wiring board. The packages 10G, 38 and 39 and chip parts 40a and 40b are mounted over its main surface. The control circuit 2 is formed in the package 38, and the load circuit 4 is formed in the package 39. The coil L is formed in the chip part 40a, and the output capacitor Cout is formed in each chip part 40b. Leads 38a of the package 38 are electrically connected to their corresponding leads 7b (7b4) of the package 10G through wirings 37a of the wiring board 37. Leads 7b1 of the package 10G are electrically connected to a wiring 37b of the wiring board 37. Output leads (output terminals) 7b3 of the package 10G are electrically connected to one end of a coil L of the chip part 40a through a wiring (output wiring) 37c of the wiring board 37. The other end of the coil L of the chip part 40a is electrically connected to the load circuit 4 through a wiring (output wiring) 37d of the wiring board 37. Leads 7b2 for a reference potential GND, of the package 10G are electrically connected to one ends of the output capacitors Cout of the plural chip parts 40b through a wiring 37e of the wiring board 37. The other ends of the output capacitors Cout of the chip parts 40b are electrically connected to the load circuit 4 through the wiring 37d of the wiring board 37.

Figure 50:
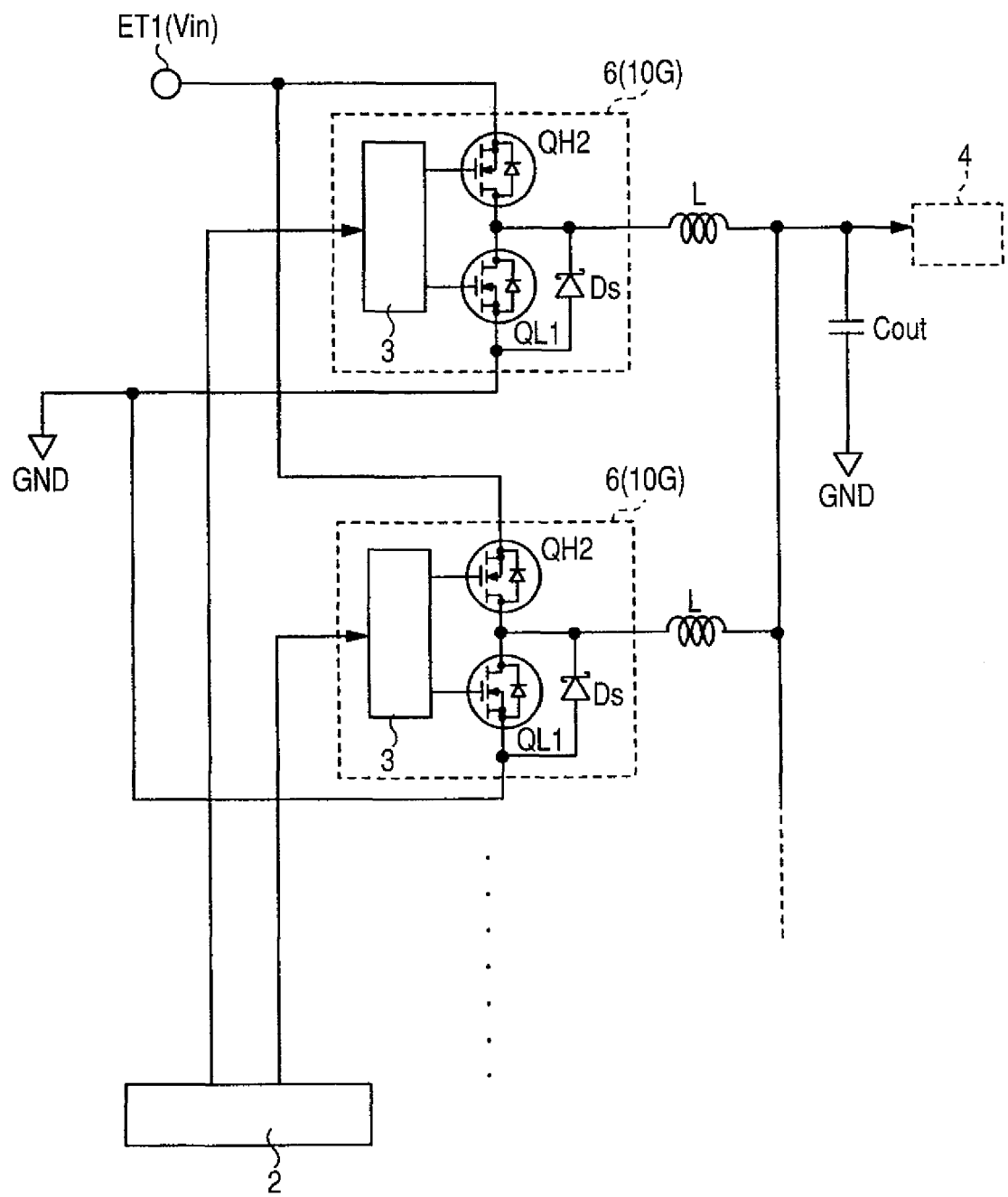
FIG. 50 is an explanatory view showing an example of a circuit system configuration of a non-insulated DC-DC converter containing the package of the semiconductor device showing the eleventh embodiment of the present invention.

Next, FIG. 50 shows one example of a circuit system configuration of the non-insulated DC-DC converter 1 containing the package 10G of the eleventh embodiment. In the circuit system, a plurality of packages 10G are connected in parallel with one load circuit 4. An input power supply potential Vin, a reference potential GND and a control circuit 2 are shared among the plural packages 10G. When such a configuration that power MOSQH2 and MOSQL1 and a driver circuit 3 are respectively packaged in discrete form is taken in such a circuit system, miniaturization of the entire system is impaired. On the other hand, since the power MOSQH2 and MOSQL1 and the driver circuit 3 are accommodated in the same package 10G in the eleventh embodiment, the entire system can be reduced in size. Incidentally, symbol Ds indicates the SBD referred to above.

Figure 51:
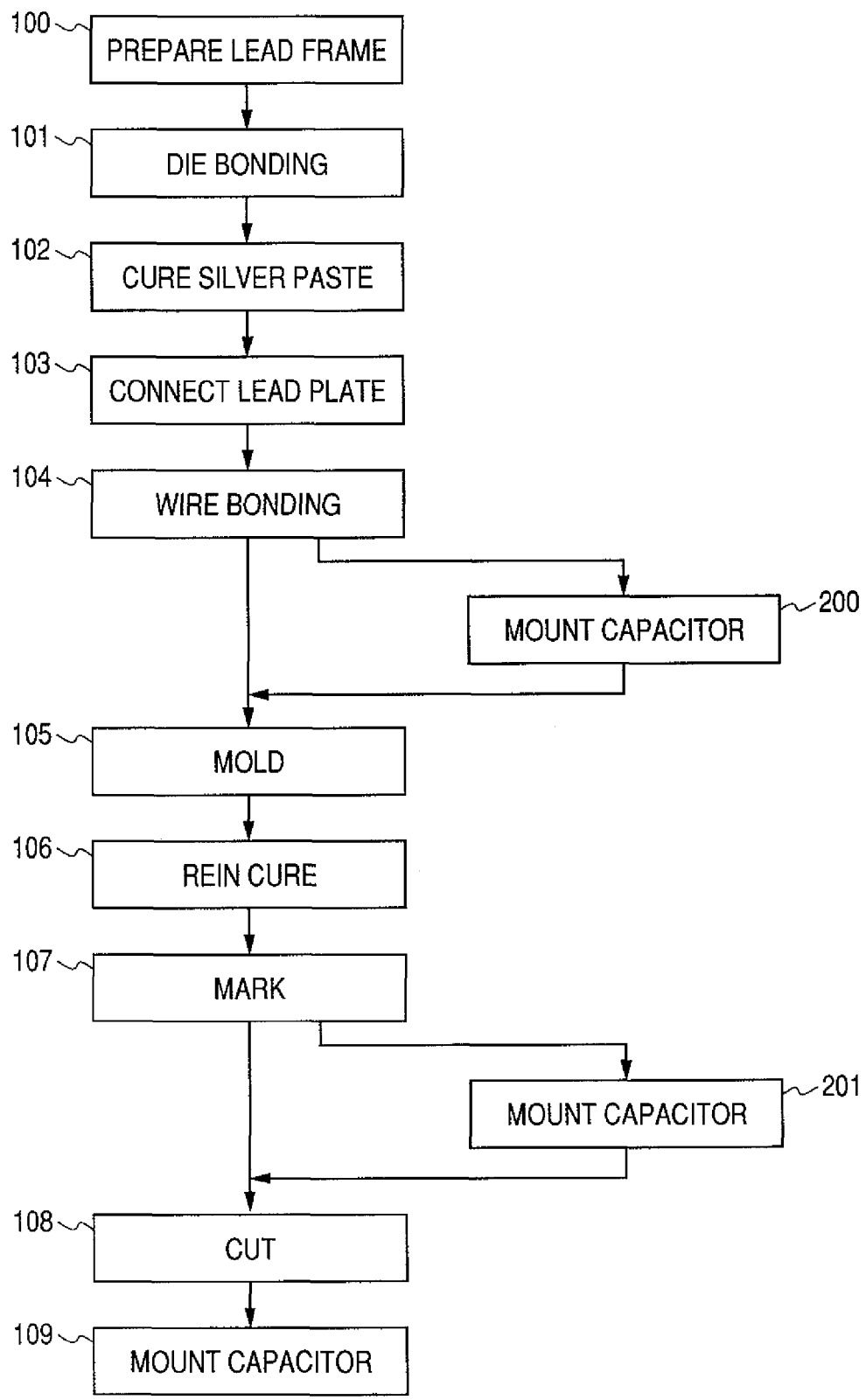
FIG. 51 is a flow diagram showing a process for assembling the semiconductor device showing the eleventh embodiment of the present invention.

One example of a method for assembling the package according to the present embodiment will next be explained using an assembly flow diagram shown in FIG. 51.

Figure 52:
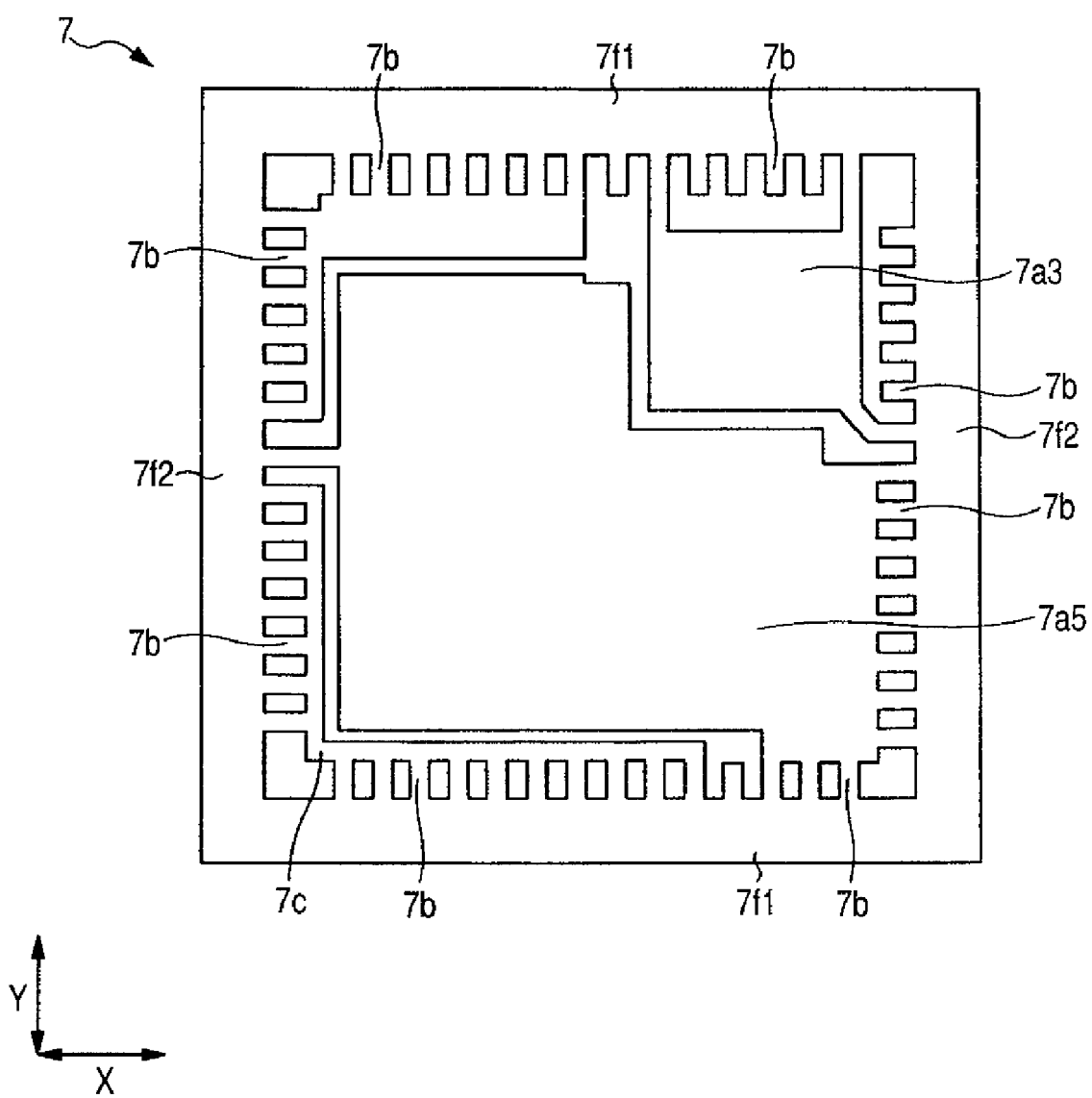
FIG. 52 is a plan view showing a main surface of each unit area of a lead frame in the assembly process of the semiconductor device showing the eleventh embodiment of the present invention.

A lead frame and die bond paste are first prepared (Step 100). FIG. 52 shows one example of a fragmentary plan view illustrative of unit regions or areas of the lead frame 7. FIG. 52 shows a main surface (semiconductor chip mounting surface) of the lead frame 7. The lead frame 7 has two frame-body sections 7f1 extending along the horizontal direction (first direction X) of FIG. 52, a frame-body section 7f2 extending in the direction (second direction Y) orthogonal to the frame-body sections 7f1 so as to act as a bridge between the two frame-body sections 7f1, a plurality of leads 7b extending from the inner peripheries of the frame-body sections 7f1 and 7f2 to the centers of the unit areas, and two die pads 7a3 and 7a5 and an L-shaped wiring section 7c formed integrally with the plural leads 7b and supported by the frame-body sections 7f1 and 7f2 through the leads 7b. Half etching areas are formed on the outer peripheries on the back surface sides of the leads 7b, die pads 7a3 and 7a5 and wiring section 7c and made thinner than other portions. Incidentally, for instance, silver (Ag) paste was used as the die bond paste.

Figure 53:
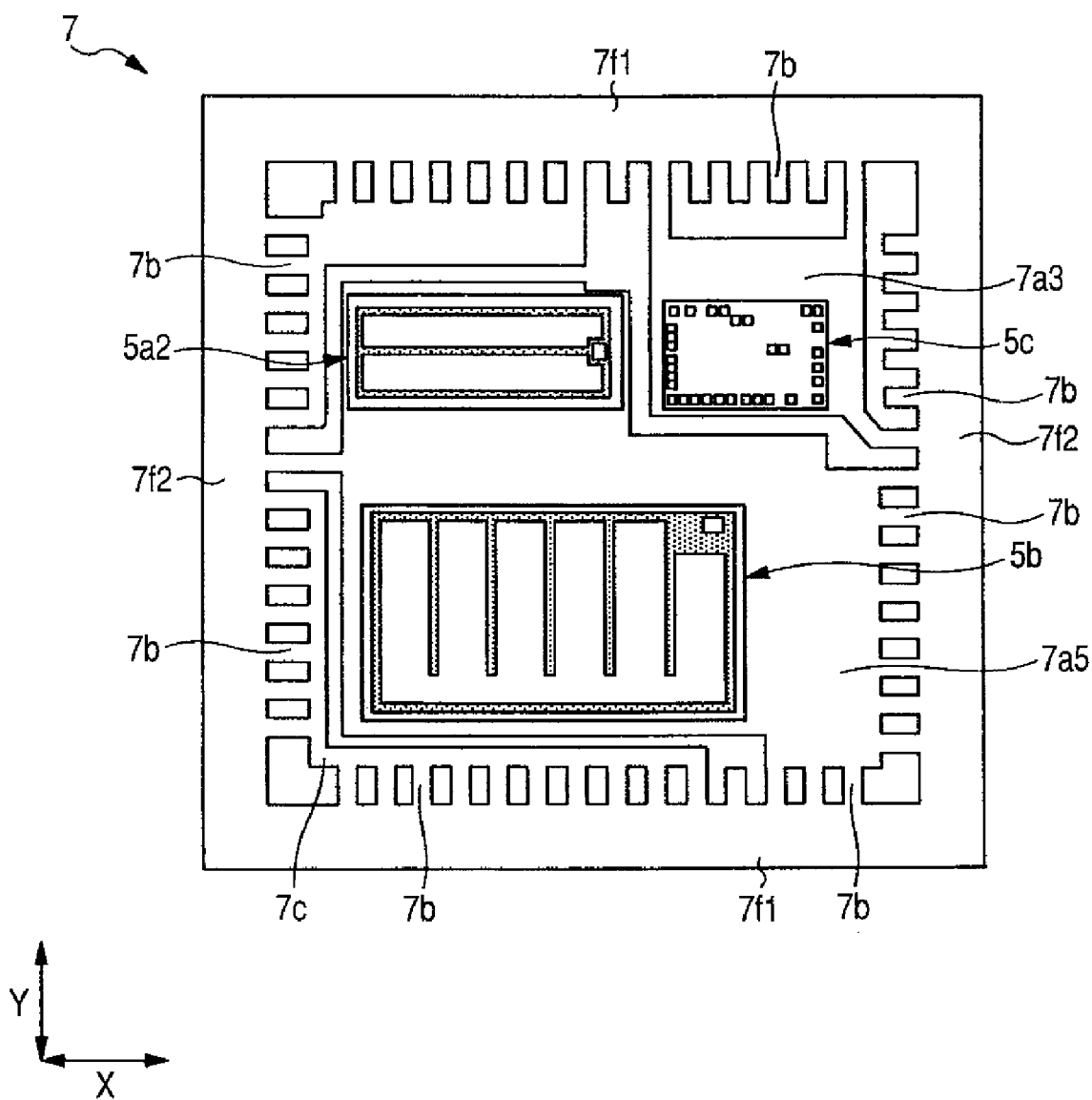
FIG. 53 is a plan view showing the main surface of the lead frame subsequent to the mounting of a semiconductor chip on each die pad of the lead frame shown in FIG. 52.

Subsequently, as shown in FIG. 53, the semiconductor chips 5a2, 5b and 5c are mounted over the main surfaces of the die pads 7a3 and 7a5 in the respective unit areas of the lead frame 7 through the die bond paste. Thereafter, heat treatment is made to cure the die bond paste, thereby fixedly securing semiconductor chips 5a2, 5b and 5c onto the die pads 7a3 and 7a5 (Steps 101 and 102). An improvement in productivity can also be attained by mounting the semiconductor chips 5c, 5a2 and 5b in small order. Incidentally, the semiconductor chips 5a2, 5b and 5c are obtained by forming semiconductor chips 5a2, 5b and 5c in their corresponding main surfaces of three types of semiconductor wafers through a normal wafer process (pre-process (including a device forming step and a wiring forming step)), thereafter bonding a dicing tape onto the back surfaces of the respective semiconductor wafers, and cutting out the corresponding semiconductor chips 5a1, 5b and 5c from the respective semiconductor wafer by a dicing blade.

Figure 54:
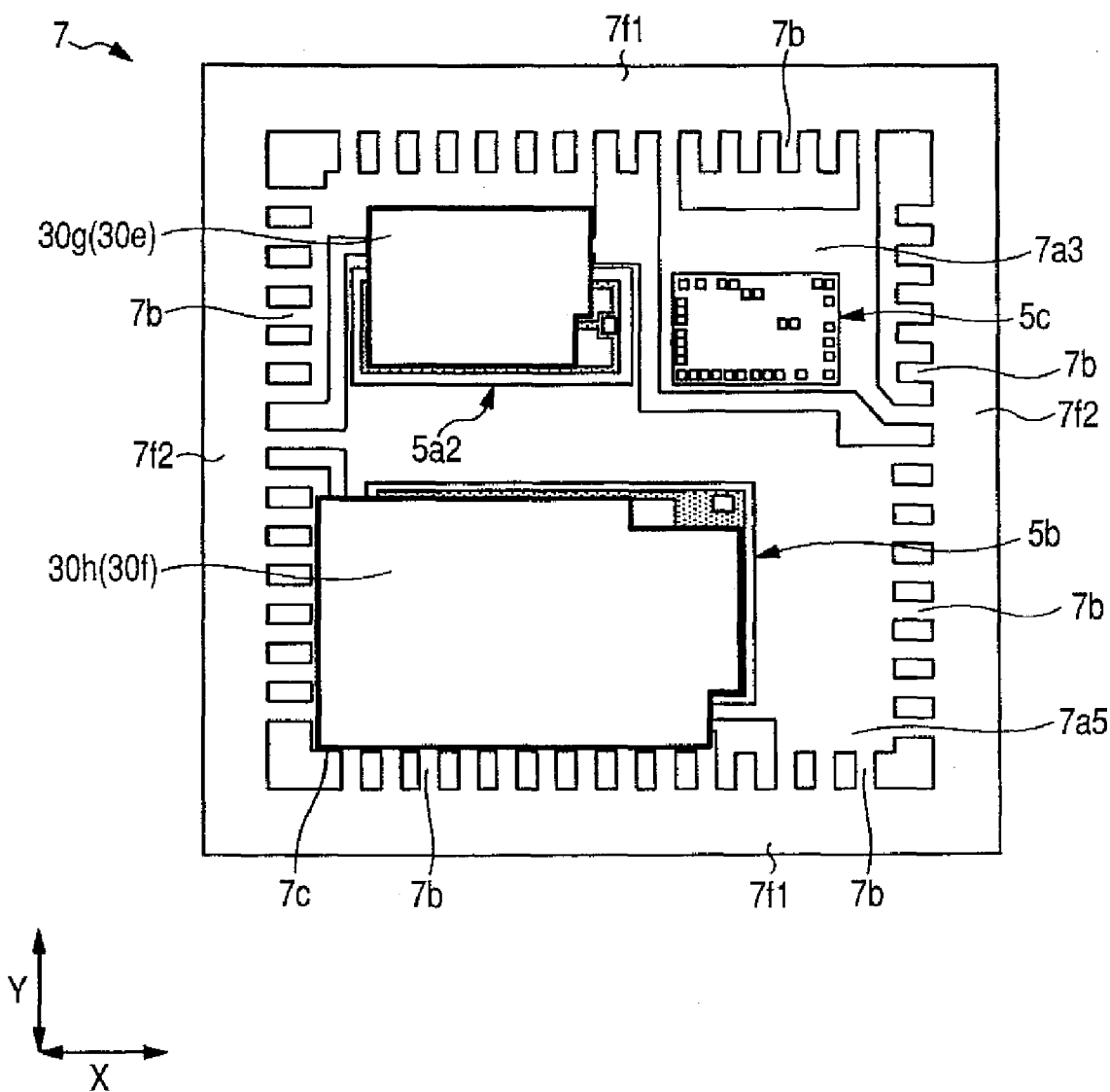
FIG. 54 is a plan view illustrating the main surface of the lead frame subsequent to the connection of a lead plate onto the semiconductor chip placed on the lead frame shown in FIG. 53.
Figure 55:
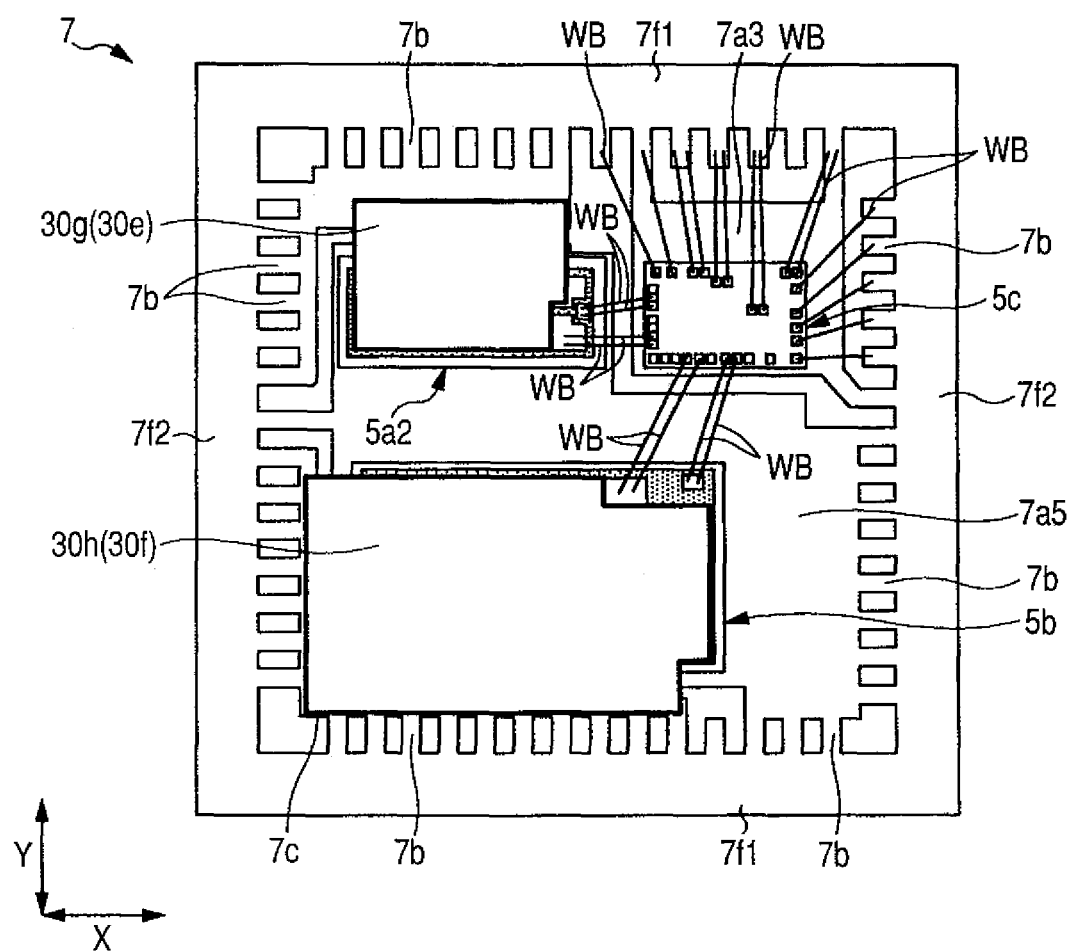
FIG. 55 is a plan view showing the main surface of the lead frame subsequent to the performance of wire bonding processing on the semiconductor chip on the lead frame shown in FIG. 54.

Subsequently, as shown in FIG. 54, lead plates 30e and 30f or lead plates 30g and 30h are connected as described above (Step 103). Thereafter, as shown in FIG. 55, bonding of thin wires WB is performed (Step 104). Since there is a fear that when the lead plates 30e and 30f or like are connected after connection of the wires WB, break failures of the wires WB are incurred upon connection of the lead plates 30e and 30f or the like, the wires WB are connected after the process of connecting the lead plates 30e and 30f or the like. It is thus possible to suppress or prevent the break failures of the thin wires WB. Thereafter, when the lead plates 30e and 30f are used, the input capacitor Cin may be connected to the lead plates 30e and 30f as in the package 10H (Step 200).

Figure 56:
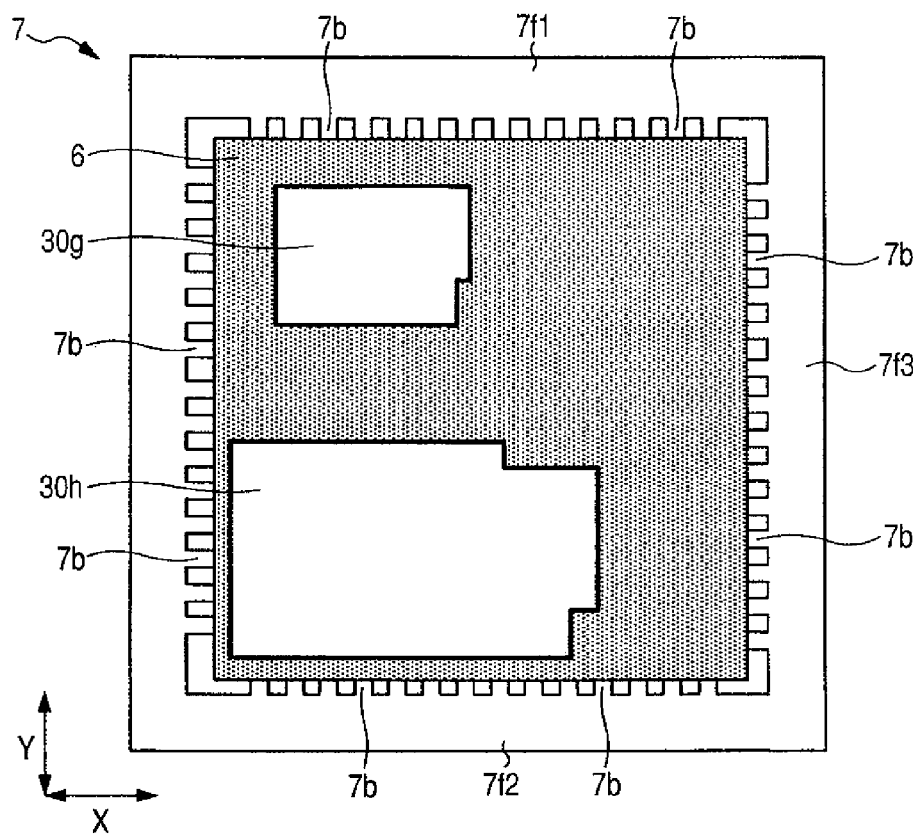
FIG. 56 is a plan view showing the main surface of the lead frame subsequent to the sealing of the semiconductor chip or the like on the lead frame shown in FIG. 55 with an encapsulator.

Subsequently, as shown in FIG. 56, a resin sealing (mold) process is performed by a transfer mold method (Step 105). The transfer mold method is a method for using a pot, a runner, a resin implantation gate and a mold die provided with a cavity and the like, and injecting a thermosetting resin into the cavity from the pot via the runner and resin implantation gate to thereby form an encapsulator 6. Upon manufacture of a QFN type package, an individual type transfer mold method for using a multicavity lead frame having a plurality of product forming areas (device forming area and product acquisition areas) and resin-sealing semiconductor chips mounted onto the respective product forming areas every product forming areas, and a batch-type transfer mold method for collectively resin-sealing semiconductor chips mounted onto respective product forming areas are adopted. While FIG. 56 illustrates by way of example, a case in which lead plates 30g and 30h are used, the lead plates 30e and 30f and the entire input capacitor Cin are covered with the encapsulator 6 where the lead plates 30e and 30f are used and the input capacitor Cin is connected in Step 200.

Figure 57:
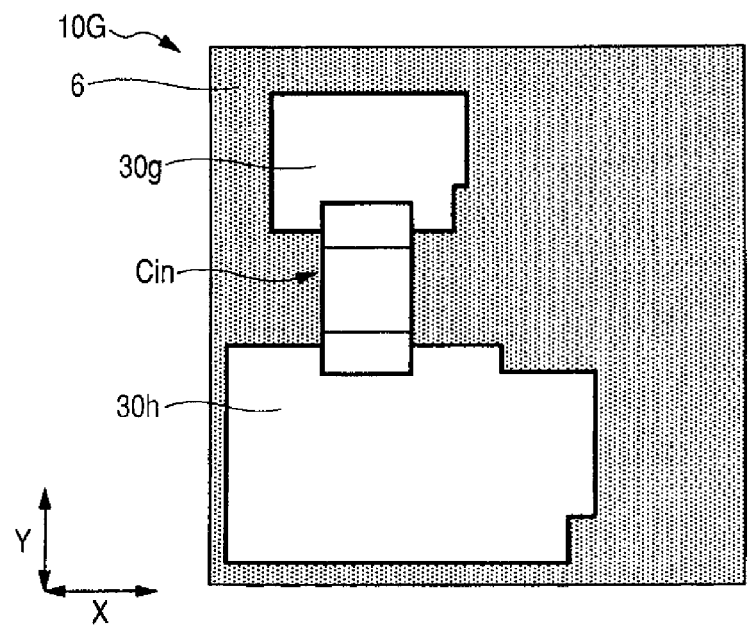
FIG. 57 is a plan view illustrating the main surface of the package obtained from the lead frame of FIG. 56 by cutting.

After the above resin sealing process, the injected sealing resin is cured (resin cure step 106). After the application of each mark (Step 107), individual product portions are cut out from the lead frame 7 as shown in FIG. 57 (Step 108). After the resin sealing process and before the cutting step 108, the input capacitor Cin may be connected to the lead plates 30g and 30*h* as described above (Step 201). After the cutting step 108, the input capacitor Cin may be connected to the lead plates 30*g* and 30*h* as mentioned above (Step 109). The corresponding package 10G is manufactured in this way.

Twelfth Preferred Embodiment

A twelfth embodiment will explain a configuration wherein an input capacitor is directly connected to semiconductor chips.

Figure 58:
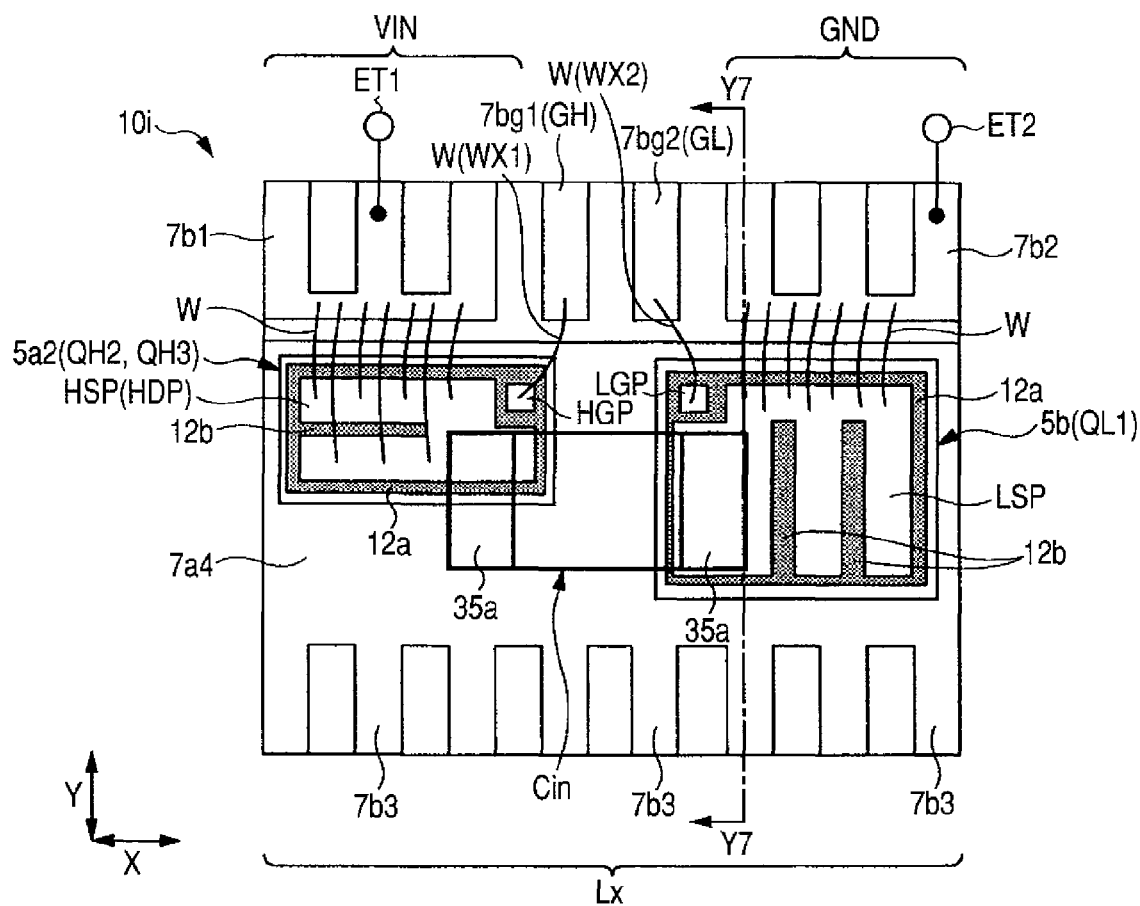
FIG. 58 is an overall plan view showing a main surface side of a package of a semiconductor device illustrating a twelfth embodiment of the present invention as seen through the interior of the package.
Figure 59:
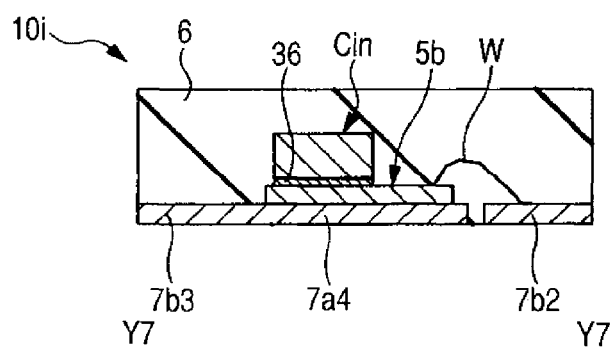
FIG. 59 is a sectional view taken along line Y7-Y7 of FIG. 58.
Figure 60:
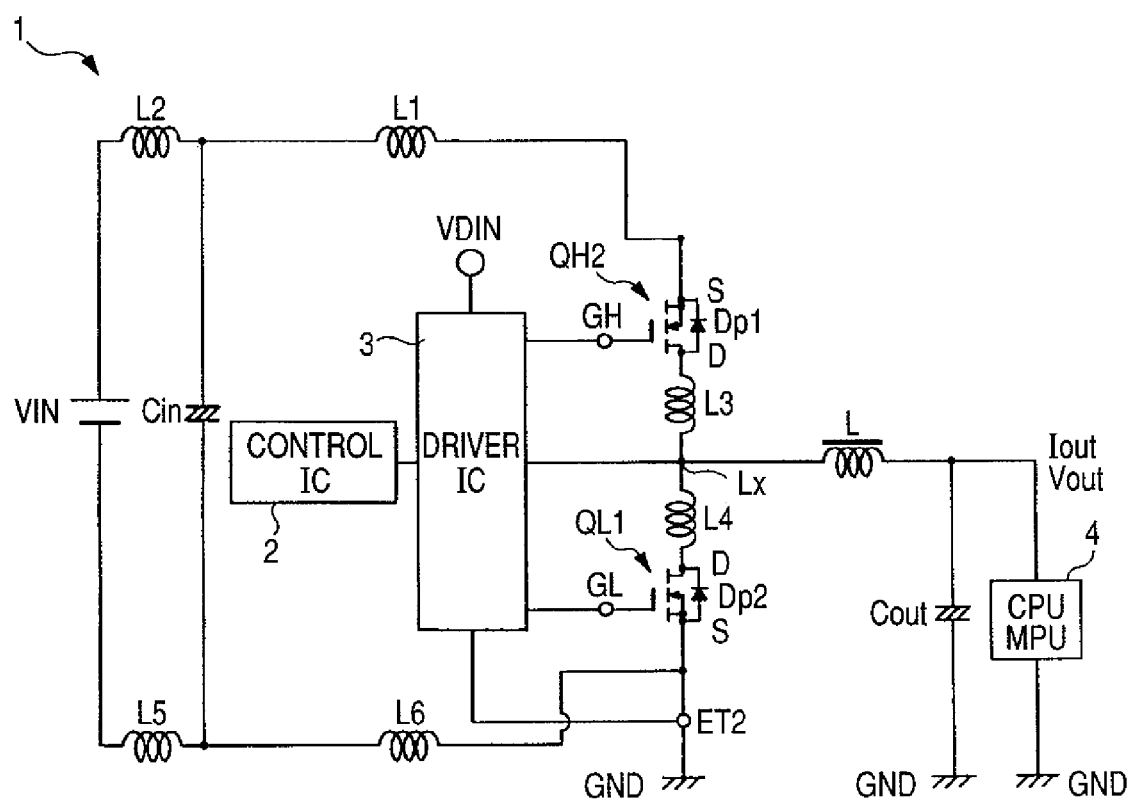
FIG. 60 is a circuit diagram showing the semiconductor device shown in FIG. 58.

FIG. 58 shows an overall plan view illustrative of a mina surface side of a package 10*i* of the twelfth embodiment as seen through the interior of the package 10*i*, FIG. 59 shows a sectional view taken along line Y7-Y7 of FIG. 58, and FIG. 60 shows a circuit diagram of FIG. 58, respectively. Incidentally, although FIG. 60 shows an example in which a p channel vertical power MOS is used as a high-side power MOS, an n channel horizontal power MOS may be used.

In the twelfth embodiment, a pair of electrodes 35*a* of an input capacitor Cin is directly connected via a junction layer 36 to pads (pads HSPs for a source electrode where a p channel vertical power MOSQH2 is formed in a semiconductor chip 5*a*2, and pads HDPs for a drain electrode where an n channel horizontal power MOSQH3 is formed in the semiconductor chip 5*a*2) placed over a main surface of the semiconductor chip 5*a*2, and pads LSPs for a source electrode, which are disposed over the main surface of a semiconductor chip 5*b*. Since the parasitic inductances L2 and L5 used as the wire bonding sections in FIG. 1 cease to act parasitic inductances of a main circuit as shown in FIG. 60 in the twelfth embodiment, there is no need to wire using the lead plates 30*a*, 30*b*, 30*c* and 30*d*. Therefore, the cost of the package 10*i* can be reduced. However, the sections where the electrodes 35*a* of the input capacitor Cin are connected at the main surfaces of the semiconductor chips 5*a*2 and 5*b*, must eliminate the gate fingers 12*b* from the viewpoint of ensuring of connectivity and the gate resistance increases correspondingly. Therefore, the present embodiment is suitable for an apparatus driven at a low frequency and low current as compared with the first and second embodiments. Configurations other than those are identical to the first and second embodiments.

Thirteenth Preferred Embodiment

A thirteenth embodiment will explain a configuration wherein the input capacitor is directly connected to semiconductor chips in the third embodiment.

Figure 61:
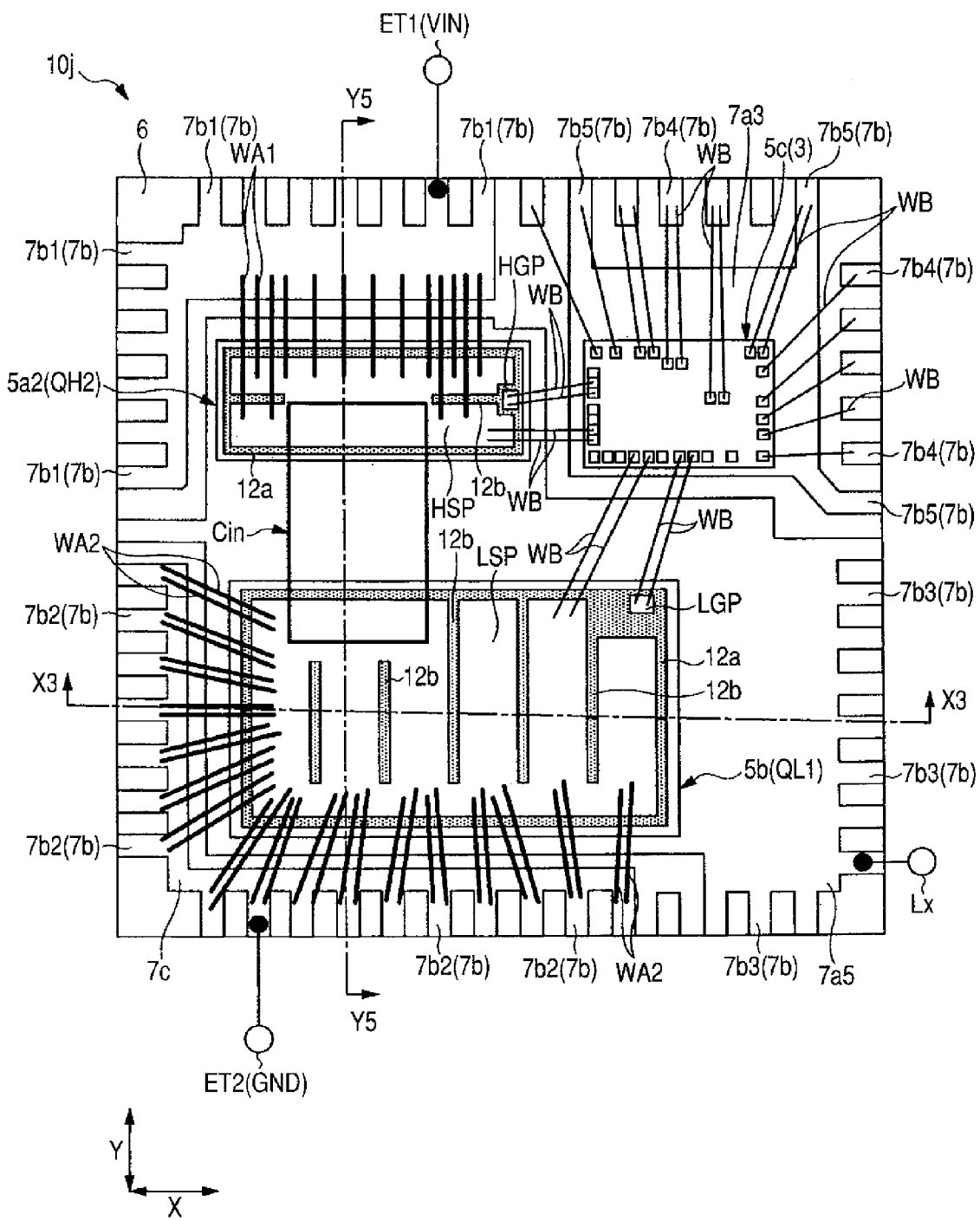
FIG. 61 is an overall plan view showing a main surface side of a package of a semiconductor device illustrative of a thirteenth embodiment of the present invention as seen through the interior of the package.
Figure 62:
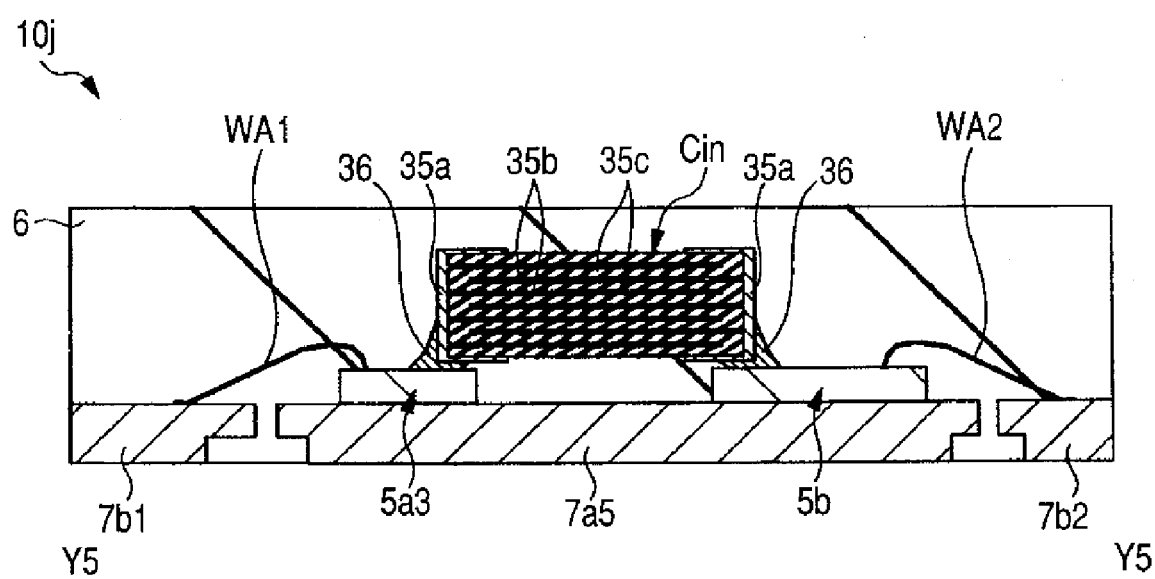
FIG. 62 is a sectional view taken along line Y5-Y5 of FIG. 61.

FIG. 61 shows an overall plan view illustrating a main surface side of a package 10*j* of the thirteenth embodiment as seen through the interior of the package 10*j*, and FIG. 62 shows a sectional view taken along line Y5-Y5 of FIG. 61, respectively. Incidentally, a circuit diagram thereof is identical to FIG. 35. A sectional view taken along line X3-X3 of FIG. 61 is identical to FIG. 23. Further, although FIG. 61 illustrates an example in which a p channel vertical power MOS is used as a high-side power MOS, an n channel horizontal power MOS may be used.

Even in the case of the thirteenth embodiment, a pair of electrodes 35*a* of an input capacitor Cin is directly connected via a junction layer 36 to pads (pads HSPs for a source electrode where a p channel vertical power MOSQH2 is formed in a semiconductor chip 5*a*2, and pads HDPs for a drain electrode where an n channel horizontal power MOSQH3 is formed in the semiconductor chip 5*a*2) placed over a main surface of the semiconductor chip 5*a*2, and pads LSPs for a source electrode, which are disposed over the main surface of a semiconductor chip 5*b*. Thus, since the circuit diagram results in the circuit shown in FIG. 35, the parasitic inductance can be reduced at low cost in a manner similar to the twelfth embodiment. Since, in this case, the number of wires WA1 must be reduced in addition to the elimination of the gate fingers 12*b*, the gate resistance further increases. Thus, the present embodiment increases in loss as compared with the first and second embodiments where driven at a high frequency and large current. However, when the present embodiment is driven at a low frequency and low current, the loss remains unchanged so much as compared with the first and second embodiments, and a reduction in cost can be realized. Since, however, the proportion or rate of conduction losses of the high-side power MOS is not so large, the package 10*j* having the configuration of the thirteenth embodiment and the packages 10G and 10H shown in FIGS. 46 and 47 may be used properly depending upon use conditions of the system and user's desires.

Fourteenth Preferred Embodiment

A fourteenth embodiment will explain a configuration wherein in a package with an input capacitor built therein, a back surface thereof opposite to a main surface from which die pads are exposed, is used as a package mounting surface.

Figure 63:
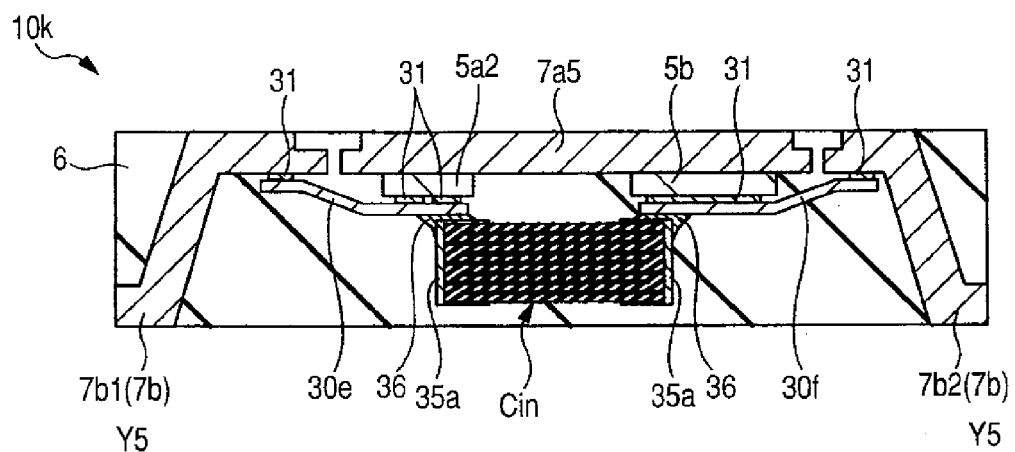
FIG. 63 is a sectional view showing a package of a semiconductor device illustrating a fourteenth embodiment of the present invention.

FIG. 63 shows a sectional view of a package 10*k* of the fourteenth embodiment. Incidentally, a plan view thereof is identical to FIG. 45. FIG. 63 is a sectional view taken along line Y5-Y5 of FIG. 45.

A structure of the package 10*k* according to the present embodiment is substantially identical to one shown in FIG. 47. The present embodiment is different therefrom in the following points.

First, leads 7*b* (7*b*1 and 7*b*2) are bent from a main surface from which a die pad 7*a*5 of the package 10*k* is exposed, to the side of the back surface of the package 10*k*, which is placed on the side opposite to the main surface. Thus, the area where the leads 7*b* and an encapsulator 6 contact can be increased, and adhesion power between the leads 7*b* and the encapsulator 6 can be enhanced. It is therefore possible to suppress or prevent a defective condition that the leads 7*b* fall off the encapsulator 6.

Figure 64:
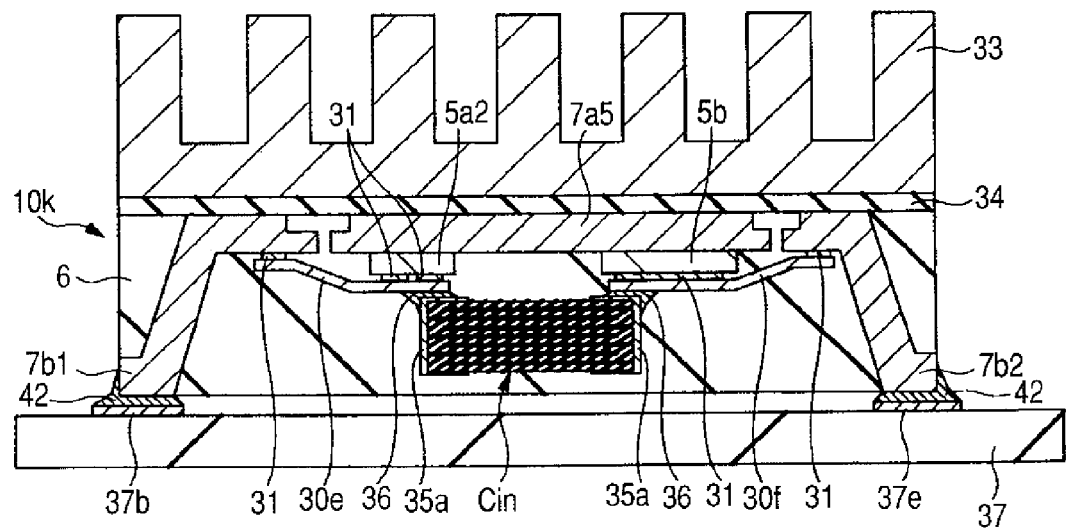
FIG. 64 is a sectional view illustrating a state in which the package shown in FIG. 63 is mounted to a wiring board and a radiating fin is attached.

The second point is that the leads 7*b* (7*b*1 and 7*b*2) are exposed from the main surface, back surface and side faces of the package 10*k*, and the back surface placed on the side opposite to the exposed surface of the die pad 7*a*5 of the package 10*k* is configured as the mounting surface of the package 10*k*. Thus, since radiation from both of the main surface of the package 10*k* and the back surface thereof is allowed, a heat dissipation property can be improved as compared with the first embodiment. FIG. 64 shows a sectional view illustrating a state in which a package 10*k* is mounted onto a wiring board 37 and a radiating fin 33 is attached. The package 10*k* is mounted over the wiring board 37 in a state in which leads 7*b* (7*b*1 and 7*b*2) thereof are connected to their corresponding wirings 37*b* and 37*e* of the wiring board 37 via a junction layer 42. The junction layer 42 comprises, for example, tin—silver lead-free (unleaded) solder (melting point: about 221°) like a tin—silver (Ag)—copper (Cu) alloy, a tin—silver—bismuth (Di)-copper alloy or the like, tin—copper lead-free solder (melting point: about 227°) like a tin—copper—nickel (Ni) alloy or the like, tin—zinc lead-free solder (melting point: about 198°) like a tin—zinc (Zn) alloy or the like, tin—bismuth lead-free solder (melting point: about 148°) like a tin—bismuth—silver alloy or the like, or lead-free solder like a tin—stibium (Sb) alloy.

In the case of such a structure according to the present embodiment, the radiating fin 33 can be provided over the main surface (surface from which some of the die pad 7a3 and 7a5 and leads 7b (7b1 and 7b2) are exposed) of the package 10k via an adhesive 34 interposed therebetween. That is, it is possible to cause heat generated at the semiconductor chips 5a2, 5b and 5c to escape to the outside through the die pads 7a3 and 7a5 and the radiating fin 33. Namely, in the present embodiment, the heat can be radiated form both faces of the package 10k. Further, since the radiating fin 33 is attached to the main surface of the package 10k, the on resistance of the system can be reduced with a further improvement in dissipation, and the input capacitor Cin can be connected close to the semiconductor chips 5a2 and 5b. Hence switching losses of the system can also be reduced.

Fifteenth Preferred Embodiment

A fifteenth embodiment will explain a configuration wherein in a package externally provided with an input capacitor, a back surface opposite to a main surface from which die pads are exposed is formed as a mounting surface of the package.

Figure 65:
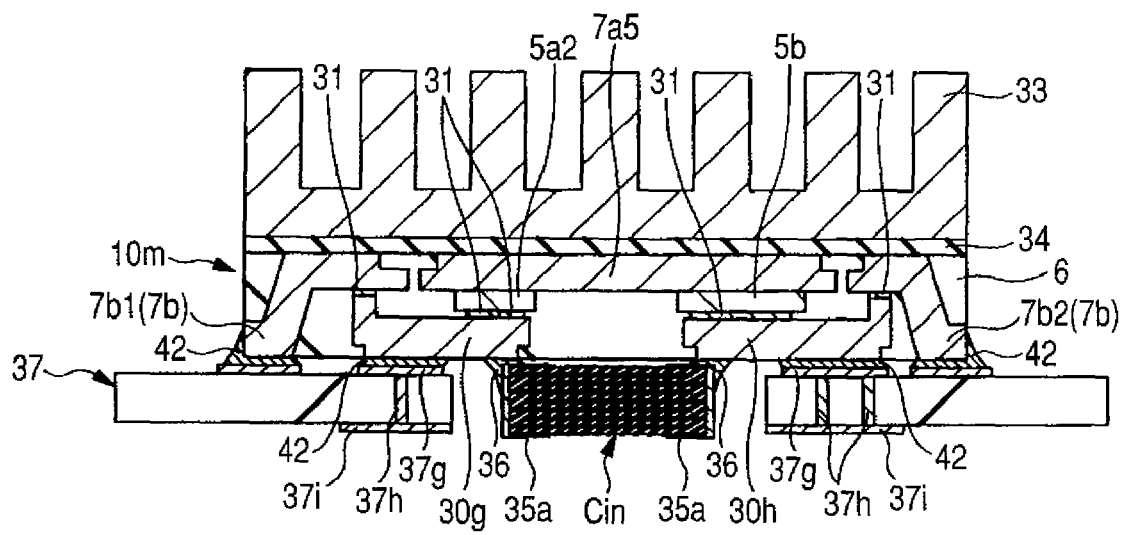
FIG. 65 is a sectional view showing a state in which a package of a semiconductor device illustrative of a fifteenth embodiment of the present invention is mounted to a wiring board, and a radiating fin is attached.
Figure 66:
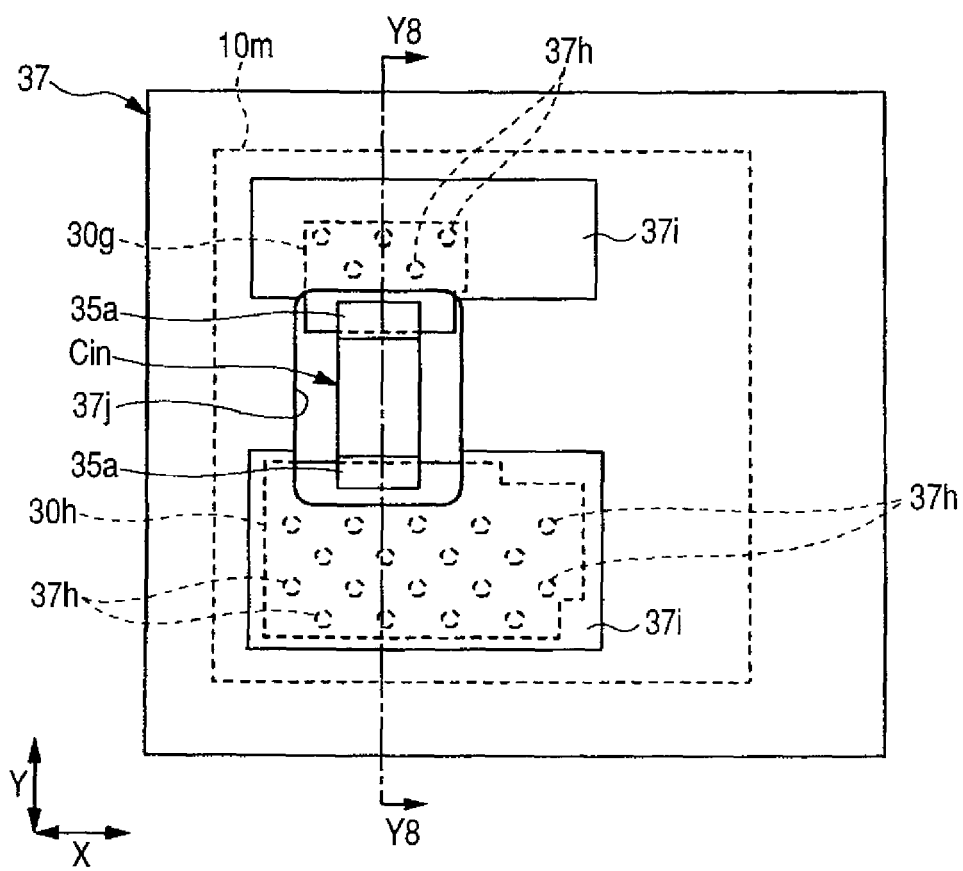
FIG. 66 is a fragmentary plan view of FIG. 65 as viewed from the back surface of the wiring board.

FIG. 65 shows a sectional view illustrating a state in which a package 10m of the fifteenth embodiment is mounted onto a wiring board 37 and a radiating fin 33 is attached, and FIG. 66 shows a fragmentary plan view of FIG. 65 as viewed from the back surface side of the wiring board 37, respectively. Incidentally, a cross-section taken along line Y8-Y8 of FIG. 66 corresponds to FIG. 65.

A structure of the package 10m according to the fifteenth embodiment is substantially identical to one shown in FIG. 46. The present embodiment is different therefrom in the following points, for example.

First, leads 7b (7b1 and 7b2) are bent from a main surface from which a die pad 7a5 of the package 10m is exposed, to the side of the back surface of the package 10m, which is placed on the side opposite to the main surface, in a manner similar to the fourteenth embodiment. Thus, the area where the leads 7b and an encapsulator 6 contact can be increased, and adhesion power between the leads 7b and the encapsulator 6 can be enhanced. It is therefore possible to suppress or prevent a defective condition that the leads 7b fall off the encapsulator 6.

The second point is that the leads 7b (7b1 and 7b2) are exposed from the main surface, back surface and side faces of the package 10m, and the back surface placed on the side opposite to the exposed surface of the die pad 7a5 of the package 10m is configured as the mounting surface of the package 10m.

Even in the case of the fifteenth embodiment, the package 10m is mounted over the wiring board 37 in a state in which the leads 7b (7b1 and 7b2) thereof are connected to their corresponding wirings 37b and 37e of the wiring board 37 via a junction layer 42. Even in the fifteenth embodiment as well, the radiating fin 33 can be provided over the main surface (surface from which some of the die pad 7a3 and 7a5 and leads 7b (7b1 and 7b2) are exposed) of the package 10m via an adhesive 34 interposed therebetween. That is, it is possible to cause heat generated at the semiconductor chips 5a2, 5b and 5c to escape to the outside through the die pads 7a3 and 7a5 and the radiating fin 33.

In the fifteenth embodiment, lead plates 30g and 30h are bonded to conductor patterns 37g placed over the main surface (mounted surface) of the wiring board 37 through junction layers 42. Further, they are connected to conductor patterns 37i placed over the back surface of the wiring board 37 through conductor portions 37h lying in a plurality of through holes. That is, since it is possible to cause heat generated at the semiconductor chips 5a2, 5b and 5c to escape to the outside through the lead plates 30g and 30h, the conductor patterns 37g, the plural conductor portions 37h and the conductor patterns 37i, a further improvement in radiation can be enhanced.

Such an aperture or opening 37j as to expose parts of the lead plates 30g and 30h placed over the mounting surface of the package 10m is defined in the wiring board 37. An input capacitor Cin is mounted in the opening 37j.

Thus, since heat can be radiated from the radiating fin 33 and the conductor patterns 37i in the fifteenth embodiment, a further improvement in heat dissipation property can be improved. Since the on resistance of the system can be reduced and the input capacitor Cin can be connected close to the semiconductor chips 5a2 and 5b, switching losses of the system can also be reduced.

While the invention made above by the present inventors has been described specifically on the basis of the preferred embodiments, the present invention is not limited to the embodiments referred to above. It is needless to say that various changes can be made thereto within the scope not departing from the gist thereof.

Although the flat package structure has been illustrated as the package structure by way of example in the embodiment, for example, the present invention is not limited to it. For instance, a BGA (Ball Grid Array) package structure may be adopted.

While the above description has principally been made of the case in which the invention made by the present inventors is applied to a drive power supply circuit for each of a CPU and a DSP, which belongs to the field of application reaching the background of the invention, the present invention is not limited to it but applicable in various ways. The present invention can be applied even to, for example, a power supply circuit for driving of other circuit.

The present invention is applicable to the manufacturing industry of a semiconductor device.

What we claim is:

1. A semiconductor device including a DC-DC converter, comprising:

a first semiconductor chip including a high-side MOSFET of the DC-DC converter, the high-side MOSFET including a source, a gate and a drain;

a second semiconductor chip including a low-side MOSFET of the DC-DC converter, the low-side MOSFET including a source, a gate and a drain;

a third semiconductor chip including a driver circuit to drive a gate of the high-side MOSFET and a gate of the low-side MOSFET;

a resin encapsulator encapsulating the first, second and third semiconductor chips;

an input power supply terminal, exposed from the resin encapsulator, for supplying an input power to the DC-DC converter;

a reference potential supply terminal, exposed from the resin encapsulator, for supplying a reference potential to the DC-DC converter; and an output terminal exposed from the resin encapsulator, for outputting an output of the DC-DC converter, wherein the high-side MOSFET and the low-side MOSFET are electrically coupled in series between the input power supply terminal and the reference potential supply terminal, wherein a source-to-drain path of the high-side MOSFET is electrically coupled in series between the input power supply terminal and the output terminal, wherein a source-to-drain path of the low-side MOSFET is electrically coupled in series between the reference potential supply terminal and the output terminal, and wherein the first semiconductor chip and the second semiconductor chip are electrically and mechanically coupled to a metal material which is electrically coupled to the output terminal.

2. A semiconductor device according to claim 1,
wherein the metal material is comprised of copper.

3. A semiconductor device according to claim 1,
wherein the first semiconductor chip and the second semiconductor chip are coupled to the metal material via paste.

4. A semiconductor device according to claim 1,
wherein the resin encapsulator includes a top surface and a bottom surface opposite the top surface, and
wherein the input power supply terminal, the reference potential supply terminal and the output terminal are exposed from the bottom surface of the resin body.

5. A semiconductor device according to claim 4,
wherein the first semiconductor chip includes a source electrode pad which is electrically coupled to the source of the high-side MOSFET, and
wherein the source electrode pad faces toward the top surface of the resin encapsulator.

6. A semiconductor device according to claim 1,
wherein the second semiconductor chip includes a drain electrode which is electrically coupled to the drain of the low-side MOSFET, and
wherein the drain electrode is mechanically coupled to the metal material.

7. A semiconductor device according to claim 1,
wherein the gate of the high-side MOSFET is electrically coupled to the driver circuit via a first wire, and
wherein the gate of the low-side MOSFET is electrically coupled to the driver circuit via a second wire.

8. A semiconductor device according to claim 7,
wherein the first semiconductor chip has a rectangular shape in plan view, with a pair of long sides and a pair of short sides, and
wherein the first wire is disposed so as to overlap one of the short sides of the first semiconductor chip.

9. A semiconductor device according to claim 1,
wherein the first semiconductor chip has a rectangular shape in plan view, with a pair of long sides and a pair of short sides, and
wherein one of said long sides of the first semiconductor chip is arranged such that a closest distance between the second semiconductor chip and said one long side is less than a closest distance between the second semiconductor chip and the other long side.

10. A semiconductor device including a DC-DC converter, comprising:
a first semiconductor chip including a first MOSFET of the DC-DC converter, the first MOSFET including a source, a gate and a drain;
a second semiconductor chip including a second MOSFET of the DC-DC converter, the second MOSFET including a source, a gate and a drain;
a third semiconductor chip including a driver circuit to drive a gate of the first MOSFET and a gate of the second MOSFET;
a resin encapsulator encapsulating the first, second and third semiconductor chips;

an input power supply terminal, exposed from the resin encapsulator, for supplying an input power to the DC-DC converter;

a reference potential supply terminal, exposed from the resin encapsulator, for supplying a reference potential to the DC-DC converter;

an output terminal exposed from the resin encapsulator, for outputting an output of the DC-DC converter;

wherein the first MOSFET and the second MOSFET are electrically coupled in series between the input power supply terminal and the reference potential supply terminal, wherein a source-to-drain path of the first MOSFET is electrically coupled in series between the input power supply terminal and the output terminal, wherein a source-to-drain path of the second MOSFET is electrically coupled in series between the reference potential supply terminal and the output terminal, and wherein the first semiconductor chip and the second semiconductor chip are electrically and mechanically coupled to a metal material which is electrically coupled to the output terminal.

11. A semiconductor device according to claim 8,
wherein the metal material is comprised of copper.

12. A semiconductor device according to claim 8,
wherein the first MOSFET is comprised of a p channel MOSFET, and
wherein the second MOSFET is comprised of an n channel MOSFET.

13. A semiconductor device according to claim 8,
wherein the first MOSFET includes a first drain electrode which is electrically coupled to the drain of the first semiconductor chip,
wherein the second MOSFET includes a second drain electrode which is electrically coupled to the drain of the second semiconductor chip, and
wherein the first and second drain electrodes are mechanically coupled to the metal material.

14. A semiconductor device according to claim 8,
wherein the resin encapsulator includes a top surface and a bottom surface opposite the top surface, and
wherein the input power supply terminal, the reference potential supply terminal and the output terminal are exposed from the bottom surface of the resin body.

15. A semiconductor device according to claim 14,
wherein the first MOSFET includes a first source electrode pad which is electrically coupled to the source of the first semiconductor chip,
wherein the second MOSFET includes a second source electrode pad which is electrically coupled to the source of the second semiconductor chip, and
wherein the first and second source electrode pads faces toward the top surface of the resin encapsulator.

16. A semiconductor device according to claim 1, wherein the metal material comprises a common die pad on which both the first semiconductor chip and the second semiconductor chip are mounted to thereby be electrically and mechanically coupled to the common die pad.

17. A semiconductor device according to claim 10, wherein the metal material comprises a common die pad on which both the first semiconductor chip and the second semiconductor chip are mounted to thereby be electrically and mechanically coupled to the common die pad.

* * * * *